(12) United States Patent
Burns et al.

(10) Patent No.: US 7,248,109 B2
(45) Date of Patent: Jul. 24, 2007

(54) METHOD AND APPARATUS FOR AN IMPROVED POWER AMPLIFIER

(75) Inventors: Lawrence Burns, Los Altos, CA (US); Chong Woo, Fremont, CA (US); David Sorensen, Scotts Valley, CA (US)

(73) Assignee: Pelikan Technologies, Inc., Palo Alto, CA (US)

( * ) Notice: Subject to any disclaimer, the term of this patent is extended or adjusted under 35 U.S.C. 154(b) by 97 days.

(21) Appl. No.: 11/060,052

(22) Filed: Feb. 16, 2005

(65) Prior Publication Data

US 2006/0006937 A1 Jan. 12, 2006

Related U.S. Application Data

(63) Continuation-in-part of application No. 10/887,867, filed on Jul. 12, 2004, now Pat. No. 7,072,550, which is a continuation-in-part of application No. 10/888,478, filed on Jul. 8, 2004, now Pat. No. 7,068,104, which is a continuation-in-part of application No. 10/888,044, filed on Jul. 8, 2004, said application No. 11/060,052.

(60) Provisional application No. 60/600,316, filed on Aug. 9, 2004.

(51) Int. Cl.
*H03F 3/68* (2006.01)
(52) U.S. Cl. .................................. 330/124 R; 330/295
(58) Field of Classification Search ............ 330/124 R, 330/295, 84, 126
See application file for complete search history.

(56) References Cited

U.S. PATENT DOCUMENTS

| | | | | |
|---|---|---|---|---|
| 5,872,481 A | * | 2/1999 | Sevic et al. | .................... 330/51 |
| 6,356,149 B1 | * | 3/2002 | Stengel et al. | .............. 330/107 |
| 6,496,061 B1 | * | 12/2002 | Bloom et al. | .................. 330/51 |
| 6,597,242 B2 | * | 7/2003 | Petz et al. | .................... 330/51 |
| 6,794,938 B2 | * | 9/2004 | Weldon | ...................... 330/149 |

* cited by examiner

*Primary Examiner*—Henry Choe
(74) *Attorney, Agent, or Firm*—Paul Davis; Heller Ehrman LLP

(57) ABSTRACT

A power amplifier has an input conditioning circuit. At least first and second amplifiers are in parallel with each other and have inputs and outputs. An input signal is coupled to the inputs of the first and second amplifiers. A multi-input power combiner is provided. The outputs of the first and second parallel amplifiers are combined by the multi-input power combiner to add signals of the outputs constructively.

45 Claims, 48 Drawing Sheets

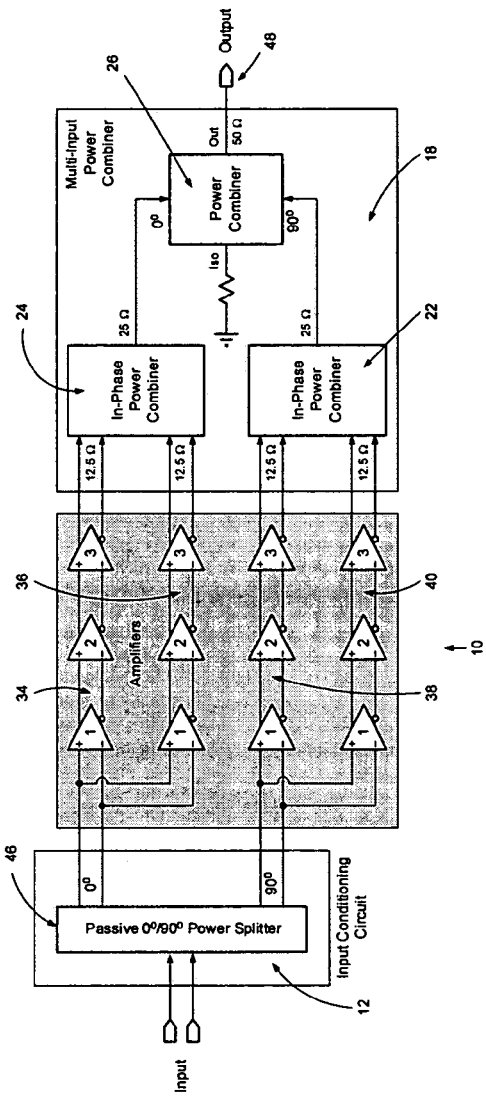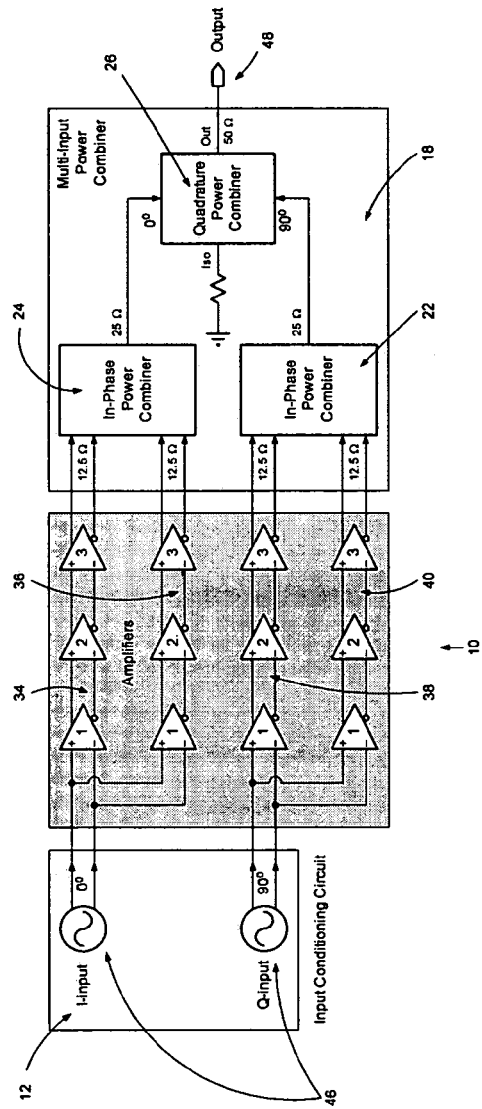

*Linear Pass Transistor (PMOS)*

*Linear Pass Transistor (PNP)*

*Linear Pass Transistor (PMOS cascode)*

*Linear Pass Transistor (PMOS) With Control Of VDD2 And Gain*

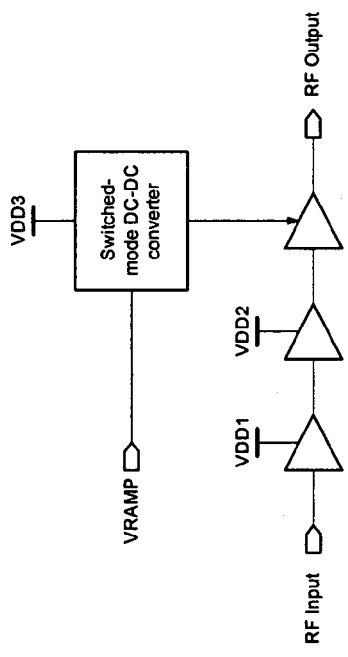
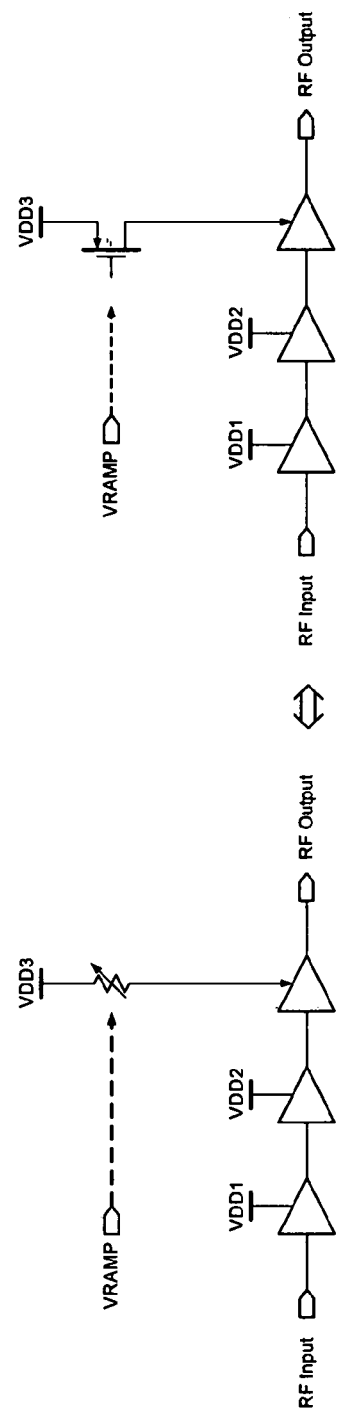
Figure 28a
Figure 28b
Figure 28c

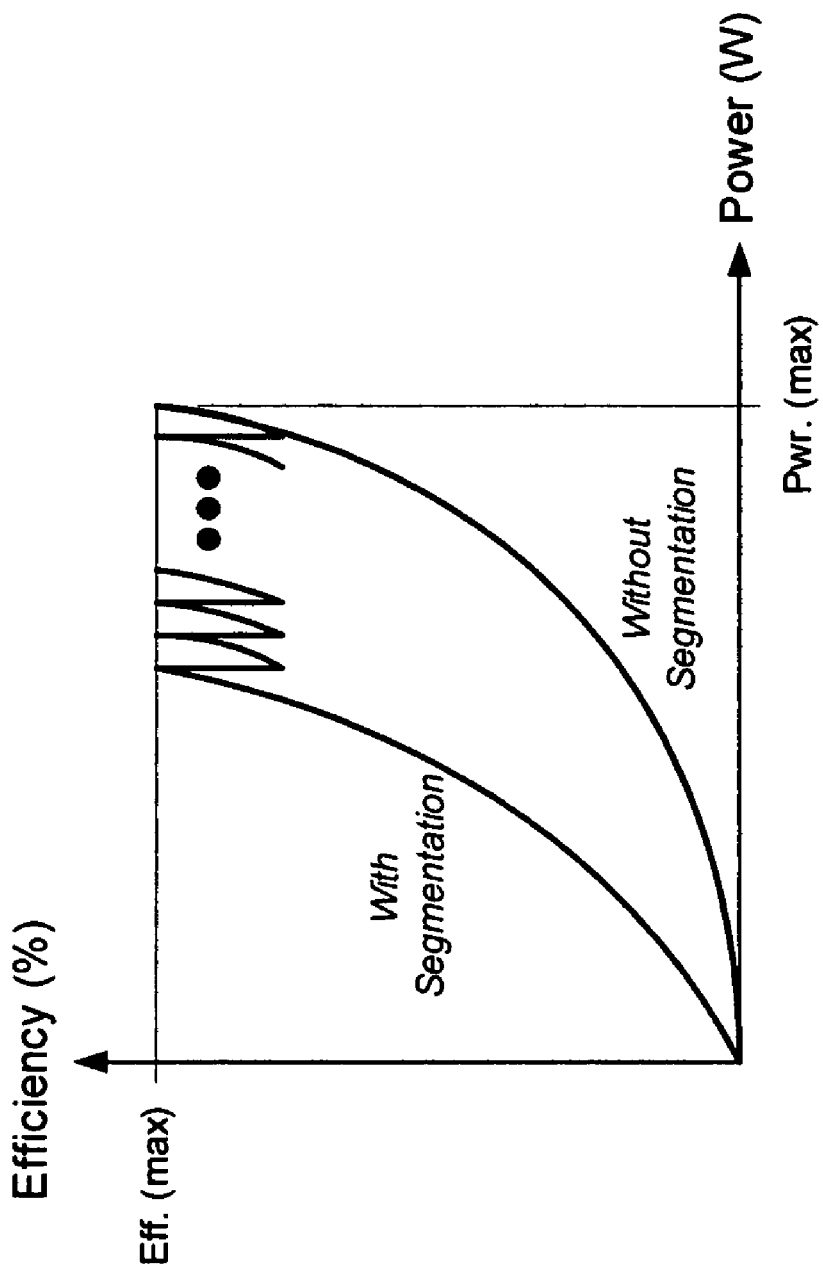
Figure 30a: Flat Efficiency Curve

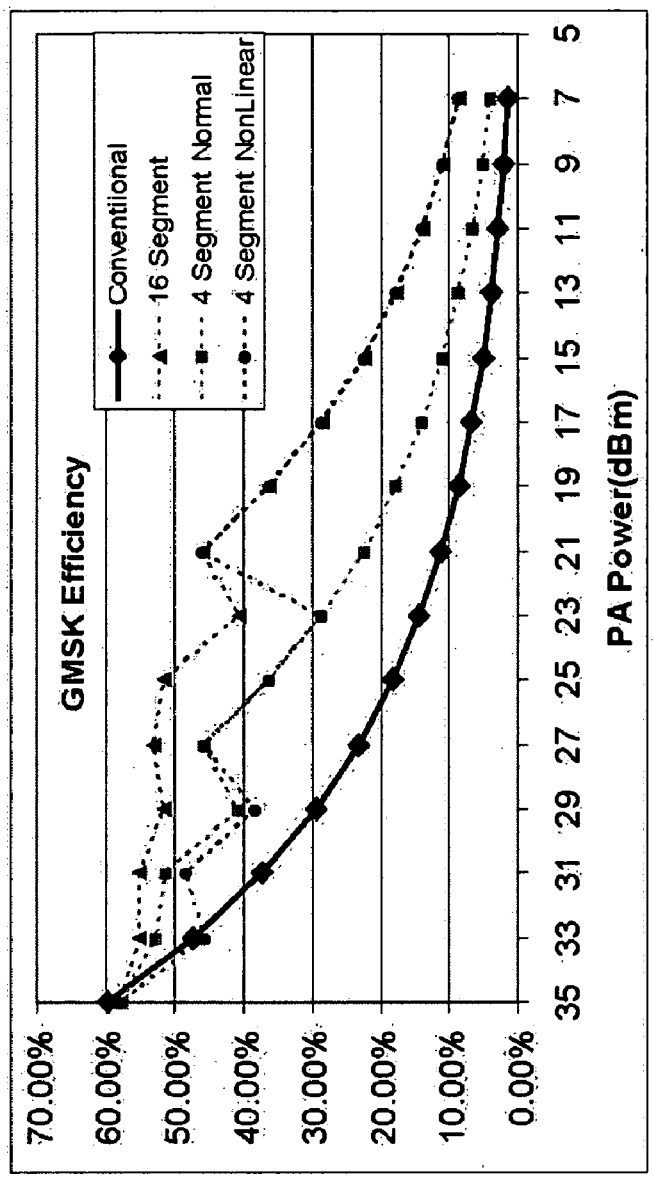
Figure 30b: Non-Uniform Segment Comparison

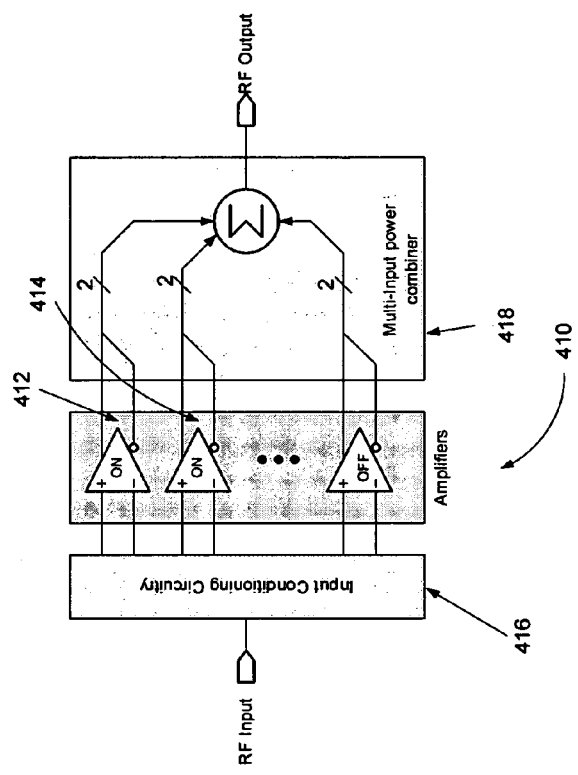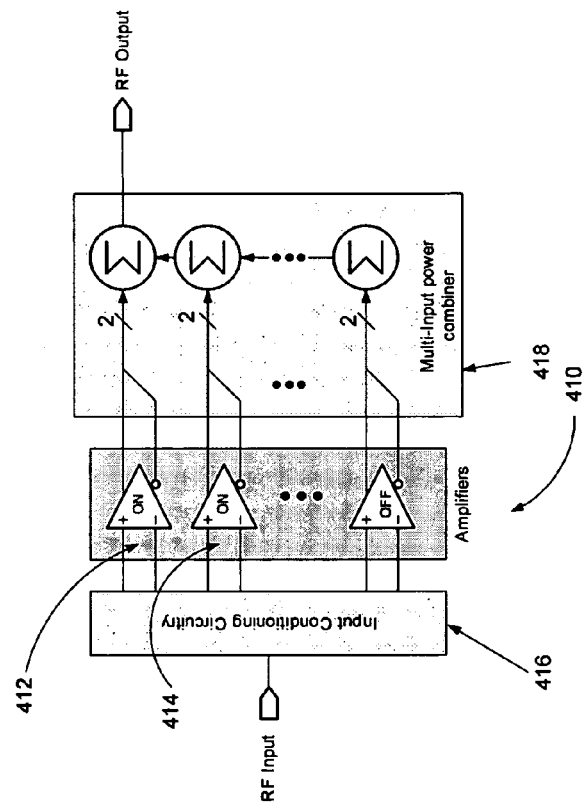
Figure 31a
Figure 31b

METHOD AND APPARATUS FOR AN IMPROVED POWER AMPLIFIER

CROSS-REFERENCE TO RELATED APPLICATIONS

This application claims the benefit of U.S. Ser. No. 60/600,316 filed on Aug. 9, 2004, and is a continuation-in-part of U.S. Ser. No. 10/887,867 (Now U.S. Pat. No. 7,072,550) filed on Jul. 12, 2004 which is a continuation-in-part of U.S. Ser. No. 10/888,478 (Now U.S. Pat. No. 7,068,104) filed on Jul. 8, 2004 which is a continuation-in-part of U.S. Ser. No. 10/888,044 filed on Jul. 8, 2004.

FIELD OF THE INVENTION

The invention relates generally to power amplifier design and more specifically to radio frequency (RF) power amplifier design.

DESCRIPTION OF THE RELATED ART

Known power amplifiers, particularly those used with wireless communication devices, face a variety of challenges. For such a power amplifier, the concerns include ensuring sufficient gain, providing efficiency with respect to converting direct current (DC) power to radio frequency (RF) output power, establishing breakdown voltage conditions that are sufficiently high to enable long term use of the device, and achieving reliable on/off performance of switching circuitry in switching-class power amplifiers. Currently, there is a desire to use low cost, standard digital complementary metal oxide semiconductor (CMOS) circuitry for radio functions. This desire magnifies potential problems, because among other things, CMOS circuitry typically has very low breakdown voltages.

There are two modes of breakdown voltages that should be considered. The first type of breakdown is junction breakdown. Excess electrons or holes are generated by high electric fields, creating an unwanted flow of current across the device. Eventually, a point is reached where the current actually increases, even as the voltage begins to drop (due to discharge of the anode). This "negative resistance" action allows an increasing current to flow, until excessive heat is generated. Eventually, permanent damage will occur. The second type of breakdown is across an oxide. In MOS processes, the gate of a transistor is insulated by an oxide layer from its drain, source and bulk nodes. Whenever a forward voltage is placed on the gate, there is a potential for breakdown across the oxide, in which the gate can short to the source, drain or bulk regions of the MOSFET. Even if no breakdown occurs across the gate, a long-term threshold voltage shift can occur, which causes the characteristics of the MOSFET to shift, if the gate source voltage is kept too high for a long period of time.

In another challenge, known power amplifiers are usually designed with single-ended power amplifiers driving simple, off-chip, high-Q (low-loss) matching circuits. Such topologies have no isolation between the load and the power amplifier output. Under poor load match conditions, excessive energy can be reflected back to the output stage of the power amplifier. This condition will cause a shift in the output match, resulting in lower RF output power and greatly reduced efficiency. More problematic is the fact that such miss-match conditions generally result in much higher signal swings across the devices, leading to voltage breakdown. Breakdown conditions generally result in permanent damage to the power amplifier. Other power amplifier designs use in-phase input/output power combining, requiring large passive elements on-chip. Another approach uses out-of-phase (push-pull, or complementary) power splitting/combining. Reflections from the load cause similar problems for these topologies, as mentioned above.

In yet another challenge to known amplifiers, when a transistor breaks down, excessive current flows and localized, permanent damage occurs. After the breakdown event, most devices are no longer usable. In some cases, such breakdown is not catastrophic, but does degrade device performance. One known method to prevent voltage breakdown is by operating the transistor well below its breakdown limit. Unfortunately, this approach leads to reduced power output and lower efficiency. In IC processes such as low-voltage CMOS, there is little headroom to begin with, so the back-off approach carries a heavy penalty. In general, high-breakdown devices tend to be built in specialized semiconductor processes, usually at higher costs than other IC processes.

Another approach is to use clamps to prevent voltage from ever reaching damage levels. Clamps limit the voltage by shunting current from the output devices, thus limiting voltage swing to save levels. However, this shunted current is essentially wasted, resulting in lower efficiency. There is a need to prevent breakdown voltage to inexpensive, low voltage IC processes, without affecting efficiency.

In a still further challenge, the requirements for high density, high speed CMOS logic are generally at odds with the requirements for RF power amplifiers. In most cases, the logic sections of the chip operate best with deep, sub-micron MOS devices. Such devices use very thin gate oxides to get low threshold voltages, high gain and fast operation. Such thin oxide devices have very low breakdown voltages, forcing modern CMOS ICs to operate below 1.8, 1.3 or even below 1.0V. CMOS circuit designers have become adept in designing low power analog and RF circuits with very low power supply voltages. However, operation at high signal swings, such as those needed for power amplifiers, is very difficult. For this reason, prior art designs tend to put the power amplifier in a separate chip, which is designed in a semiconductor process with much more breakdown voltage. In general, such higher voltage semiconductor processes are more expensive than standard "vanilla" CMOS. Additionally, the need to go off-chip with the RF signal results in lower efficiency.

In yet another challenge, known devices fail to provide both high gain and high efficiency. For example, known amplifiers from one manufacturer provide a design that provides an efficient design. The known amplifier uses thick lines for the primary and thinner lines for the secondary. In this known amplifier, transformers are used extensively. The amplifier design is based on a low frequency regime, using "lumped-elements" and "flux-coupled" transformers. The efficiency is about 40% (final stage) and 8 db gain. The gain, however, should preferably be about 30 db or higher to have high power-added efficiency (PAE). This low gain hinders this type of amplifier. Other known amplifier designs may have better gain, but are power limited. In one example, the device is limited to 1.2 watts when 4 watts are desired.

While the above-described configurations of power amplifiers allow for some known RF systems to operate, further advances in power amplifier design and methods of use are available. Specific limitations of the prior art include insufficient output power, low system (PAE) efficiency, even lower efficiency at lower output powers, large physical size, use of exotic (or at least, more expensive) semiconductor processes.

SUMMARY OF THE INVENTION

An object of the present invention is to provide power amplifiers using CMOS processes that are sufficient to provide for high output power and high power-added efficiency.

Another object of the present invention is to provide an RF amplifier with a robust amplifier configuration that is not subject to breakdown or permanent degradation due to load mismatch or other poor operating conditions.

Another object of the present invention is to provide an RF amplifier with high output power.

Another object of the present invention is to provide an RF amplifier with high output power of more than 4 watts.

Yet another object of the present invention is to provide an RF amplifier with low voltage swings on CMOS transistor, sufficiently low enough to prevent breakdown.

Still a further object of the present invention is to provide an RF amplifier with differential configuration.

A further object of the present invention is to provide an amplifier where the gate voltage is kept low enough so that the EEPROM effect of charge-trapping in the gate, and a possible threshold voltage shift, does not occur.

Yet another object is to use information from the isolation port to monitor the reflected energy at the output.

Yet another object is to use this information from the isolation port, which is a function of the energy reflected from the load, to adjust the match at the output for optimum performance under such load conditions.

A still further object of the present invention is to use a quadrature hybrid to help reduce the stress on each section of the power amplifier, to isolate each power amplifier section from reflected signals, and to deliver a more constant output power to the load.

Another object of the present invention is to sense current by paralleling small devices across the cascade, with the intention of said parallel devices being sufficiently small to have minimal effect on efficiency.

Yet another object of the present invention is to control the maximum power level by using segmented amplifiers to provide for a more constant high efficiency at lower power operation. At least some of these and other objectives described herein will be met by embodiments of the present invention.

These and other objects of the present invention are achieved in a power amplifier with an input conditioning circuit. At least first and second amplifiers are in parallel with each other and have inputs and outputs. An input signal is coupled to the inputs of the first and second amplifiers. A multi-input power combiner is provided. The outputs of the first and second parallel amplifiers are combined by the multi-input power combiner to add signals of the outputs constructively.

BRIEF DESCRIPTION OF THE DRAWINGS

FIGS. 6(a) and 6(b) illustrate embodiments of a power amplifier of the present invention where the input conditioning circuit includes on-chip circuitry that is configured to receive the input and produce at least first and second sets of outputs.

FIG. 28(a) illustrates that voltage to the VDD3 is derived from a nearly ideal DC-to-DC converter.

FIG. 28(b) is similar to FIG. 28(a) except that the DC-to-DC converter with a variable resistor controlled by the VRAMP.

FIG. 28(c) is similar to FIG. 28(b) and illustrates that variable resistors can be realized with series voltage regulation devices or PNP transistors that are controlled by the VRAMP.

FIG. 30(a) is a graph which illustrates that the FIG. 29 embodiment keeps PAE high at lower power levels and greatly reduces average power taken from the power supply, and hence extends battery life.

FIG. 30(b) is a flat efficiency curve comparing various embodiments of the present invention that have segmentation, to a power amplifier that does not have segmentation.

FIG. 31(a) illustrates one embodiment of FIG. 29 where the outputs of the amplifiers add constructively and in parallel.

FIG. 31(b) illustrates one embodiment of FIG. 29 where the outputs of the amplifiers add constructively and in series.

DETAILED DESCRIPTION

It is to be understood that both the foregoing general description and the following detailed description are exemplary and explanatory only and are not restrictive of the invention, as claimed. It may be noted that, as used in the specification and the appended claims, the singular forms "a," "an," and "the" include plural referents unless the context clearly dictates otherwise. Thus, for example, reference to "a material" may include mixtures of materials, reference to "a resistor" may include multiple resistors, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for sensing current, this means that the current sensing feature may or may not be present, and thus, the description includes structures wherein a device possesses the current sensing feature and structures wherein the current sensing feature is not present.

Figure 1:
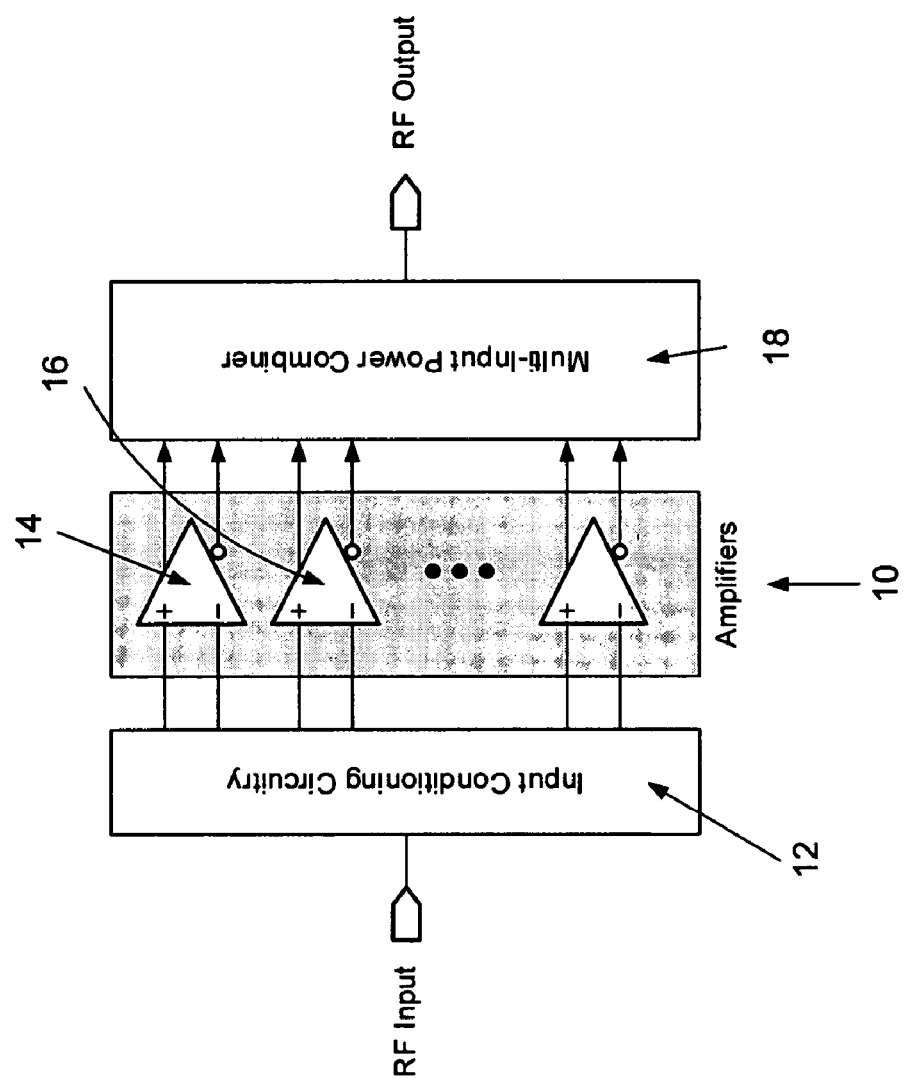
FIG. 1 illustrates one embodiment of a power amplifier of the present invention with an input conditioning circuit, first and second amplifiers and a multi-input power combiner.

As illustrated in FIG. 1, one embodiment of the present invention is a power amplifier, generally denoted as 10, that includes an input conditioning circuit 12, at least first and second amplifiers 14 and 16 in parallel with each other and having an input and an output. An input signal is coupled to the inputs of the at least the first and second amplifiers 14 and 16. It will be appreciated that more than first and second amplifiers 14 and 16 can be utilized. A multi-input power combiner 18 is coupled to the first and second amplifiers 14 and 16. The outputs of the first and parallel amplifiers are combined by the multi-input output power combiner 18, to add signals of the outputs constructively. All or a portion of the input conditioning circuit 20 can be combined together with an amplifier assembly, such as that disclosed in FIGS. 15(*a*) and 15(*b*) hereafter, that includes the first and second amplifiers 14 and 16.

The input conditioning circuit 12 is configured to receive the input and divide it into several outputs that do not have to be at the same relative phase or amplitude. In one embodiment, the input conditioning circuit 12 is configured to receive a single ended input and divide it into several signals. In another embodiment, the input conditioning circuit 12 is configured to receive a single ended RF input and divide it into several signals. In another embodiment, the input conditioning circuit 12 is configured to receive a singled ended input and split the single ended input into signals that are out of phase with respect to each other in each of a set of output lines. In yet another embodiment, the input conditioning circuit 12 is configured to receive a input signal that is differential and split this signal to a set of output signals that can be either differential or single-ended.

Figure 2:
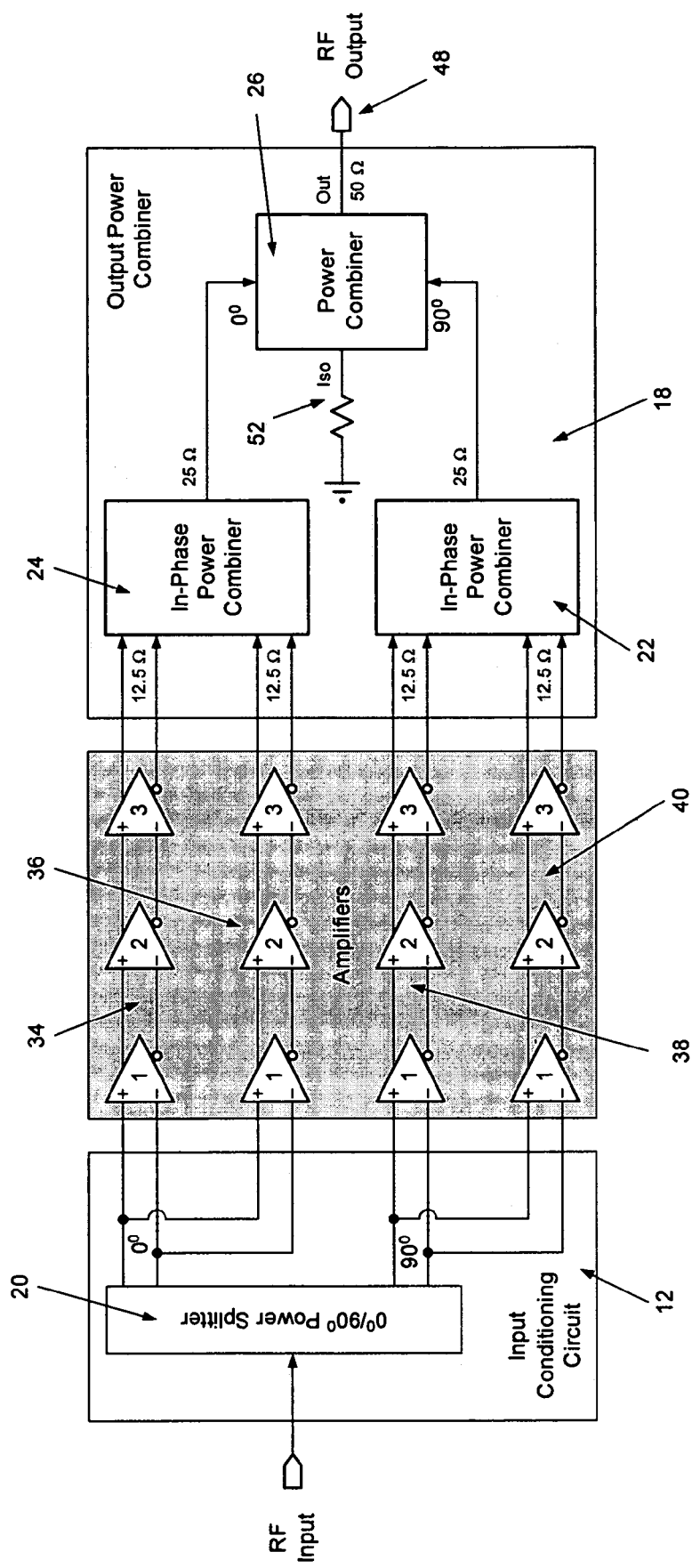
FIG. 2 illustrates an embodiment of a power amplifier of the present invention with the input conditioning circuit creating at least first set and second sets of outputs, the first set being at relative phase 0 degrees and the second set being at relative phase 90 degrees, and both the first and second sets having the same amplitude.
Figure 3:
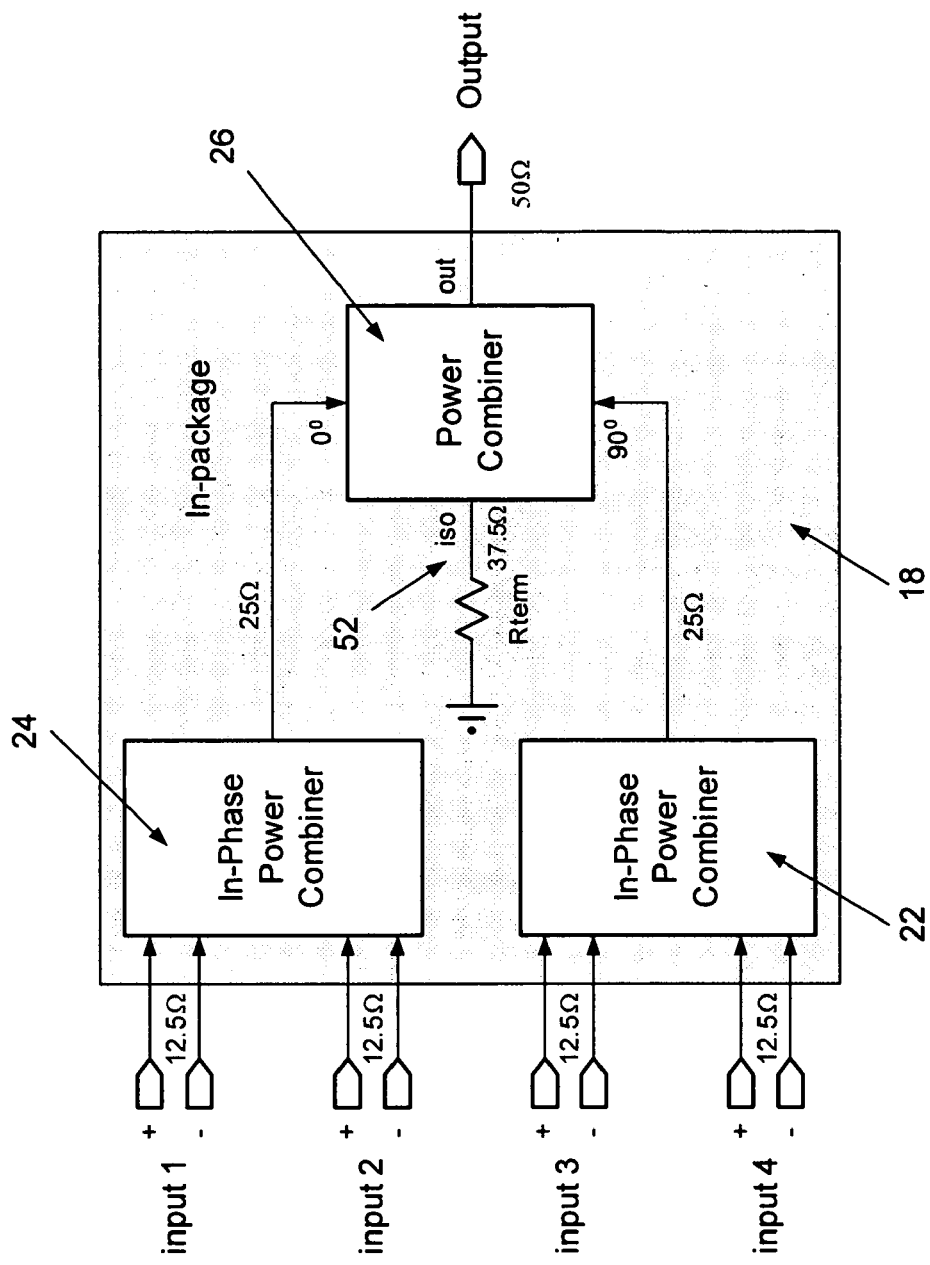
FIG. 3 illustrates an embodiment of a multi-input power combiner receiving inputs with possibly different amplitudes and possibly different relative phases and then adding them constructively together.
Figure 4A:
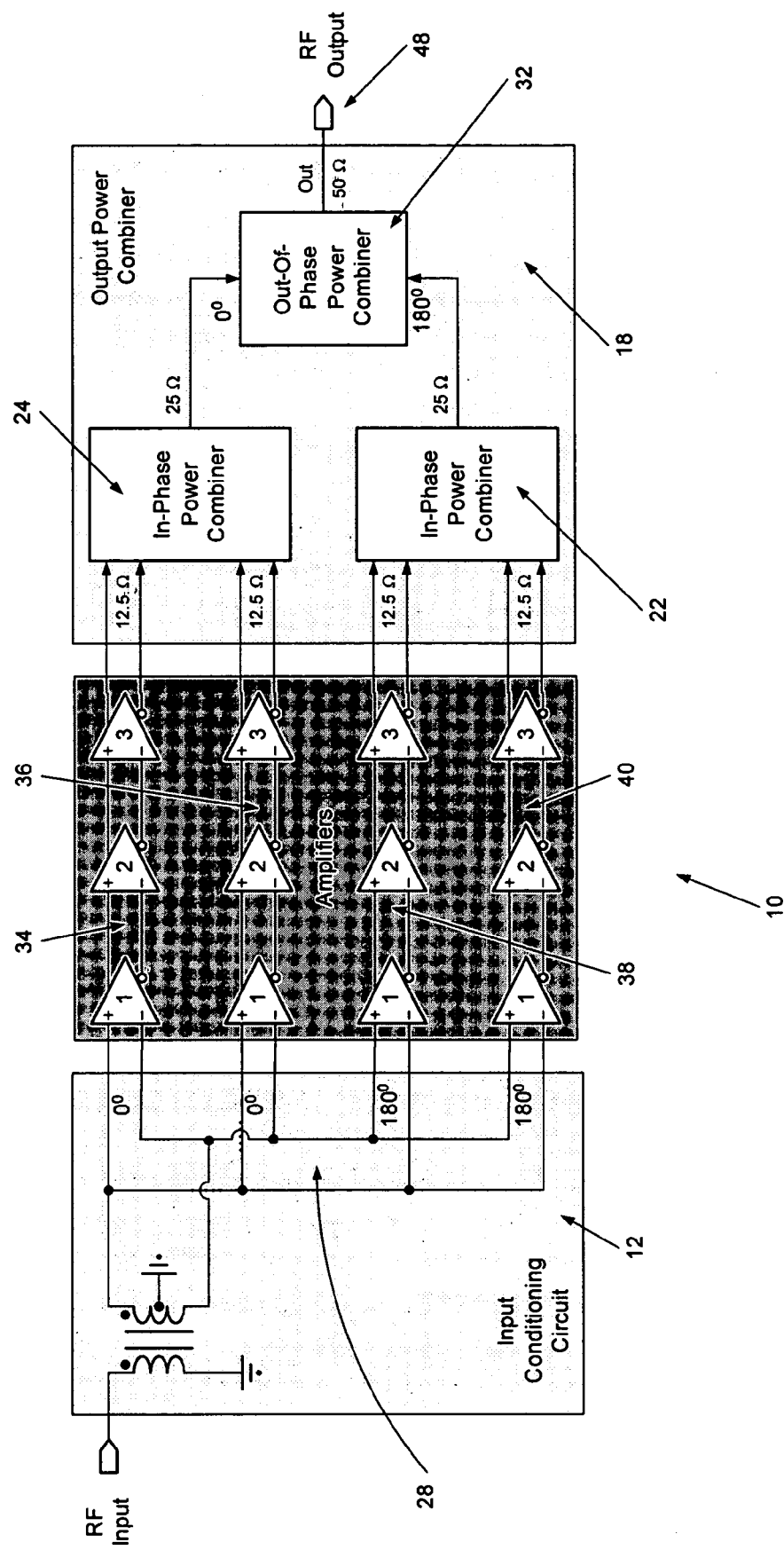
FIG. 4(a) illustrates an embodiment of a power amplifier of the present invention with a multi-input output power combiner that is out of phase, and an input conditioning circuit that includes passive circuitry to achieve 0 degree and 180 degree relative phase power spitting.
Figure 4B:
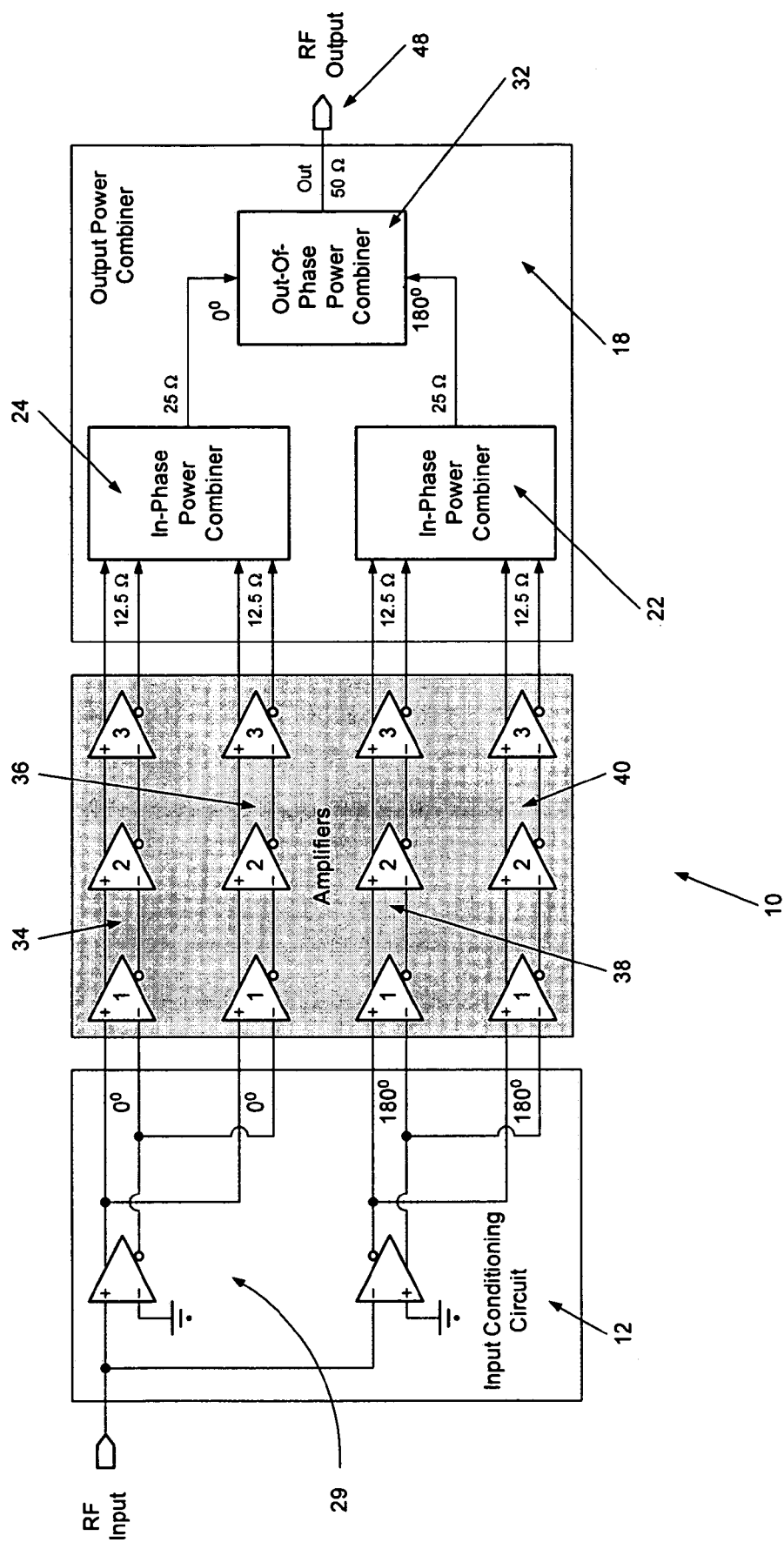
FIG. 4(b) illustrates an embodiment of a power amplifier of the present invention with a multi-input output power combiner that is out of phase, and an input conditioning circuit that includes active circuitry to achieve 0 degree and 180 degree relative phase power spitting.
Figure 4C:
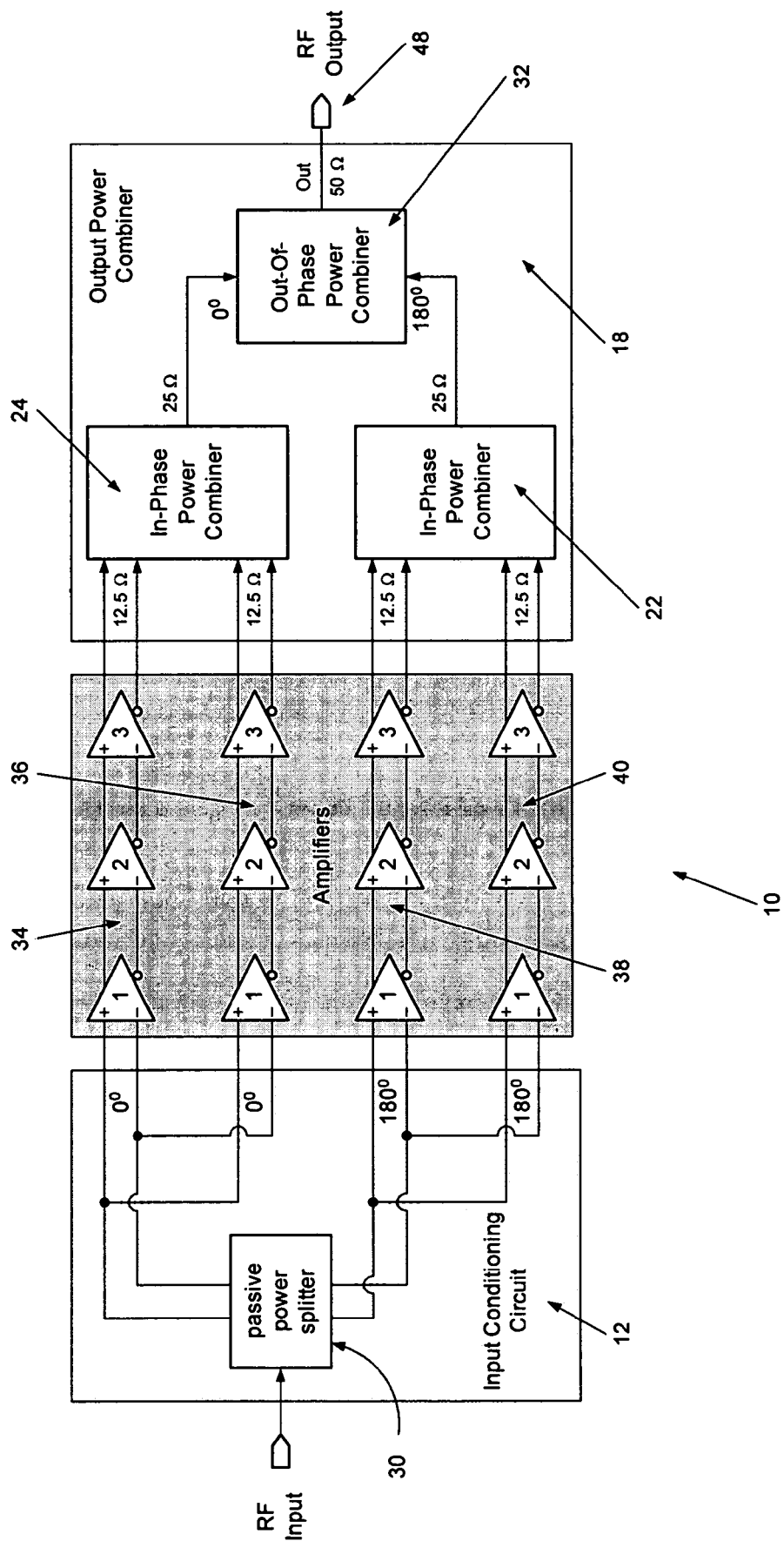
FIG. 4(c) illustrates another embodiment of a power amplifier of the present invention where the input conditioning circuit includes a passive power splitter to achieve 0 degree and 180 degree relative phase power spitting.

Referring now to FIGS. 2, 3, 4(*a*), 4(*b*), 4(*c*), 5(*a*) and 5(*b*) the input conditioning circuit 12 includes a power splitter 20. In various embodiments, the power splitter 20 can, (i) be a 90 degree splitter than configures relative inputs to be 90 degrees out of phase, and the relative phase inputs of 0 and 90 degrees can be generated outside the power amplifier circuitry itself, (ii) have the input to the input conditioning circuit 12 to be singled ended and split by the power splitter 20 into signals that are out of phase, (iii) have an input that is differential, (IV) have an input that is a differential RF input and the like. Input signals may be differential, or single-ended and output signals (from the input conditioning circuit 12) can be either single-ended or differential.

As more fully illustrated in FIG. 2, the input conditioning circuit 12 can be configured to create at least a first set and a second set of outputs, the first set being at relative phase 0 degrees and the second set being at relative phase 90 degrees, and both the first and second sets having the same amplitude The first and second sets of outputs can be at the same relative phase and amplitude. Each signal in the first and second sets of outputs can be at the same relative phase and amplitude to each other. Input signals may be differential, or single-ended and output signals (from the input conditioning circuit 12) can be either single-ended or differential. As shown in the FIG. 2 embodiment, the multi-input output power combiner 18 can include first and second in-phase power combiners 22 and 24, respectively, coupled to a power combiner 26.

Referring to FIG. 3 the multi-input output power combiner 18 can be configured to receive inputs with different amplitudes and relative phases and then add them constructively together. The multi-input output power combiner 18 can be a coupler configured to receive relative phase signals of 0 and 90 degrees and combine them constructively.

Figure 5A:
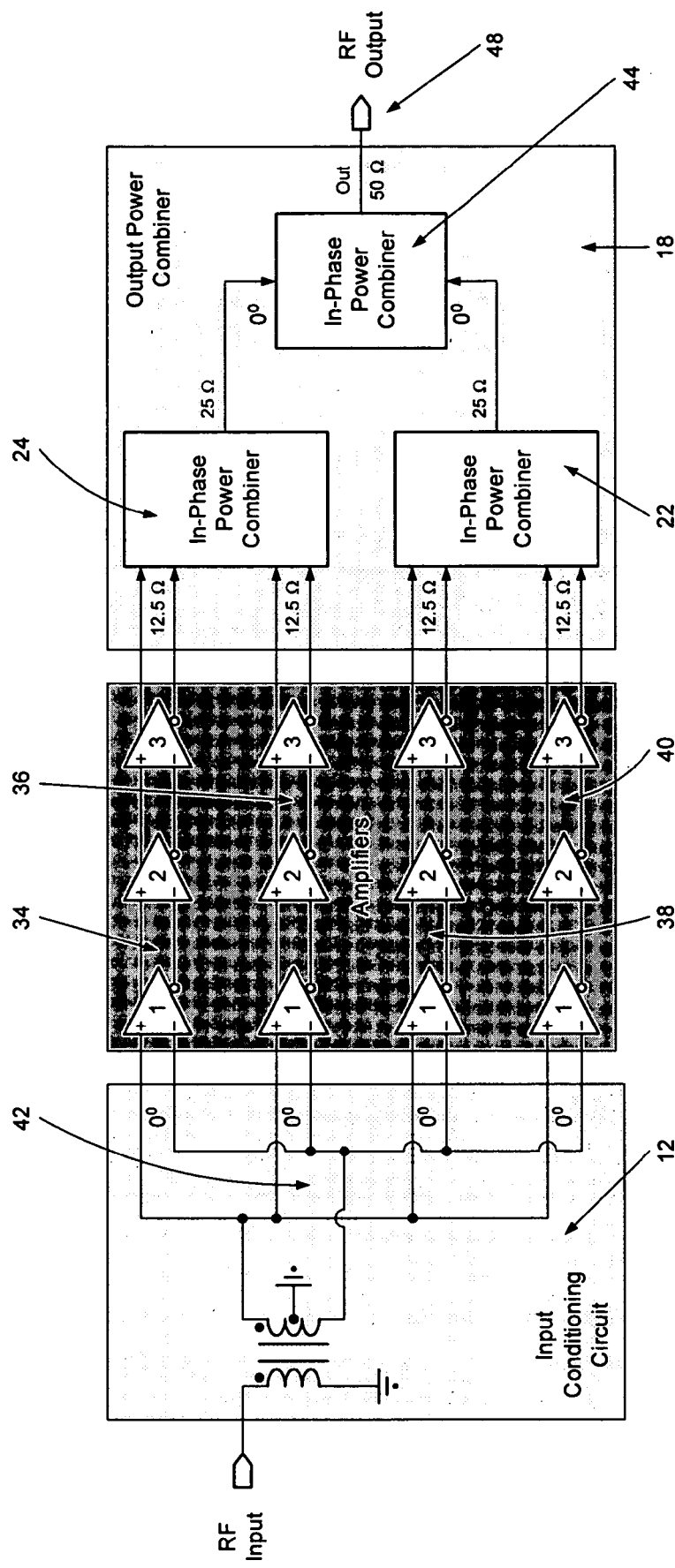
FIG. 5(a) illustrates an embodiment of a power amplifier of the present invention where the input conditioning circuit includes circuitry configured to receive the input and produce at least first and second sets of outputs, and each signal within the first set is at a relative phase of 0 degrees with respect to the second set, the second set of outputs is at a relative phase of 0 degrees, and the multi-input output power combiner is also configured to combine a set of input signals all having relative phase of 0 degrees, constructively.
Figure 5B:
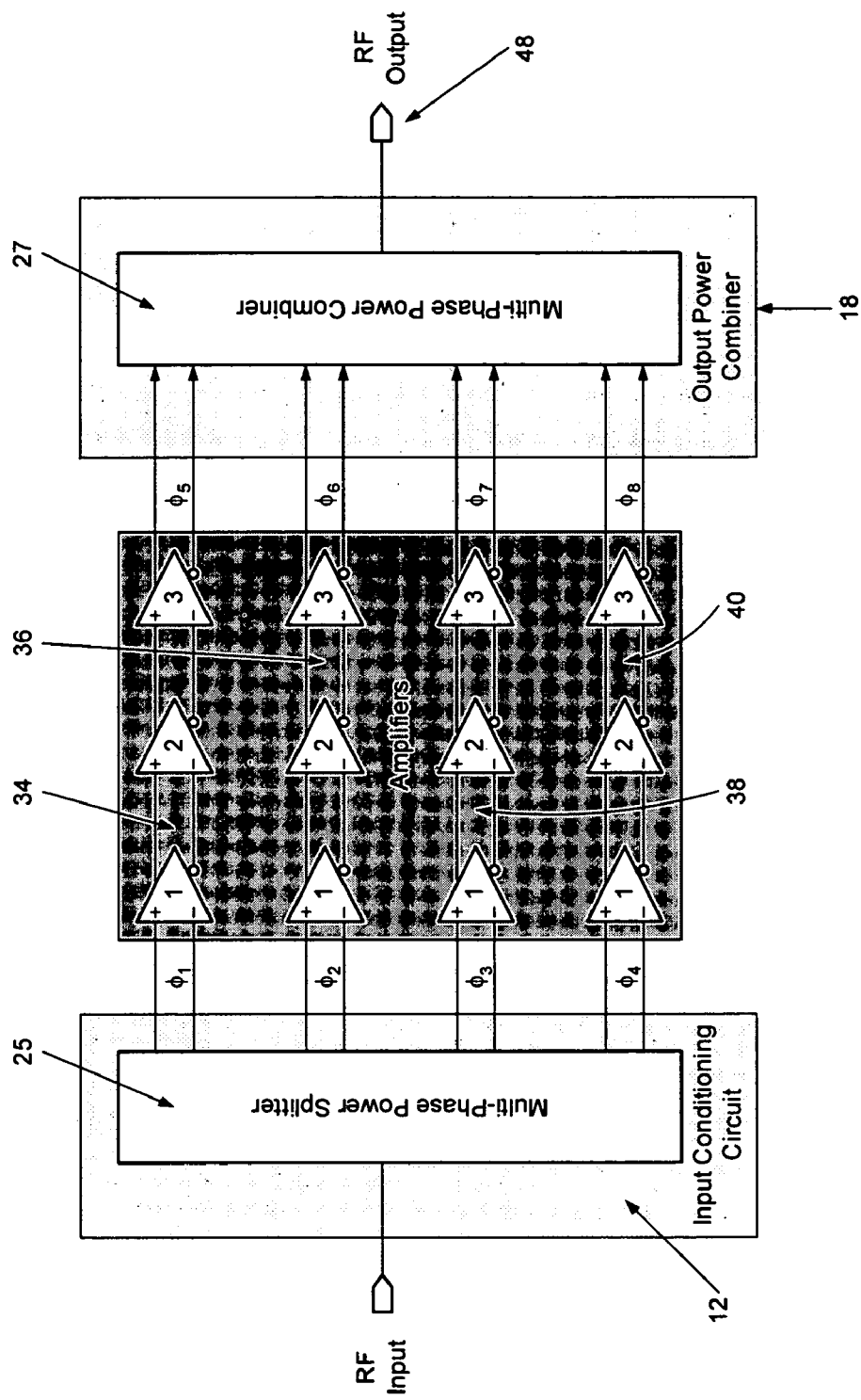
FIG. 5(b) illustrates an embodiment of a power amplifier of the present invention where an assortment of inputs of varying phases, relative to each other, are combined in such a way so that these inputs add constructively at the output of the multi-input power combiner.

In one embodiment, the multi-input output power combiner 18 is configured to combine all inputs together in phase (FIG. 5(*a*), such that all these inputs combine together constructively at the output of the multi-input output power combiner 18. In another embodiment, the multi-input output power combiner 18 is configured to combine some of the inputs in-phase and some of the inputs out of phase (FIG. 4(*a*)), such that the inputs combine together constructively at the output of the multi-input output power combiner 18. In another embodiment, the multi-input output power combiner 18 is configured to combine some of the inputs having a relative phase of 0 degrees and some of the inputs having a relative phase of 90 degrees (FIG. 2), such that these two sets of inputs combine constructively at the output of the multi-input output power combiner 18. In another embodiment, illustrated in FIG. 5(*b*), a multi-phase power splitter 25 and a multi-phase power combiner 27 are provided. In this embodiment, an assortment of inputs of varying phases and/or varying amplitudes, relative to each other, are combined in such a way so that these inputs add constructively at the output of the multi-input output power combiner 18.

Referring now to FIG. 4(*a*), the input conditioning circuit 12 can include circuitry, generally denoted as 28 (on or off-chip) that is configured to receive the input and produce at least first and second sets of outputs. In one embodiment, each signal within the first set is at a relative phase of 0 degrees with respect to the second set, and the second set of outputs is at a relative phase of 180 degrees with respect to the first set. The input conditioning circuit 12 can include a transformer coupler to ground. The input signal can be single ended, and each output can be differential. In another embodiment, the input signal is RF single ended, and each output is differential.

In the FIG. 4(*b*) embodiment, the input conditioning circuit 12 can include active circuitry 29 to achieve the 0 degree and 180 degree relative phase power spitting. In another embodiment, shown in FIG. 4(*c*), the input conditioning circuit 12 can include a passive power splitter 30 to achieve the 0 degree and 180 degree relative phase power spitting. In another embodiment, the input to the input conditioning circuit 12 can be differential in nature. As shown in the FIGS. 4(*a*), 4(*b*) and 4(*c*) embodiments, the in-phase power combiners 22 and 24 are coupled to the out-of-phase power combiner 32.

The amplifier 10 can be an inverting amplifier that changes the polarity of inputs or outputs. As illustrated in FIG. 2, the amplifier 10 can also have multiple sets of amplifiers. These multiple sets of amplifiers can be, by way of illustration and without limitation, sets of amplifiers 34, 36, 38 and 40, as more fully discussed hereafter. Each amplifier in a set of amplifiers 34 through 40 can be non-inverting in its signal polarity. The sets of amplifiers 34 through 40 can be, a first set of amplifiers, including the first amplifier 14, coupled in series, a second set of amplifiers including the second amplifier 16, coupled in series, and so forth. It will be appreciated that a third set of amplifiers coupled in series can also be provided that is in parallel to the first and second sets of amplifiers, a fourth set of amplifiers, etc., and so forth. At least one of the sets of amplifiers 34 through 40 can be inverting in its signal polarity.

With reference now to FIG. 5(*a*), the input conditioning circuit 12 includes circuitry 42 configured to receive the input and produce at least first and second sets of outputs. Each signal within the first set can be at a relative phase of 0 degrees with respect to the second set, and the second set of outputs can be at a relative phase of 0 degrees with respect to the first set. In the FIG. 5(*a*) embodiment, the in-phase power combiners 22 and 24 are coupled to an output power combiner 44.

As shown in FIG. 5(*b*), the input conditioning circuit 12 includes circuitry 25 configured to receive the input and produce an assortment of outputs at different phases and/or amplitudes relative to each other. The multi-phase output power combiner 18 combines the assortment of outputs from the amplifiers in such a way that all of the signals add constructively.

As shown in FIG. 6(*a*), the input conditioning circuit 12 can include on-chip circuitry 46 that is configured to receive the input and produce at least first and second sets of outputs. Each signal within the first set can be at a relative phase of 0 degrees with respect to the second set, and the second set of outputs can be at a relative phase of 90 degrees with respect to the first set. The relative 0 degree and 90 degree inputs can be generated by the on-chip circuitry 46, itself having 0 degree and 90 degree relative input, or by separate signal sources (FIG. 6(*b*)), each of which operates at relative 0 degree and 90 degree phases.

Figure 7:
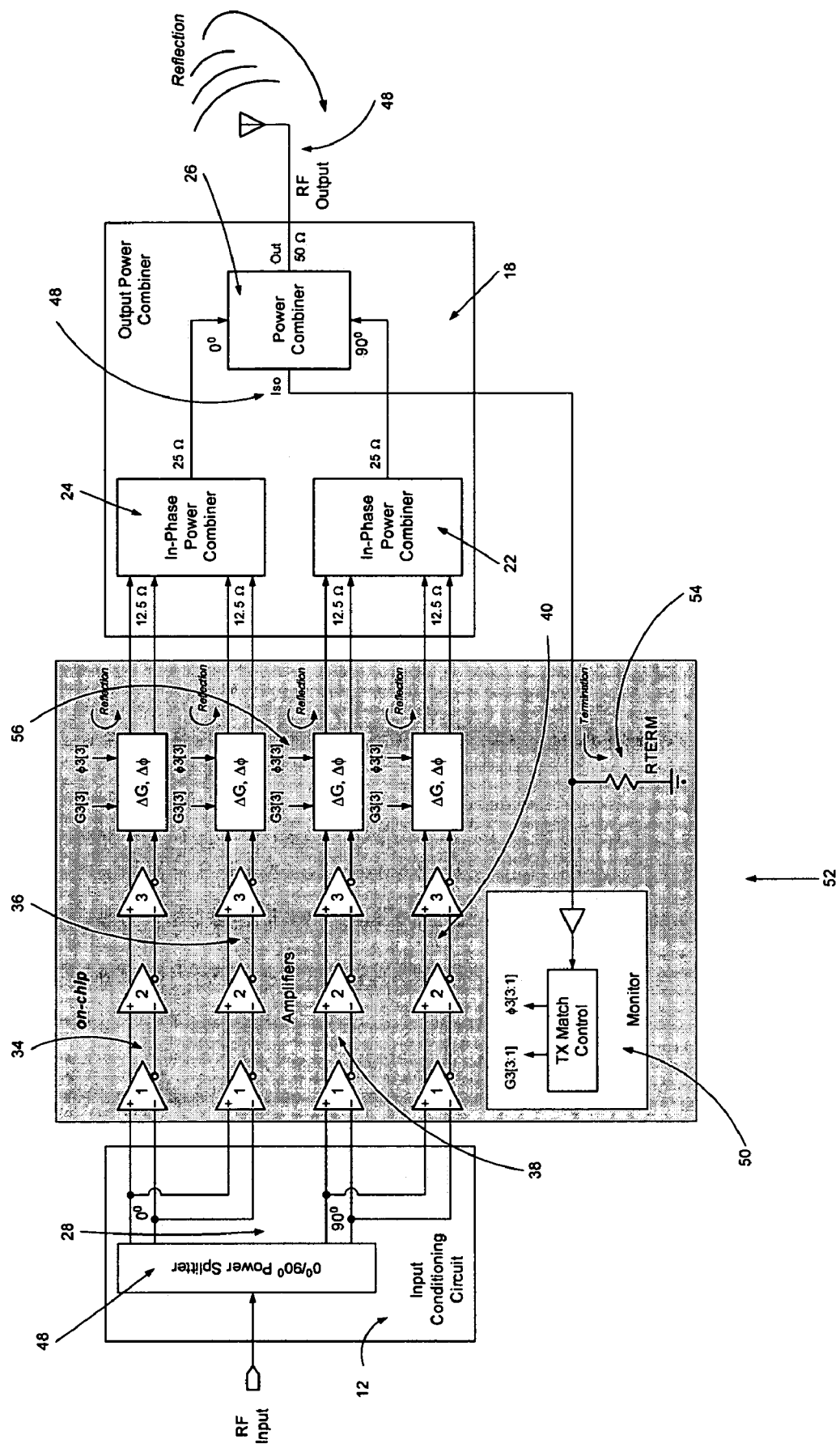
FIG. 7 illustrates an embodiment of a power amplifier of the present invention where the multi-input output power combiner includes an isolation port that provides for termination of reflected signals from a load coupled to the output.

Referring to FIG. 7, the multi-input power output power combiner 16 can include an isolation port 48 that provides for termination of reflected signals from a load coupled to the output. In one embodiment, the multi-input output power combiner 18 is configured to provide sufficient isolation to maintain a good match at an output of the amplifier 10 under mismatched conditions.

A monitor 50 can be coupled to the isolation port 48 to monitor voltage or current. The voltage and current at a port of the monitor 50 is a function of signal amplitude and phase at the input of the multi-input output power combiner 18 and a function of the reflected power from the load at the output of the multi-input output power combiner 18. In one embodiment, the monitor 50 is used to determine an amount of reflected power from the load. In another embodiment, the monitor 50 is used to adjust circuitry 56, within a power amplifier circuit 52, to minimize energy terminated at the isolation port 48. This adjustment capability is made possible by the nature of the relative phase and amplitude at the monitor output. In general, adjustment of the amplifiers is done by circuitry within the amplifier itself, or coupled to the amplifier, that causes relative amplitude differences at the inputs, of the multi-input output power combiner 18.

In one embodiment, this adjustment of the power amplifier circuitry 52, to attain lowest reflected power from the load, can operate with only phase information from the monitor output. In another embodiment, the adjustment of the power amplifier circuitry 52, to attain lowest reflected power from the load, can operate with only amplitude information from the monitor output. In yet another embodiment, the adjustment of the power amplifier circuitry, to attain lowest reflected power from the load, operates with both amplitude and phase information from the monitor output. In the above mentioned embodiments, adjust circuitry 56 can be placed either at the inputs or outputs of the sets of amplifiers 34, 36, 38 and 40. In another embodiment, the amplitude adjustment capability can be achieved by varying the bias or power supply voltages within each set of amplifiers 34 through 40. The termination resistor 54 at the isolation port of the monitor 50 can be located either on- or off-chip.

Referring again to FIGS. 2 and 3, the multi-input output power combiner 18 can include, (i) the first in-phase power combiner 22 coupled to the first and second sets of amplifiers 34 and 36, (ii) the second in-phase power combiner 24 coupled to the third and fourth sets of amplifiers 38 and 40 and (iii) the power combiner 26 coupled to the first and second in-phase power combiners 22 and 24. In this embodiment, the power combiner 26 can receive relative 0 and 90 degree inputs and combine the inputs constructively. Also in this embodiment, the multi-input output power combiner 18 can include the isolation port 48 that provides for termination of reflected signals from the load. Again, as stated above, in this embodiment, the power combiner 26 can be configured to provide sufficient isolation to maintain a good load across an output under miss-match conditions. In this embodiment, the monitor 50 can be coupled to the isolation port 48 to monitor voltage or current. Again, the monitor 50 can determine an amount of reflected power from the load. In this embodiment, the monitor 50 can be used to adjust circuitry within the power amplifier circuitry 52 to minimize energy terminated at the isolation port 48.

Signals from the isolation port 48 can be used to affect changes in the output of the amplifiers so that the resultant output signal from the multi-input output power combiner 18 is sent to the antenna, with minimum reflected power. When the power being reflected from the antenna is minimized, most of the power from the sets of amplifiers 34 through 40 is actually be transmitted out of the antenna itself. Under such conditions, the signal link back to the intended receiver, often a cellular base station, will be enhanced. As mentioned earlier, the unique properties of the in-phase/quadrature power combiner are such that reflected energy from the antenna will ultimately appear at the isolation port 48 of the multi-input output power combiner 18. Information in the phase and amplitude of this signal at the isolation port 48 can be used to affect changes at the output of the power amplifiers to reduced said reflected energy. FIG. 7 shows the operations of changing phase and amplitude of the signals being done at the output of the sets of amplifiers 34 through 40 by the use of special circuitry 56, but this can be equivalently done by changing the phase and amplitude of the signals at the input of each amplifier, and/or by changing the power supply voltage on each amplifier.

Figure 8:
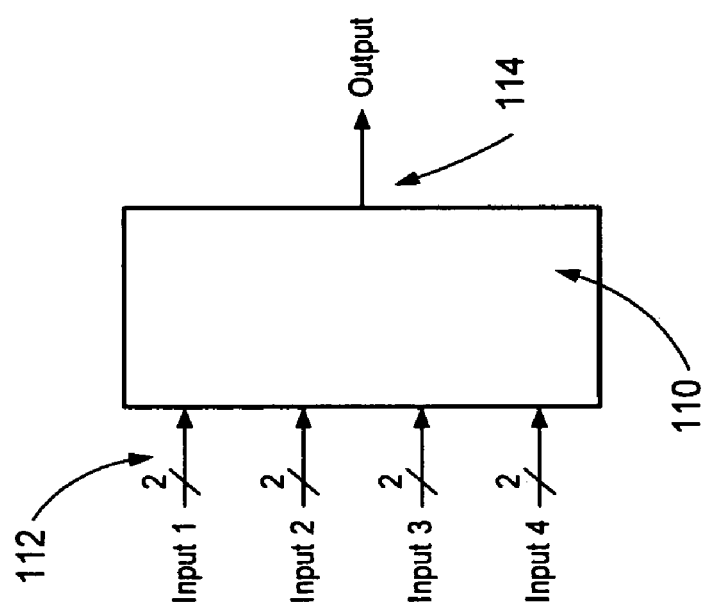
FIG. 8 illustrates one embodiment of a multi-input power combiner of the present invention.

In another embodiment of the present invention, illustrated in FIG. 8, a multi-input output power combiner, generally denoted as 110, provides that all inputs 112 combine constructively into an output 114.

Figure 9A:
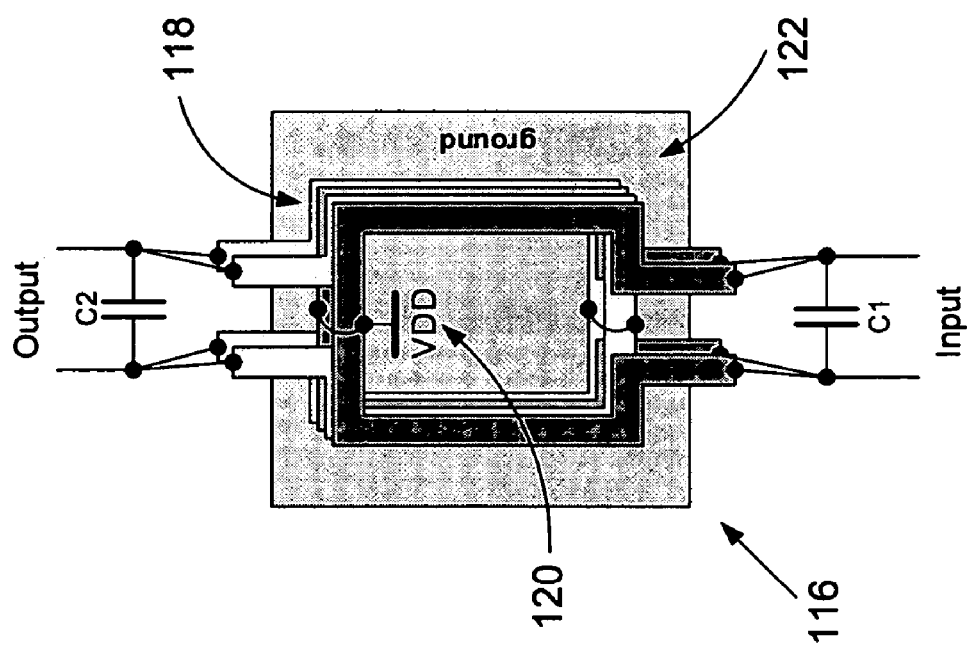
FIG. 9(a) illustrates one embodiment of a multi-layer balun of the present invention.

FIG. 9(*a*) illustrates one embodiment of a balun 116 of the present invention with a plurality of transmission line transformers 118 that are in alternating layers of primary and secondary transmission lines arranged over top of and in between each other. The balun 116 itself can be configured to receive a set of differential inputs and provide a single unbalanced output with a single signal with respect to an AC reference node 120. In another embodiment, the balun output can be taken differentially. The AC reference node 120 can be, ground, VDD, a bias voltage, and the like. The ground can be any ground that is a well decoupled reference voltage point, such as the main reference node of the package or printed circuit board, which in many cases is the solid metal pad that the IC is attached to, or in the case of a PCB, the copper layer of the board designated to be ground. The layers of the balun 116 can be metal layers. Preferred metals are copper or gold, or aluminum, though any conductor can be made to work. A ground plane 122 can coupled to the metal layers. In various embodiments, the ground plane 122 is coupled to a, top, bottom or side of the metal layers. Plated-through holes, or vias, are used to connect between the metal layers and the ground plane 122.

In one embodiment, the balun 116 has a 1 to 1 impedance transformation with respect to its inputs to outputs. In another embodiment, the balun 116 has a non 1 to 1 impedance transformation with respect to its inputs to outputs. The balun 116 can provide a single unbalanced output by connecting one of the two output lines to an AC reference point, often ground. In one embodiment, a single connection to a second reference point voltage is positioned to provide that a DC reference voltage or current appears at the input side of the balun. Each layer of the plurality of layers can provide electrical isolation at low frequency between the inputs and the outputs of the balun 116. Low frequency is sufficiently below a lower end of a desired bandwidth to provide that performance within the desired bandwidth is not adversely affected. For example, this lower frequency is chosen such that there is less than 0.1 db of power loss in the circuitry, or that there is less than 6 degrees of unwanted phase shift within the signal.

One embodiment of the balun 116 includes a plurality of layers, and the plurality of transmission lines 118 associated with the plurality of layers. The layers can be placed one on top of another or in another embodiment, the layers can be placed side by side. In another embodiment, the layers are placed side by side as well as on top of each other. In certain embodiments, at least one layer coupled to an input side of the balun is, (i) in parallel with another layer, and at least one layer coupled to an output side of the balun is in parallel with another layer, (ii) in series with another layer, and at least one layer coupled to an output side of the balun is in series with another layer, (iii) in series with another layer, and at least one layer coupled to an output side of the balun is in parallel with another layer, (iv) in parallel with another layer, and at least one layer coupled to an output side of the balun 116 is in series with another layer, and the like.

Figure 9B:
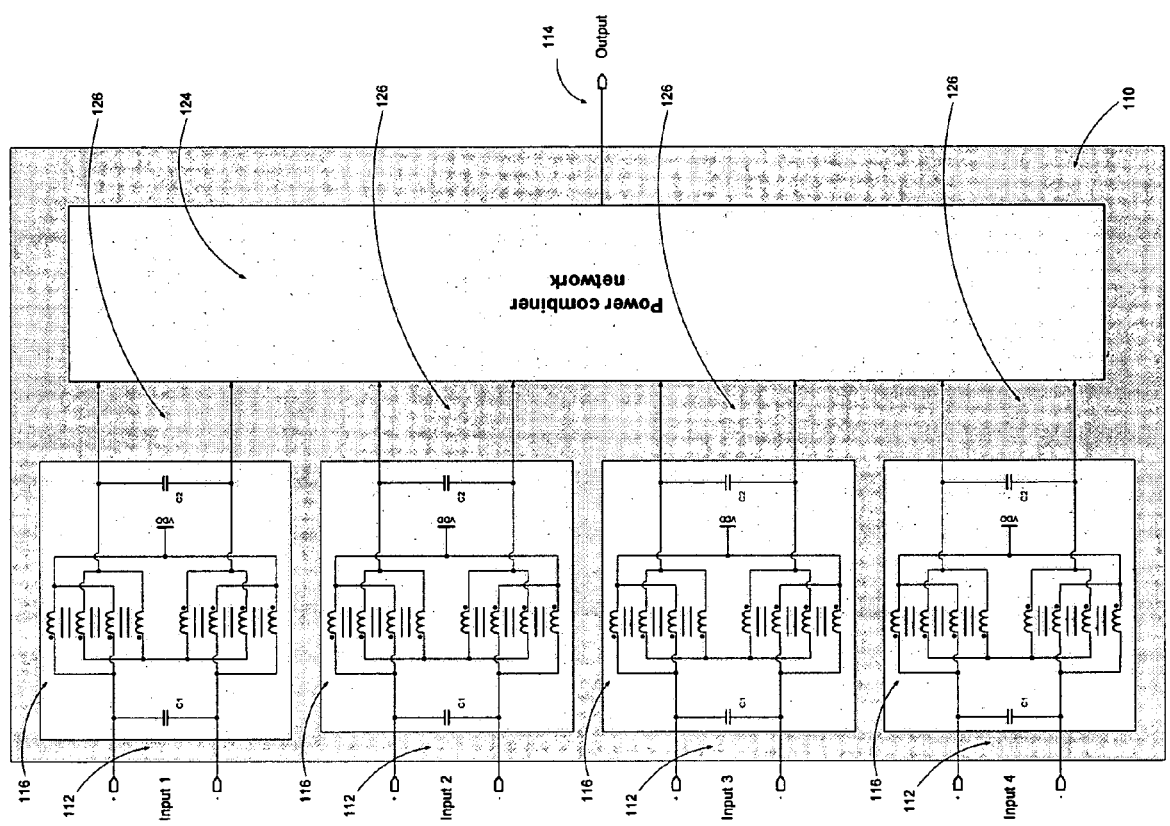
FIG. 9(b) illustrates one embodiment of a multi-input power combiner with multiple baluns from FIG. 9(a).

Referring now to FIG. 9(b), one or more baluns 116 can be coupled to a power combiner network 124. The output of each balun 116 can be coupled to the power combiner network 124 in either single ended or differential fashion. The power combiner network 124 is designed such that the output of each balun 116 will combine constructively to create output 114. In certain embodiments of the power combiner network 124, a high degree of isolation is maintained between all of the inputs 126 of the power combiner network 124. In some embodiments, such isolation, as seen at any particular input 126, is independent of the driving source impedance coupled to the other inputs 126.

FIG. 9(b) illustrates each balun 116 as a set of coupled inductors. It will be appreciated that both inductive and capacitive coupling occurs between each of the layers of the balun. In certain embodiments, the balun 116 can utilize the capacitive coupling to its advantage for much broader bandwidth operation and much lower losses. By way of illustration, but without limitation, such bandwidth can be on the order of 2:1 in frequency and such losses can be on the order of less than a few tenths of a dB. The concept of using both inductive and capacitive coupling between layers of the balun 116 forms the basis of microwave transmission line transformer/balun design practice.

Figure 10:
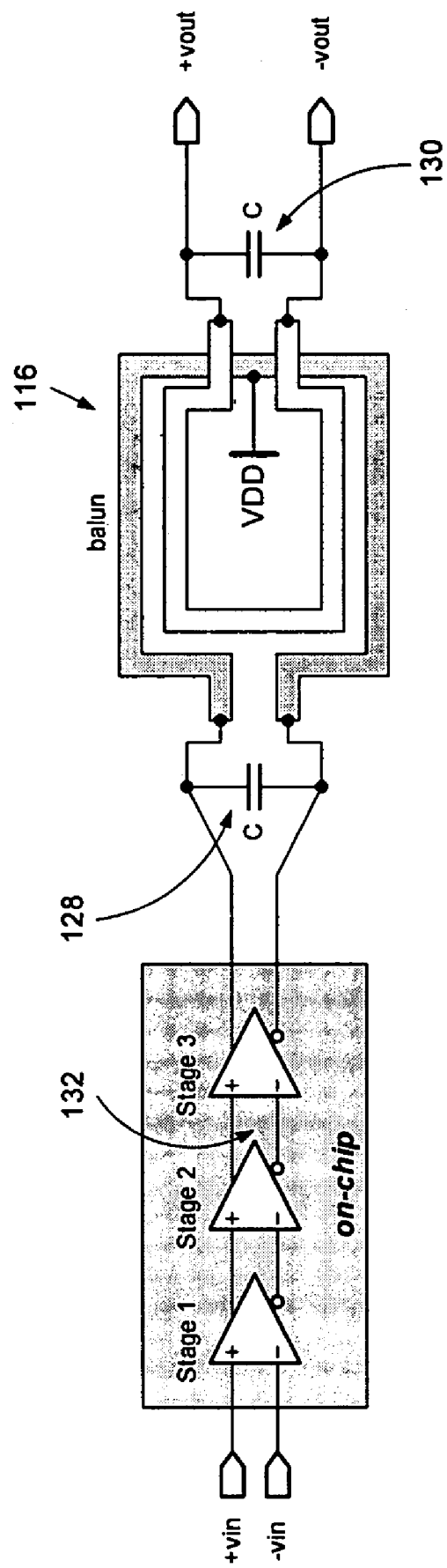
FIG. 10 illustrates one embodiment of a multi-layer balun of the present invention with a single section of a power amplifier driving the balun.

Part of the multi-input output power combiner 110 includes the balun 116, shown in FIG. 10. In one embodiment, the balun 116 has a largest dimension along one side that is less than half of a ¼ wavelength in a selected material at the fundamental signal frequency. The selected material can be from, (i) a printed circuit board, (ii) ceramic substrates, (iii) integrated circuit dielectric material or integrated packages, and the like.

In various embodiments, the multi-input power combiner 110 and/or the balun 116 is configured to provide outputs with no more than a 10%, 8%, 7%, 6%, 5%, 4%, 3%, 2% and 1% loss in efficiency relative to a loss-less balun at the fundamental signal frequency. In other various embodiments, the multi-input power combiner 110 and/or the balun 116 is configured to provide an output with no more than a, 1.0 dB, 0.5 dB, or 0.1 dB loss of output power relative to a loss-less balun.

The multi-input output power combiner 110 and/or the balun 16 can be configured to couple a DC current or voltage to outputs of an amplifier, such as amplifiers 14 and 16, as well as sets of amplifiers 34 through 40 above.

With reference now to FIG. 10, one or more capacitors 128 can be coupled to the input side of the balun 116, and at least a second capacitor 130 can be coupled to the output side. When present, the capacitors 128 and 130 allow for the balun 116 to be substantially less than ¼ of a wavelength at the signal fundamental frequency, thus resulting in significant size reduction. Ideally, the balun 116 is designed to not only convert differential input signals to single-ended signals but also to provide for a DC signal and to provide for desired impedances at the fundamental signal frequency and its harmonics, as well as being able to pass the fundamental frequency and all its harmonics. In the FIG. 10 embodiment, the balun 116 is coupled to a stage of amplifiers, denoted as 132, which can be the same as sets of amplifiers 34 through 40 above.

Figure 11A:
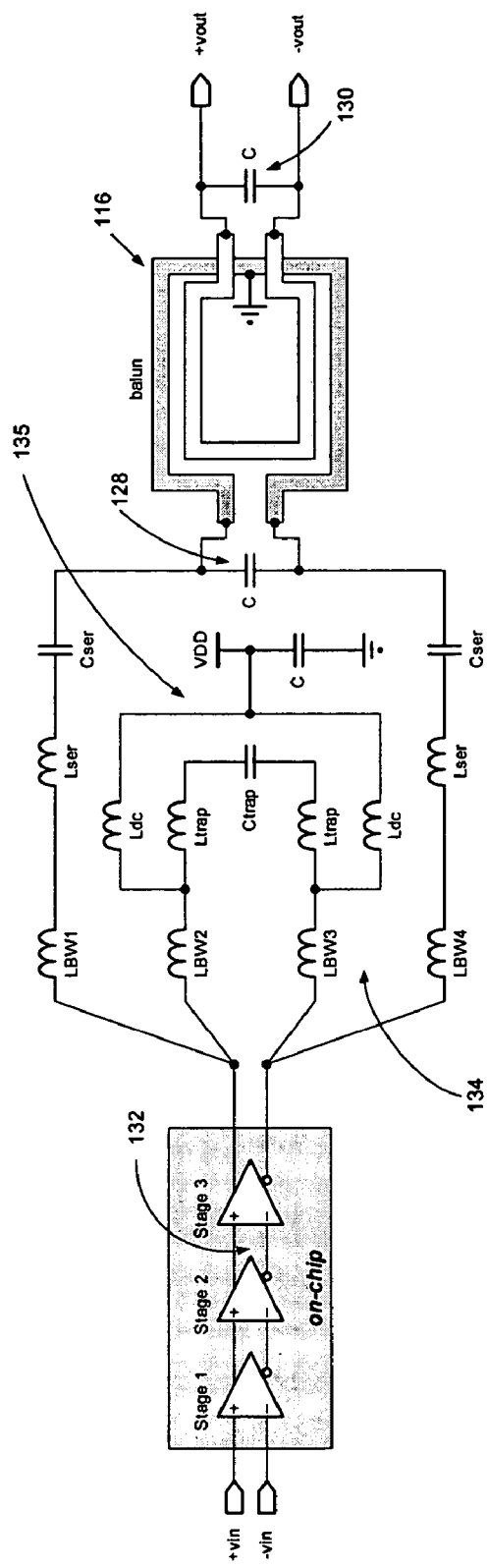
FIGS. 11(a) and 11(b) illustrates embodiments of a single section of a power amplifier driving balun of the present invention with optional filtering and DC feed circuitry.
Figure 11B:
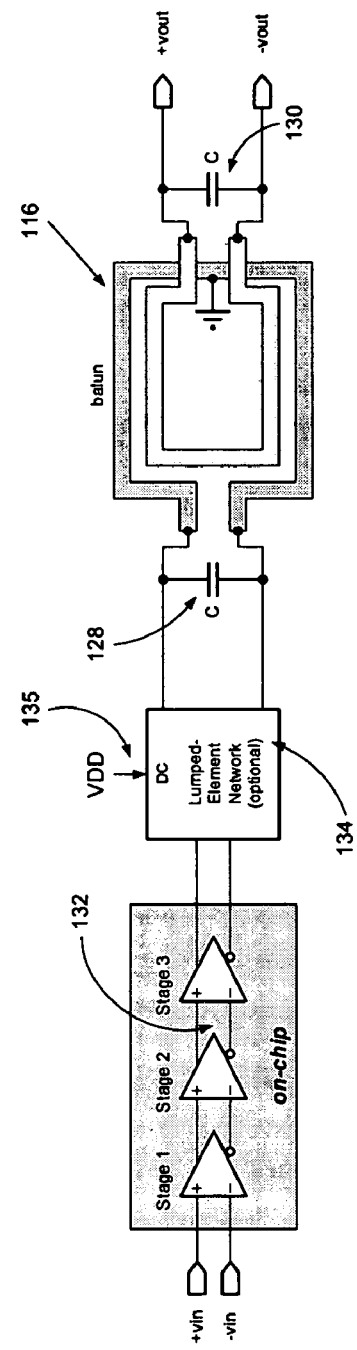

In the FIGS. 11(a) and 11(b) embodiments, additional lumped-element circuitry 134 has been added to accomplish the goals, just mentioned, when the balun 116 does not provide sufficient filtering and/or proper bias. Note that any inductor labeled at LBWm (where m is an integer) is meant to denote an inductance due to bond wires. The circuitry 134 suppresses at least a second harmonic of the signal frequency. The balun 116 itself can also be configured to provide for suppression of at least a second harmonic of the signal frequency. The circuitry 134 reflects a low impedance at a second harmonic of the signal frequency to an output of an amplifier coupled to the balun 116. The balun 116 can also be configured to reflect a low impedance at a second harmonic of the signal frequency to an output of an amplifier coupled to the balun 116. In one embodiment, the circuitry 134 provides a fundamental signal frequency bandpass function. In another embodiment, the balun 116 also can provide a fundamental signal frequency bandpass function. In one embodiment, the circuitry 134 suppresses at least a third harmonic of the signal frequency. In another embodiment, the balun 116 can also be configured to suppress at least a third harmonic of the signal frequency. In one embodiment, the circuitry 134 reflects a high impedance at a third harmonic of the signal frequency. Additional circuitry, not shown, can be used in a similar fashion to affect desired impedances and filtering functions for harmonics beyond the third harmonic of the signal frequency. FIGS. 11(a) and 11(b) also include circuitry 135 that couples DC bias to the output of the amplifiers 124 without adversely affecting the signal.

In another embodiment, the balun 116 is configured to reflect a high impedance at a third harmonic to an output of an amplifier coupled to the balun 116. The fundamental and harmonics create a more flattened waveform without loss of efficiency. In certain prior art examples, such flattening of the waveform is done by clipping the waveform with circuits such as diodes. Clipping, as thus described diverts signal power into the clipping components, which generally results in wasted power and lower efficiency. For example, even harmonics can be removed from the output, resulting in a more flat-topped response, much like a square wave. One way to get this flat top waveform and more benign breakdown conditions (in other words, breakdown is not exceeded) is by putting proper harmonic content, such as but not limited to removing second harmonics and enhancing the third harmonics. Fundamental to this method of waveshaping is the fact that signals coupled to low impedances (shorts) are reflected back to their source out-of-phase (180 degrees), while signals coupled to high impedances (opens) are reflected back to their source in-phase (0 degrees). Since the power amplifier operates at RF or microwave frequencies, sometimes a different impedance, other than a short or open, is required either within the balun 116 itself or within the circuitry 134, such that the desired impedance is seen at the output of the amplifier. For example, a short at the end of a quarter-wave section of transmission line will look like an open at the input of such a line. Conversely, an open at the end of the quarter-wave section of transmission line will look like a short at its input.

Figure 11C:
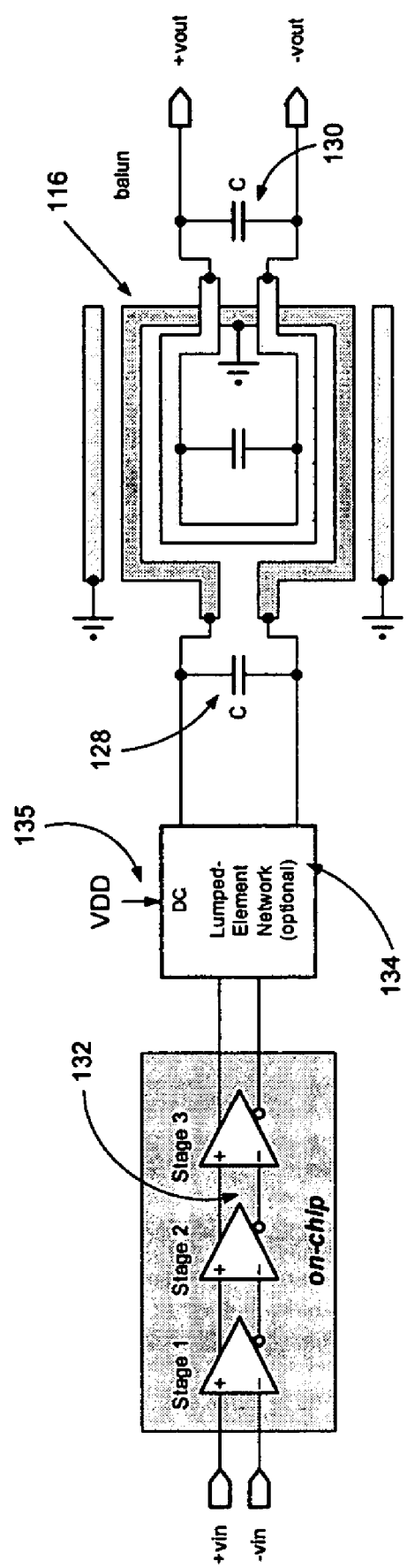
FIG. 11(c) illustrates one embodiment of a balun of the present invention where desired filtering and impedance behaviors are solely within the balun.

The impedance and filtering criteria, described above, can be within the balun 116 itself. Some portion or all of the these behaviors can be designed within the balun 116 itself. In some instances, certain functions can still be maintained with circuitry 134. The balun and the circuitry 134 can share these different functions. In one embodiment, the ideal scenario is the case in which all desired filtering and impedance behaviors are solely within the balun 116, thus saving physical size and reducing loss. The design of these behaviors in the balun 116 can be achieved, with, the proper selection of line width, spacing, the use of nearby coupled elements and the addition of lumped circuit elements, as shown in FIG. 11(*c*).

In one embodiment first and second baluns 116 or more, are provided, as shown in FIG. 9(*b*). The action of balun 116 in this embodiment follows the same behaviors, as described above with regard to filtering and impedance criteria.

Figure 12:
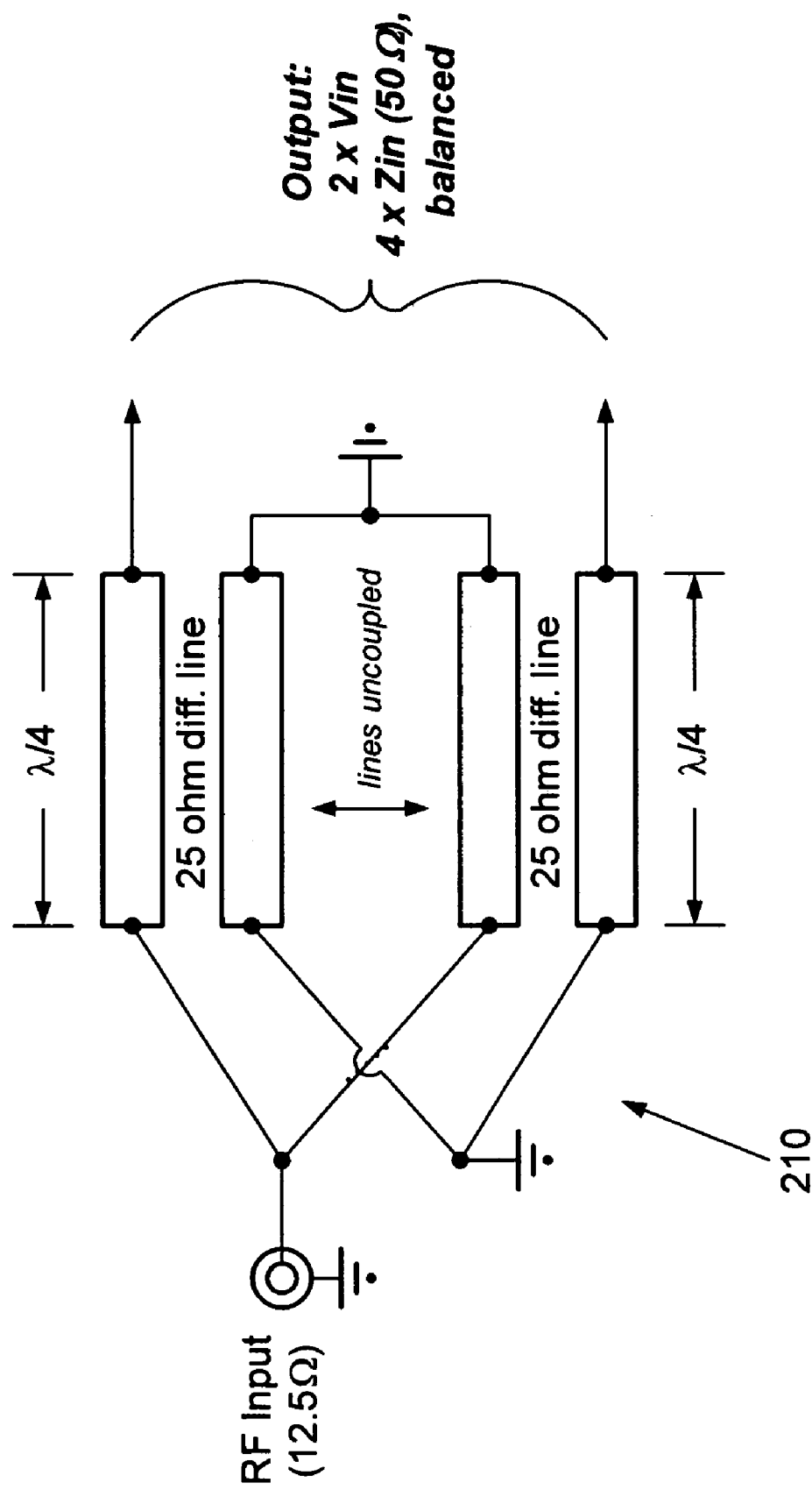
FIG. 12 illustrates one embodiment of a Guanella balun of the present invention.

In certain embodiments, balun 116 can utilize the Guanella balun 210. The Guanella balun 210 can be inherently at a 1:4 impedance ratio. The action of the Guanella balun 210 can step up the voltage by a factor of 2 and the impedance by a factor of 4. A single-ended impedance of 12.5 ohms can be stepped up to 50 ohms, or two 25 line ohm lines can be stepped up to 50 ohms. Guanella balun 210 can take a single-ended impedance (shown as 12.5 ohms in FIG. 12) and steps it up to a differential impedance, shown as 50 ohms in FIG. 12.

Figure 13:
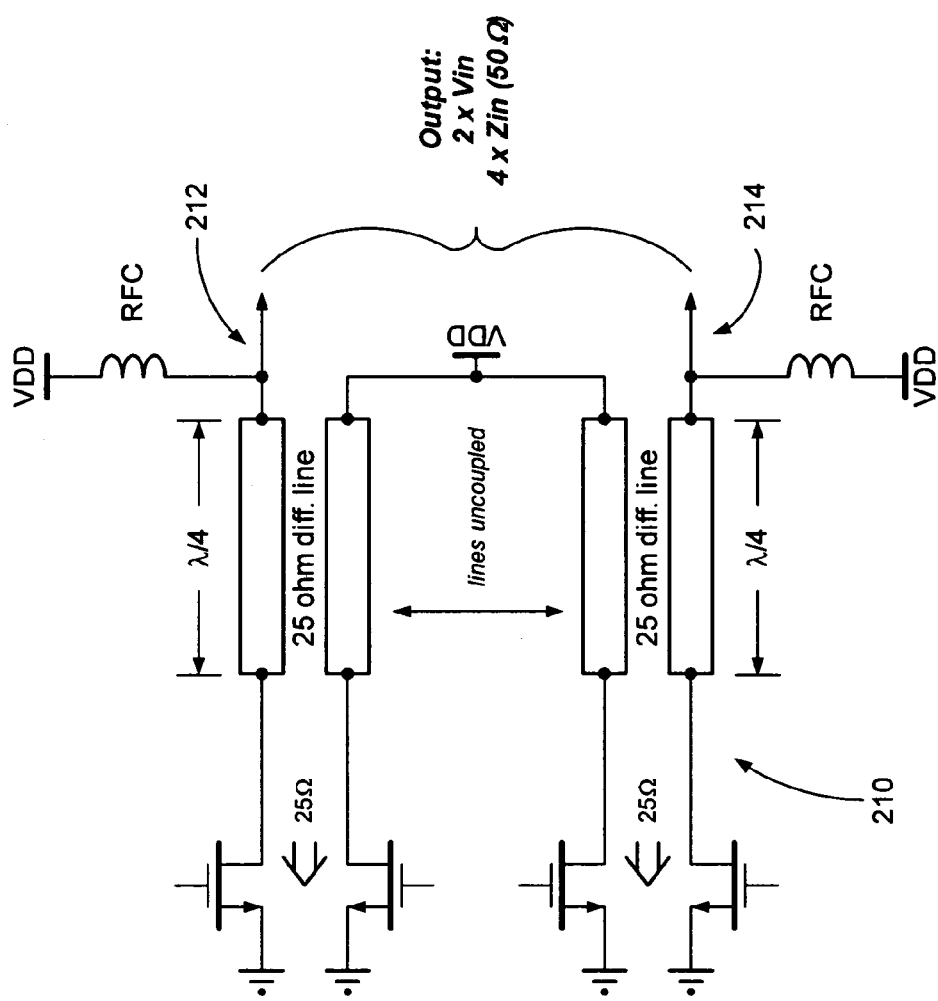
FIG. 13 illustrates one embodiment of a Guanella balun of the present invention that is driven differentially.
Figure 14:
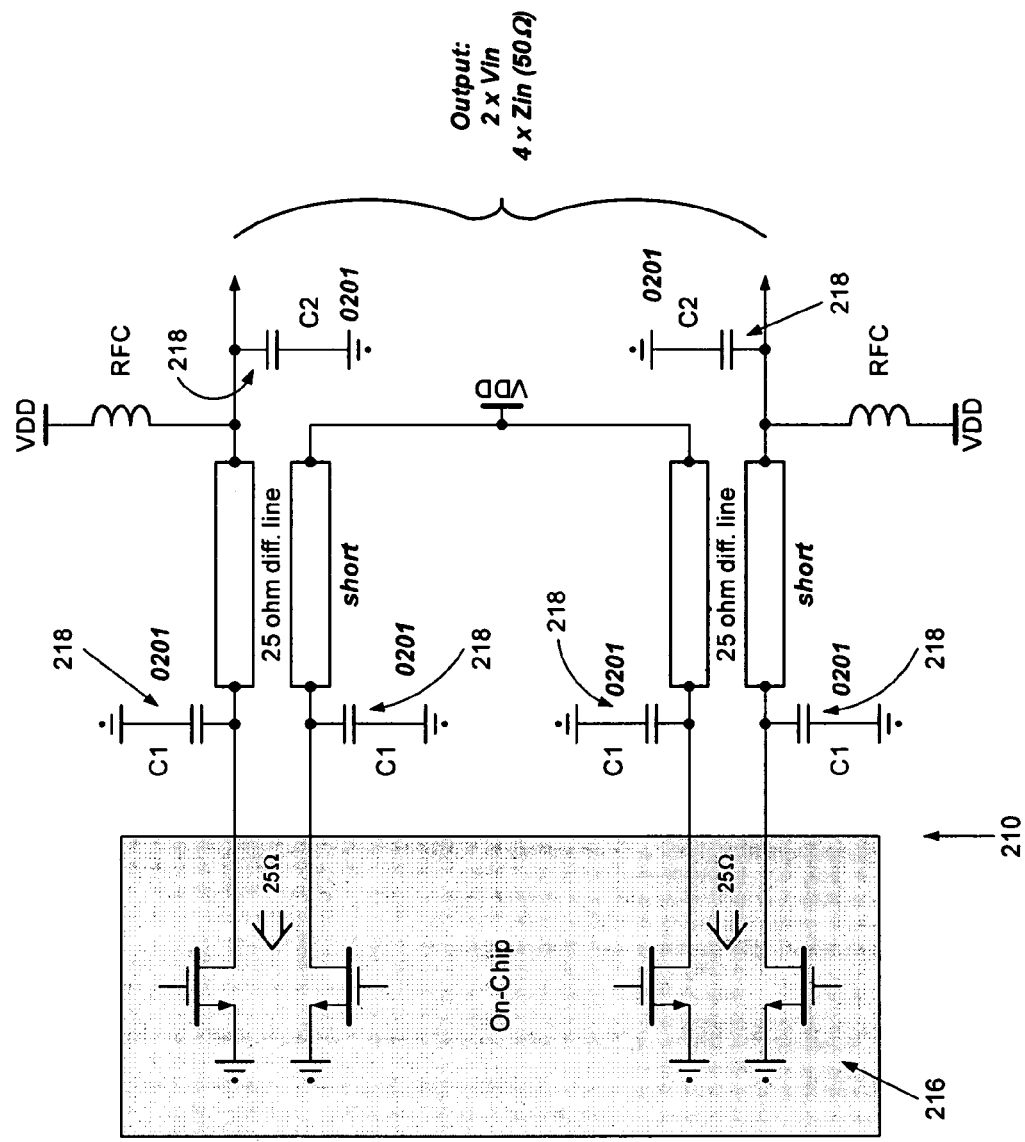
FIG. 14 illustrates one embodiment of a Guanella balun of the present invention with physically shortened lines.

FIG. 13 shows a variation of the Guanella balun 210 with two sets of inputs, each at 25 ohms, and each differential. This configuration is attractive for use in high-frequency IC applications, since the two output differential pairs 212 and 214 can be placed in parallel, as opposed to being coupled in parallel first on-chip (which can be hard to do), then coupled to the input of the Guanella balun 210. The approach shown in FIG. 14 also allows for direct connection of the output transistors directly to the Guanella balun 210. FIG. 14 shows the Guanella balun 210, as used in conjunction with integrated circuitry 216. However, in this embodiment, capacitors 218 have been added to allow for a physically shortened version of the Guanella balun.

In another embodiment of the present invention, illustrated in FIGS. 15 (*a*) and 15(*b*), an amplifier system, generally denoted as 310, includes at least a first balun 312 and a second balun 314, each with an input and an output. FIGS. 15(*a*) and 15(*b*) show additional baluns, as more fully explained hereafter. However, it will be appreciated that only two baluns 312 and 314 may be utilized.

Each balun 312 and 314 can have the configurations of the balun 116, as well as any of its embodiments described above. An amplifier assembly, generally denoted as 316, includes at least a first set of amplifiers 318 in parallel to a second set of amplifiers 320. The first set of amplifiers 318 provides the input to the first balun 312, and the second set of amplifiers 320 provides the input to the second balun 314. The amplifier assembly 316, the first set of amplifiers 318 and the second set of amplifiers 320 can be amplifier 10, as well as any of its embodiments described above. The outputs of the first and second baluns 312 and 314 add constructively and substantially in series.

In one embodiment, amplifier system 310 includes at least one timing alignment circuit 324 coupled to the amplifier assembly 316. Each amplifier of amplifier assembly 316 can include an input conditioning circuit and a multi-input power combiner, as described above. As previously mentioned, amplifier system 310 can include 3, 4 or more baluns, as well as 3, 4 and more sets of amplifiers coupled to the associated baluns.

In one embodiment, amplifier system 310 includes a single connection to a low frequency reference point voltage 326 that appears as a low impedance to higher frequency signals in the frequency band of interest, sometimes obtained by connecting a parallel capacitor between reference point voltage 326 and ground. The single connection to the reference point voltage 326 is positioned on an output or input side of each of the first and second baluns 318 and 320 respectively. In another embodiment, amplifier system 310 includes at least a first capacitor 328 added to the input side of each of the first and second baluns 312 and 314 respectively, and at least a second capacitor 330 added to the output side of each of the first and second baluns 312 and 314.

In one embodiment, amplifier system 310 includes a first lumped element circuit 332 that couples a first set of amplifiers output to the input of the first balun 312, and a second lumped element circuit 334 that couples a second set of amplifiers output to the input of the second balun 314. The first and second lumped element circuits 332 and 334 can provide for DC bias, a filtering function, present a desired impedance at each harmonic and the fundamental, effect an impedance transformation for lower to higher impedance, and the like. The filtering functions include at least one of, passing with minimum attenuation signals at a fundamental signal frequency, and attenuate for at least a portion of harmonics of a fundamental signal frequency.

Figure 16:
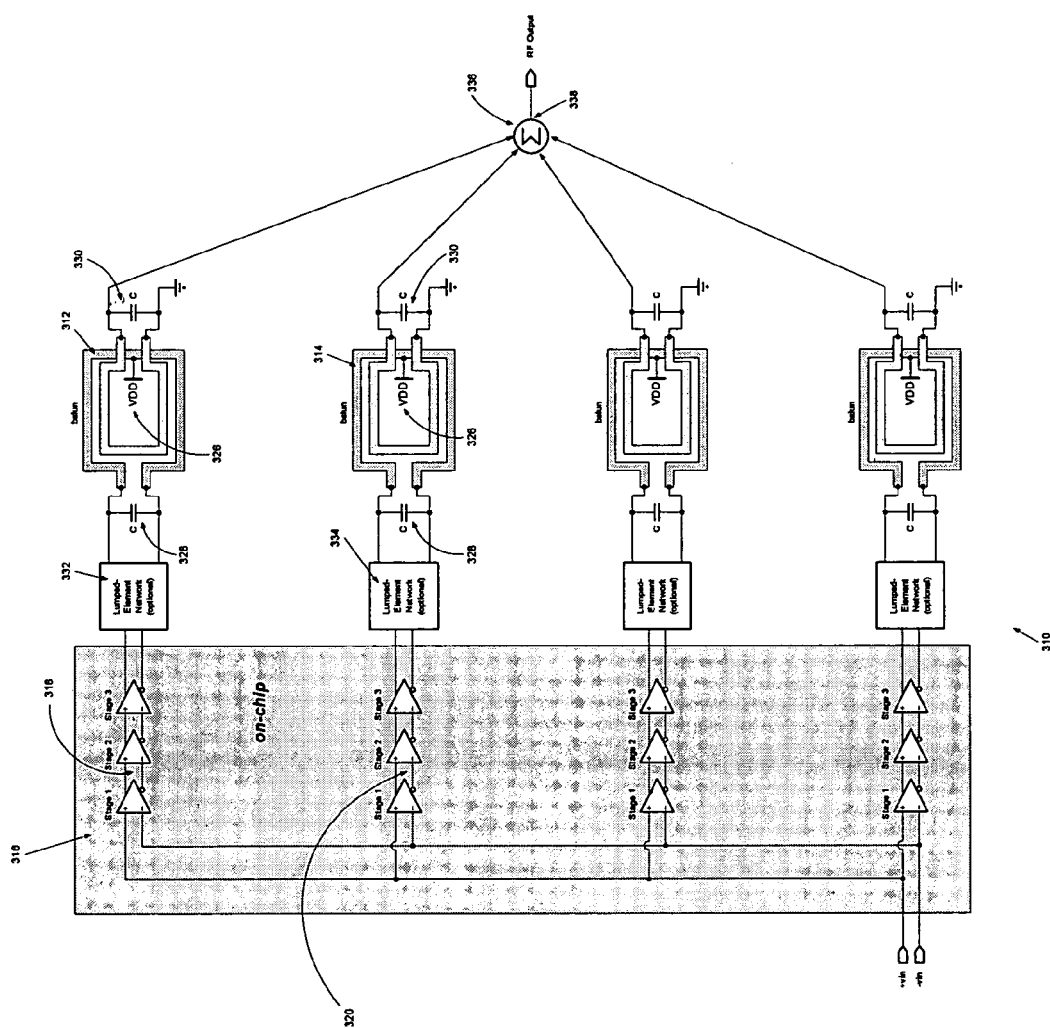
FIG. 16 illustrates one embodiment of an amplifier system of the present invention where the outputs of the baluns add constructively and substantially in parallel.

In another embodiment of the present invention, illustrated in FIG. 16, the amplifier system 310 includes the first balun 312 and the second balun 314. Each balun 312 and 314 can have the configurations of the balun 11.6 as well as any of its embodiments described above. The amplifier assembly 316 is provided and again includes at least the first set of amplifiers 318 in parallel to the second set of amplifiers 320. The first set of amplifiers 318 provides the input to the first balun 312, and the second set of amplifiers 320 provides the input to the second balun 314. The amplifier assembly 316, the first set of amplifiers 318 and the second set of amplifiers 320 can be amplifier 10, as well as any of its embodiments described above. A power combining circuit 336 is provided and has input ports. In this embodiment, the outputs of the first and second baluns 312 and 314 add constructively and substantially in parallel. In this embodiment, the first and second baluns 312 and 314 are coupled to a power combining circuit 336 in a manner to provide that each input is substantially isolated from the other input such that changes in power or impedance at outputs of each balun 312 and 314 and do not substantially change loading on the other input. The first and second baluns 312 and 314 are coupled to a common node 338 of the power combining circuit 336.

In another embodiment, the first lumped element circuit 332 that couples the first set of amplifiers output to the input of the first balun 312, and the second lumped element circuit 334 that couples the second set of amplifiers output to the input of the second balun 314 are provided.

Figure 17A:
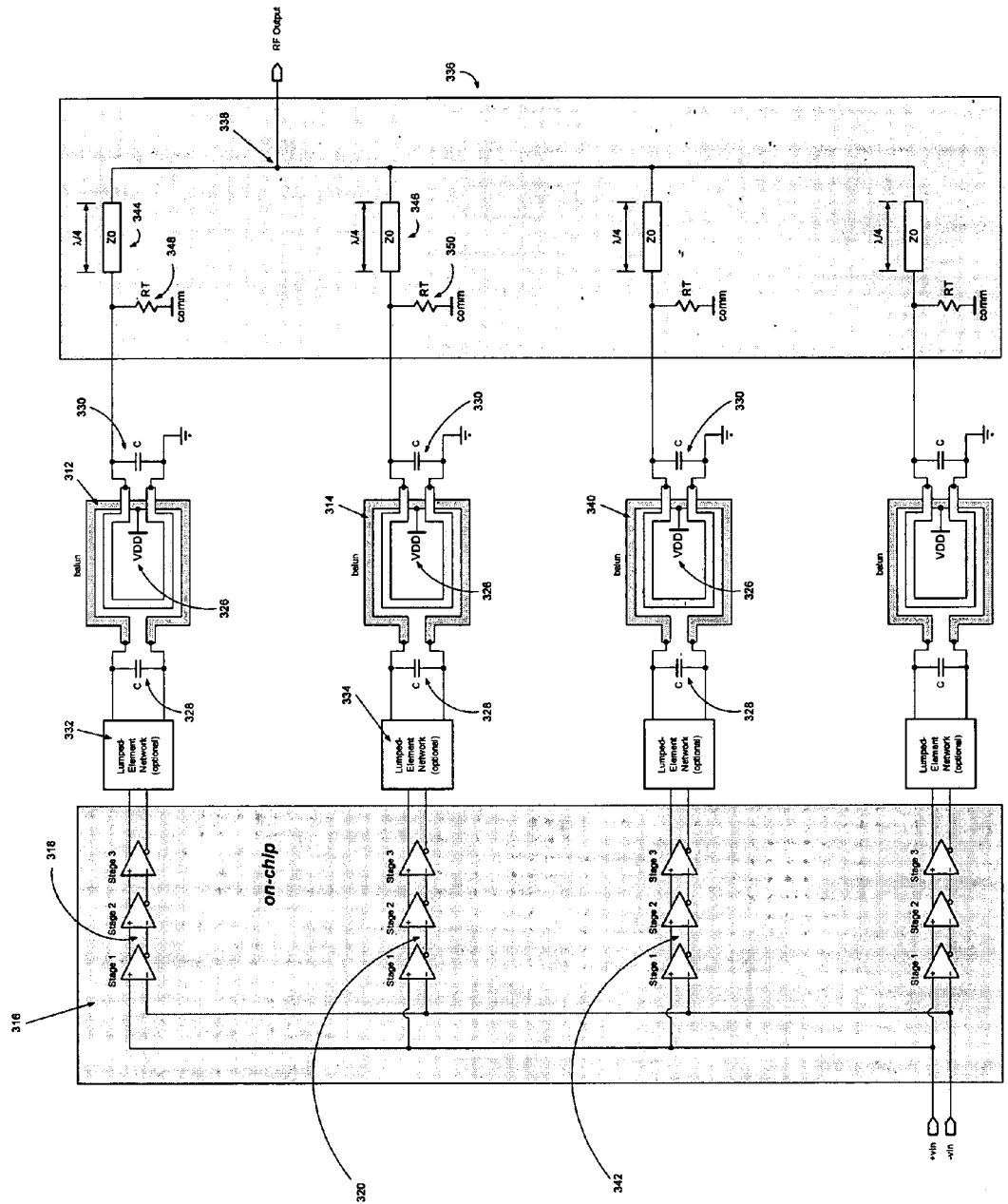
FIG. 17(a) illustrates one embodiment of an amplifier system of the present invention with parallel summation, quarter wavelength transmission lines and imbalance resistors.

In another embodiment of the present invention, as illustrated in FIG. 17(*a*) the amplifier system 310 includes the first balun 312 and the second balun 314. The amplifier assembly 316 is provided and again includes at least the first set of amplifiers 318 in parallel to the second set of amplifiers 320. The first set of amplifiers 318 provides the input to the first balun 312, and the second set of amplifiers 320 provides the input to the second balun 314. The amplifier assembly 316, the first set of amplifiers 318 and the second set of amplifiers 320 can be amplifier 10, as well as any of its embodiments described above. The power combining circuit 336 is also included. In this embodiment, the first and second baluns 312 and 314 are coupled to the common node 338 of the power combining circuit 336 and add in parallel.

In this embodiment, a third balun 340 with an input and an output can also be included. A third set of amplifiers 342, in parallel to the first and second sets of amplifiers 318 and 320, provides the input to the third balun 340. In this embodiment, the first, second and third baluns 312, 314 and 340 are coupled to the common node 338 and add in parallel.

In one embodiment, a first quarter wavelength transmission line 344 and a second quarter wavelength transmission line 346 are provided. At RF and microwave frequencies, the summation of signals can not be done with a wire-or connection, as is common at lower frequencies. As such, RF and microwave summation networks (also known as power combiners) need to utilize quarter wavelength transmission lines to allow for summation to occur without changing the load on each amplifier. If the possibility exists for one or more of the driving source impedances at each input of the power combiner 336 to be different than the other source impedances, imbalance resistors 348 and 354 may be required at each input of the power combiner 336.

Figure 17B:
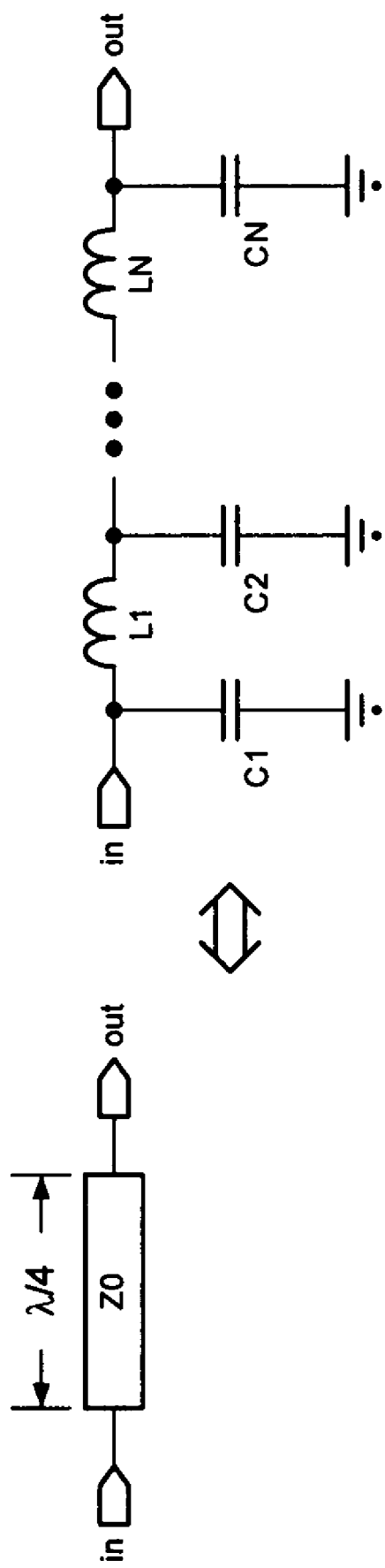
FIG. 17(b) illustrates how the quarter wavelength transmission lines of FIG. 17(a) can be replaced with lumped element circuits.
Figure 19:
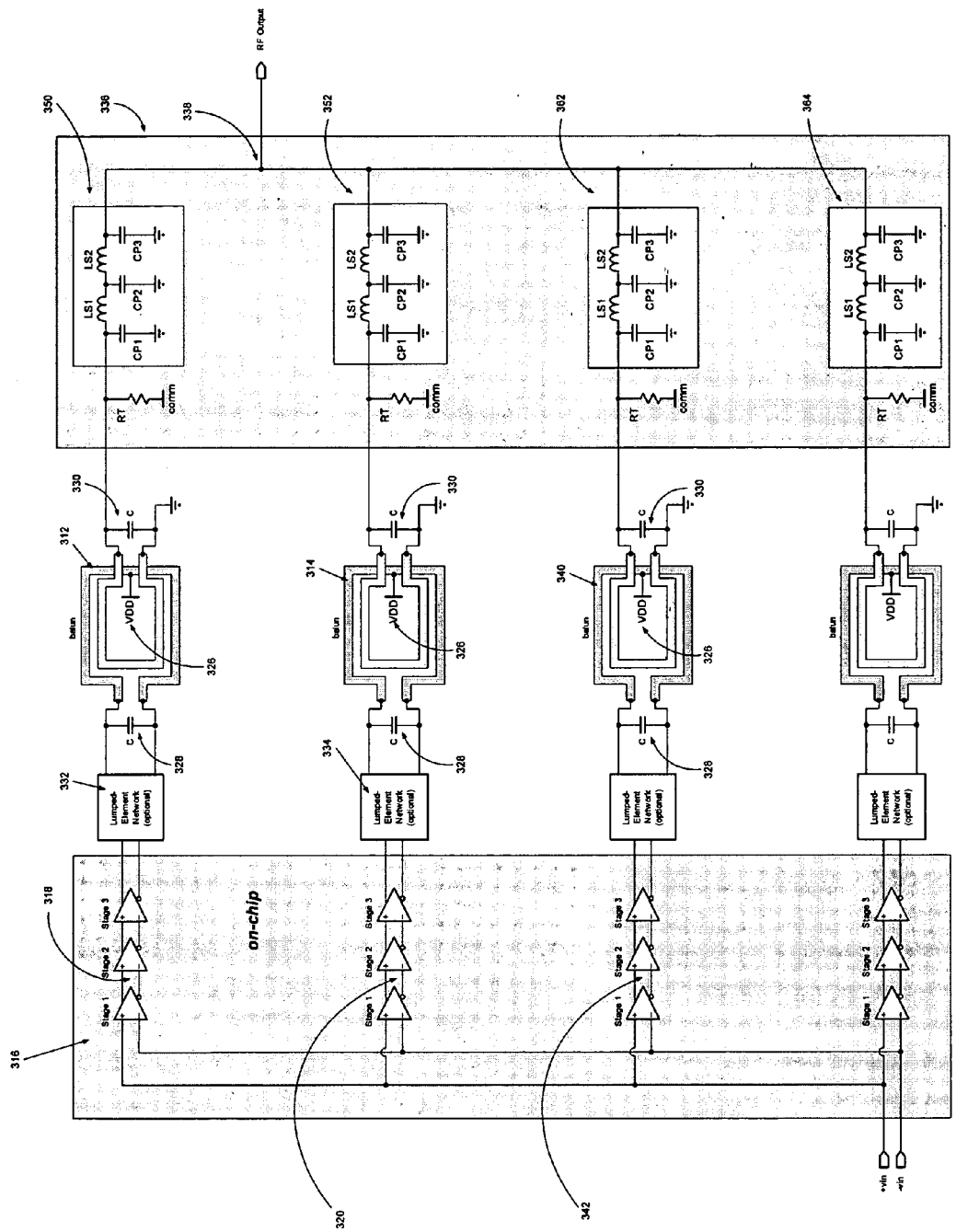
FIG. 19 illustrate an embodiment of an amplifier system of the present invention with lumped element circuits replacing quarter transmission lines.

As shown in FIG. 17(b), the quarter wavelength transmission lines 344 and 346 can be replaced with a lumped element circuit 352 and 350 which are shown in FIG. 19. Each lumped element circuit 352 and 350 consists of a ladder network of inductors and capacitors coupled as shown in FIG. 17(b). There can be one or more inductors and one or more capacitors in each of the lumped element circuits 352 and 350. In general, applications which require greater bandwidth will use more inductors and capacitors within each lumped element circuit, with generally more inductors and more capacitors having greater insertion loss. Although shown in a single ended configuration in FIG. 17(b), a differential configuration can also be used. Generally, each quarter wavelength transmission line 344 and 346 also have a characteristic line impedance. The equivalent lumped element circuit representation can also have this same line impedance, or the line impedance can be made to scale either upward or downward in the lumped element circuit configuration.

In another embodiment, the first lumped element circuit 332 that couples the first set of amplifiers output to the input of the first balun 312, and the second lumped element circuit 334 that couples the second set of amplifiers output to the input of the second balun 314 are provided.

Figure 18A:
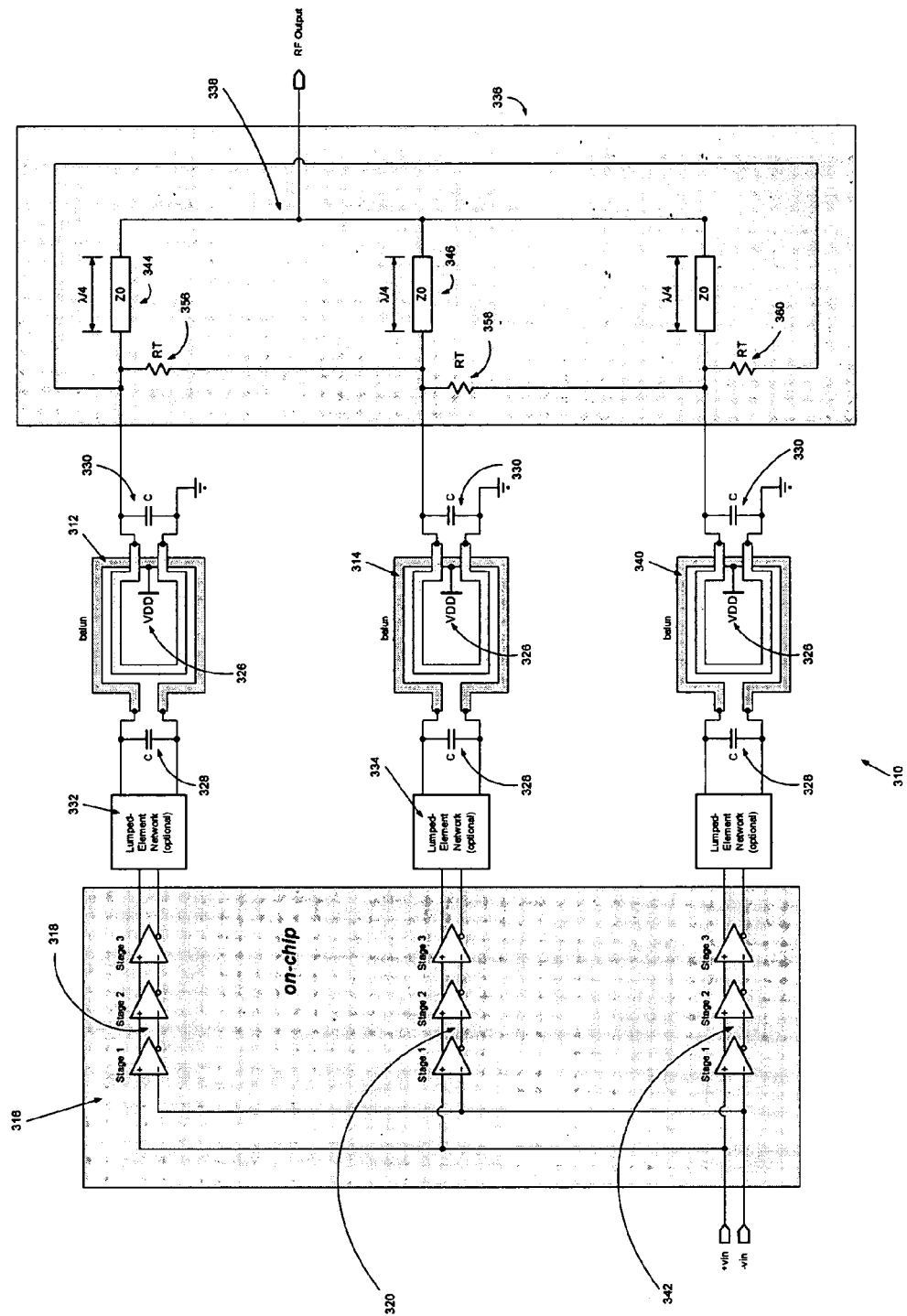
FIGS. 18(a) and 18(b) illustrate embodiments of an amplifier system of the present invention that includes parallel imbalance resistors.
Figure 18B:
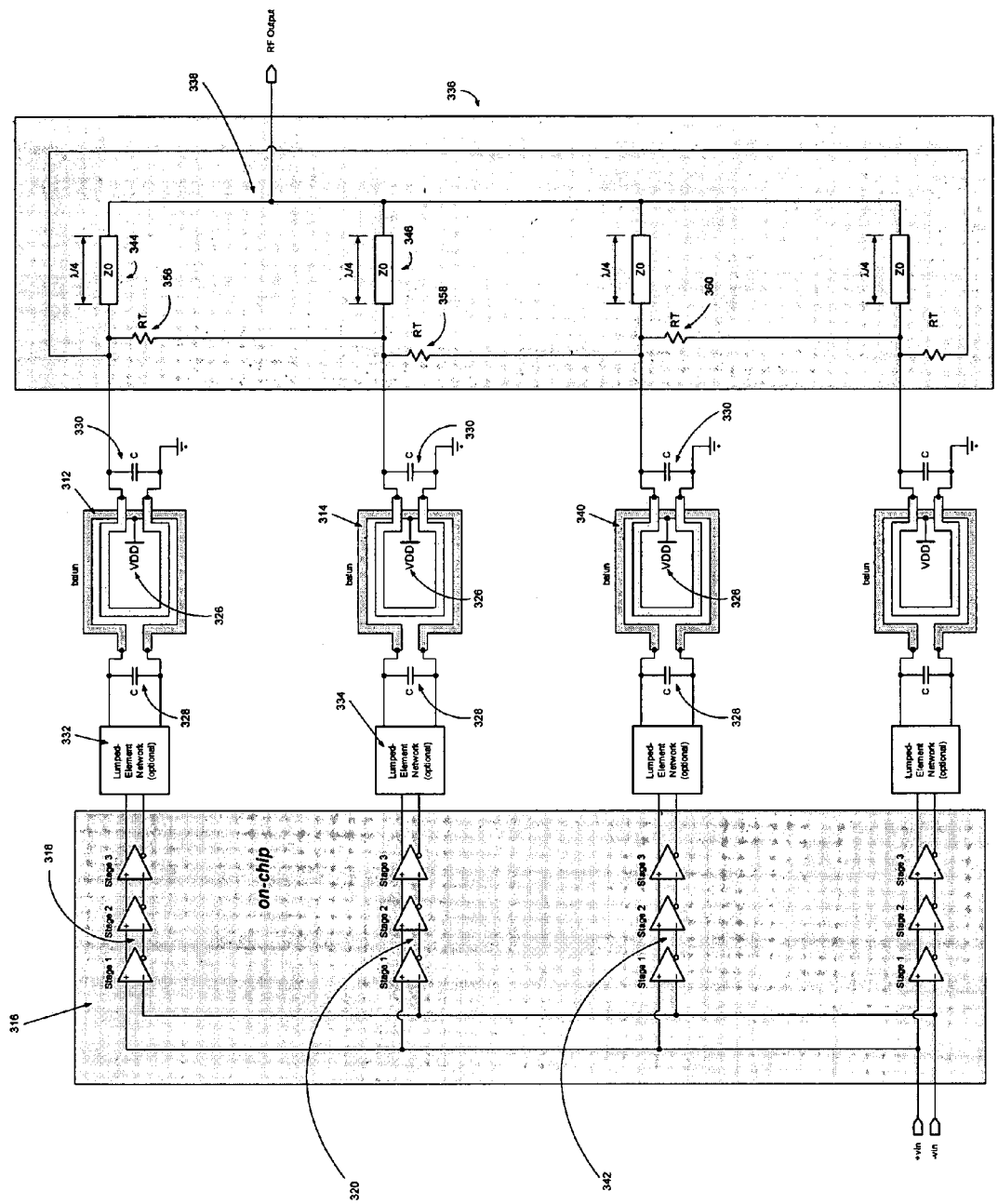

In another embodiment of the present invention, as illustrated in FIGS. 18(a) and 18(b) the amplifier system 310 includes the first balun 312 and the second balun 314. The amplifier assembly 316 is provided and again includes at least the first set of amplifiers 318 in parallel to the second set of amplifiers 320. The first set of amplifiers 318 provides the input to the first balun 312, and the second set of amplifiers 320 provides the input to the second balun 314. The amplifier assembly 316, the first amplifier 318 and the second set of amplifiers 320 can be amplifier 10, as well as any of its embodiments described above. The power combining circuit 336 is also included. In this embodiment, the first and second baluns 312 and 314 are coupled to the common node 338 of the power combining circuit 336. The first imbalance resistor 348 couples the output of the first balun 312 to the output of the second balun 314.

In one embodiment, as shown in FIG. 18(a) the third balun 340 and the third set of amplifiers 342, in parallel to the first and second sets amplifiers 312 and 314 respectively are also included. The first, second and third baluns 312, 314 and 340 are coupled to the common node 338. A first imbalance resistor 356, a second imbalance resistor 358 and a third imbalance resistor 360 are provided. The first imbalance resistor 356 couples the output of the first balun 312 to the output of the second balun 314. The second imbalance resistor 358 couples the output of the second balun 314 to the output of the third balun 340. The third imbalance resistor 360 wraps around and can couple back to the output of the first balun 312. It will be appreciated that more than three baluns can be included in this embodiment, such as 4, 5 and the like, as illustrated in FIG. 18(b). In one embodiment, the first quarter wavelength transmission line 344 and the second quarter wavelength transmission line 346 are provided.

In another embodiment, the first lumped element circuit 332 that couples the first set of amplifiers output to the input of the first balun 312, and the second lumped element circuit 334 that couples the second set of amplifiers output to the input of the second balun 314 are provided.

In another embodiment of the present invention, as illustrated in FIG. 19 the amplifier system 310 includes the first balun 312 and the second balun 314. The embodiment illustrated in FIG. 19 has the lumped element circuits 350, 352, 362 and 364 replace the quarter transmission, as in FIG. 17(b). The FIG. 19 embodiment includes all of the FIG. 17(b) embodiments.

Figure 20:
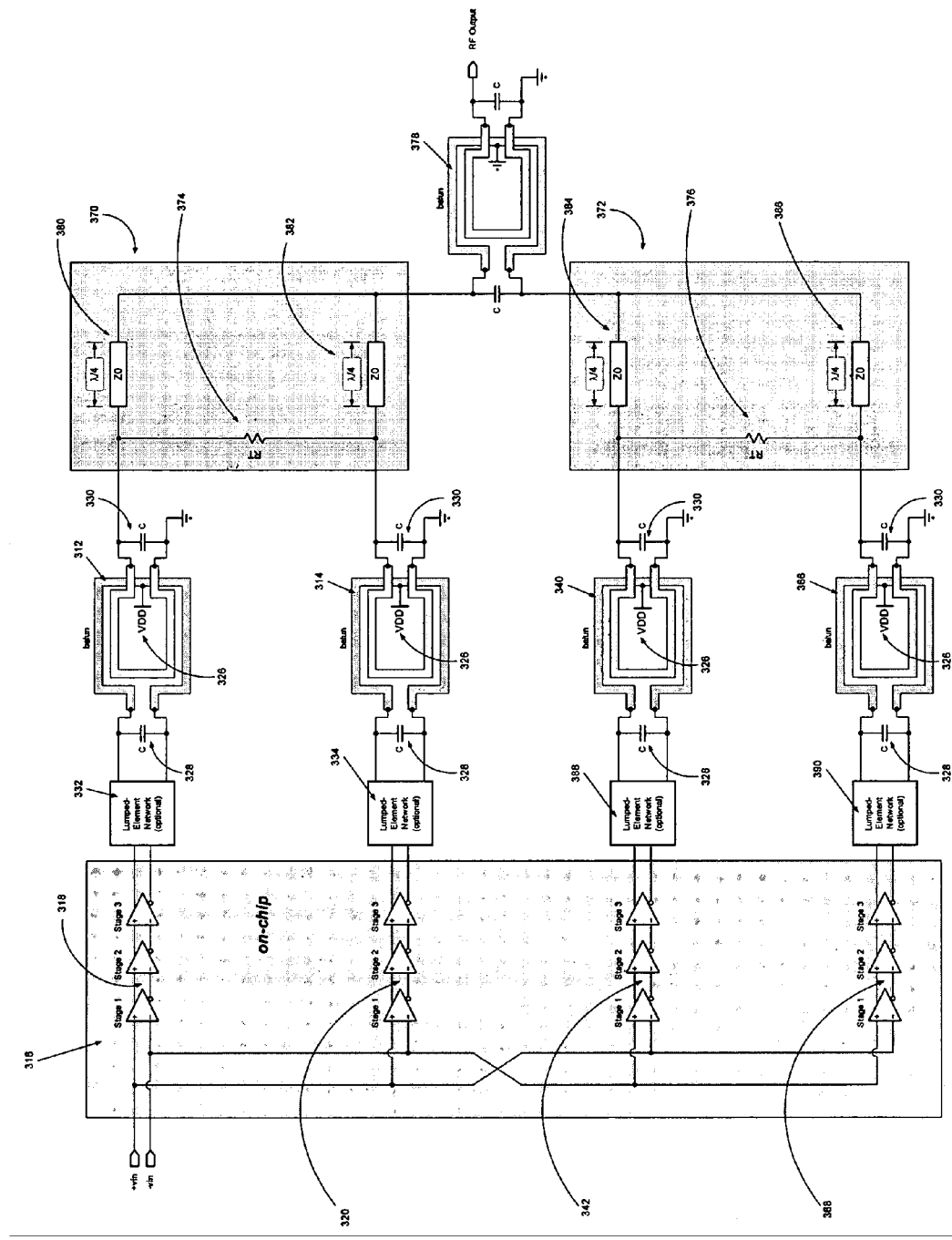
FIG. 20 illustrates one embodiment of an amplifier system of the present invention with parallel combining of balun outputs in groups of two, and with a fifth balun.
Figure 21:
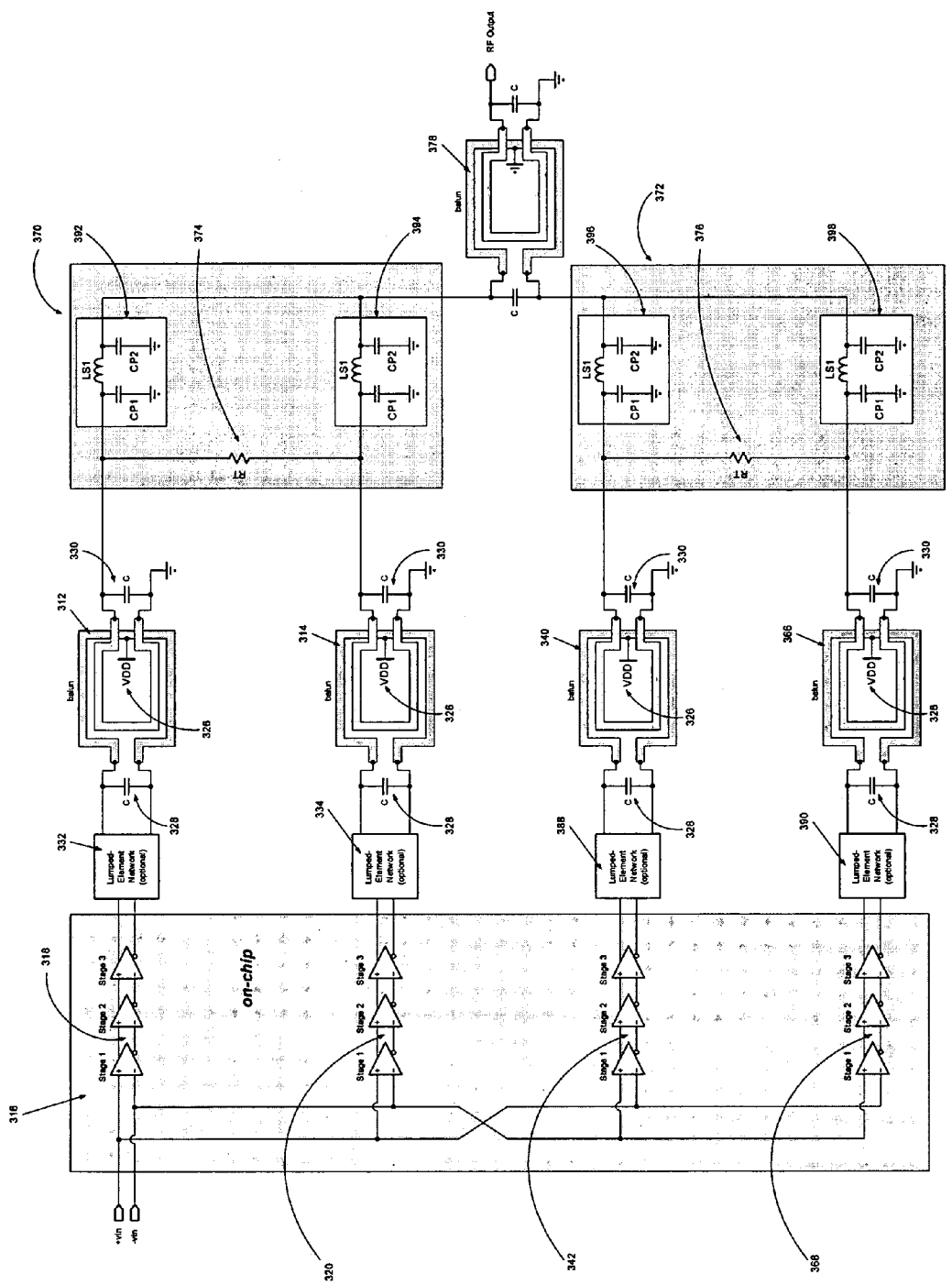
FIG. 21 illustrates one embodiment of an amplifier system of the present invention with imbalance resistors and without connection to common nodes.

In other embodiments of the present invention, illustrated in FIGS. 20 and 21, the amplifier system 310 includes the first balun 312, the second balun 314, the third balun 340 and the fourth balun 366, each with an input and an output. The amplifier assembly 316 includes at least first, second, third and fourth sets of amplifiers 318, 320, 342 and 368 in parallel. The first and second sets of amplifiers 318 and 320 are coupled with their inputs having relative phase of 0 degrees to each other, and substantially 0 degrees relative to the input. The second and third sets of amplifiers 342 and 368 are coupled with their inputs relative 0 degrees to each other but substantially 180 degrees relative to the input signal. Each of the sets of amplifiers 318, 320, 342 and 368 has its input connections to provide for selected phasing.

The first balun 312 and the second balun 314 produce a first set of outputs that are at a relative phase of 0 degrees with respect to each other, and are substantially in the same phase as the input signal. Each of the outputs of the first set of outputs combine constructively together through a power combiner circuit 370. The third balun 340 and the fourth balun 366 produce a second set of outputs that are at a relative phase of 0 degrees with respect to each other, and are substantially out of phase with the input signal. Each of the outputs of the second set of outputs also combine constructively together through a power combiner circuit 372. Within each of the power combiners 370 and 372, imbalance resistors 374 and 376 are utilized to maintain good input match to the output of each amplifier. The combined signals from the first set of outputs and the combined signals from the second set of outputs are combined constructively through a fifth balun 378 to produce a final output signal.

Each of the first, second, third, fourth, and fifth baluns 312, 314, 340, 366 and 378, can have the configurations of the balun 116. The amplifier assembly 316, the first set of amplifiers 318, the second set of amplifiers 320, the third set of amplifiers 342 and the fourth set of amplifiers 368 can be amplifier 10, as well as any of its embodiments described above.

In FIG. 20, quarter wavelength transmission lines 380 382, 384 and 386 are provided, as described above. In FIG. 21, the quarter wavelength transmission lines 380, 382, 384 and 386 are replaced by lumped circuit elements 392, 394, 396 and 398, as described above.

In other embodiments, the first lumped element circuit 332 that couples the first set of amplifiers output to the input of the first balun 312, and the second lumped element circuit 334 that couples the second set of amplifiers output to the input of the second balun 314 are provided for the FIG. 20 and FIG. 21 embodiments. Lumped element circuits 388 and 390 are also included.

Figure 22:
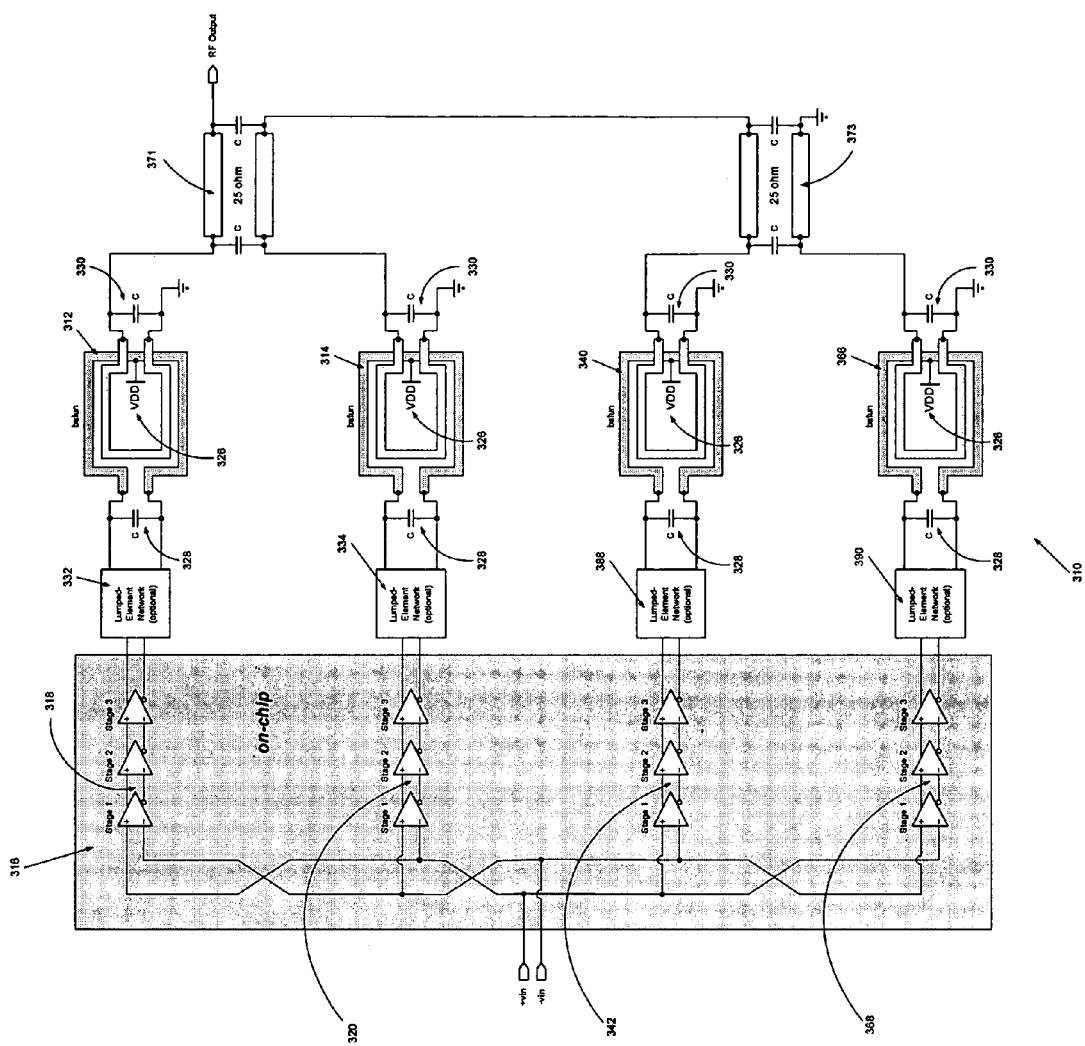
FIG. 22 illustrates one embodiment of an amplifier system of the present invention with a Guanella balun as the final power combining balun.

In another embodiment of the present invention, illustrated in FIG. 22 the amplifier system 310 includes the first balun 312, the second balun 314, the third balun 340 and the fourth balun 366, each with an input and an output. The amplifier assembly 316 includes at least first, second, third and fourth sets of amplifiers 318, 320, 342 and 368 in parallel. The first and third sets of amplifiers 318 and 342 are coupled with their inputs in relative 0 degree phase with the signal input. The second and fourth sets of amplifiers 320 and 368 are coupled with their inputs in relative 180 degree phase with the signal input. Each of the sets of amplifiers 318, 320, 342 and 368 has its input connections to provide for selected phasing.

The first balun 312 and the second balun 314 produce a first set of outputs that are at a relative phase of 180 degrees with respect to each other, and are substantially in the same phase as the input signal. The third balun 340 and the fourth balun 366 produce a second set of outputs that are at a relative phase of 180 degrees with respect to each other. The first set of outputs from baluns 312 and 314, being in relative 180 degree phase, are fed to the input of a first Guanella balun 371. The first Guanella balun 371 is physically shortened by the addition of capacitors at its input and output, and has an overall impedance of 25 ohms. The second set of outputs from baluns 340 and 366, also being in relative 180 degree phase, are fed to the input of a second Guanella balun 373. The second Guanella balun 373 is also physically shortened by the addition of capacitors at its input and output, and has an overall impedance of 25 ohms. The output of second Guanella balun 373 has one terminal grounded and its other terminal is fed to a first terminal of the first Guanella balun 371. The final output for the amplifier assembly 316 is taken from the second terminal of the first Guanella balun 371. The configuration of the first and second Guanella baluns 371 and 373 is such that their outputs add in series.

In other embodiments, lumped element circuits 332, 334, 388 and 390 are provided for the FIG. 22 embodiment.

Figure 23A:
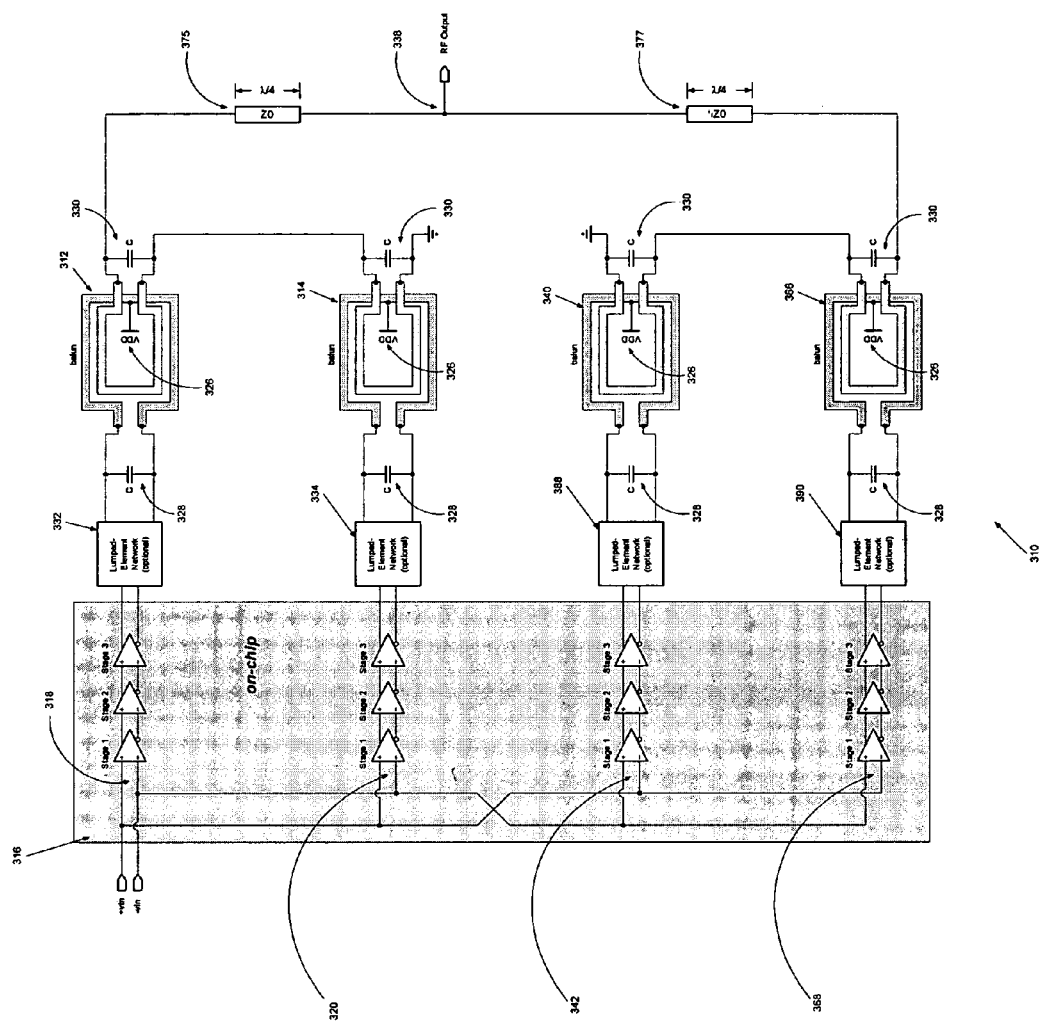
FIG. 23(a) illustrates one embodiment of an amplifier of the present invention, where two sets of amplifiers are combined in series, another two sets of amplifiers are combined in series, and the output of the two sets of amplifiers are combined together in parallel.

In another embodiment of the present invention, illustrated in FIG. 23(a), the amplifier system 310 includes the first balun 312, the second balun 314, the third balun 340 and the fourth balun 366, each with an input and an output. The amplifier assembly 316 includes at least first, second, third and fourth sets of amplifiers 318, 320, 342 and 368 in parallel. The first and second sets of amplifiers 318 and 320 are coupled with their inputs in relative 0 degree phase with the signal input. The third and fourth sets of amplifiers 342 and 368 are coupled with their inputs in relative 0 degree phase with each other, and relative 180 degree phase to the signal input. Each of the sets of amplifiers 318, 320, 342 and 368 has its input connections to provide for selected phasing.

The first balun 312 and the second balun 314 are coupled in series with each other, with the second output terminal of the first balun 312 being coupled to the first output terminal of the second balun 314. The second output terminal of second balun 314 is coupled to ground, and the first output terminal of first balun 312 is coupled to a first quarter wavelength transmission line 375. The third balun 340 and the fourth balun 366 are also coupled in series with each other, with the second output terminal of the third balun 336 being coupled to the first output terminal of the fourth balun 366. The first output terminal of the third balun 340 is coupled to ground, and the second output terminal of fourth balun 366 is coupled to a second quarter wavelength transmission line 375. The second terminals of both quarter wavelength transmission lines 375 and 375 are coupled together to the common RF output node 338.

Figure 23B:
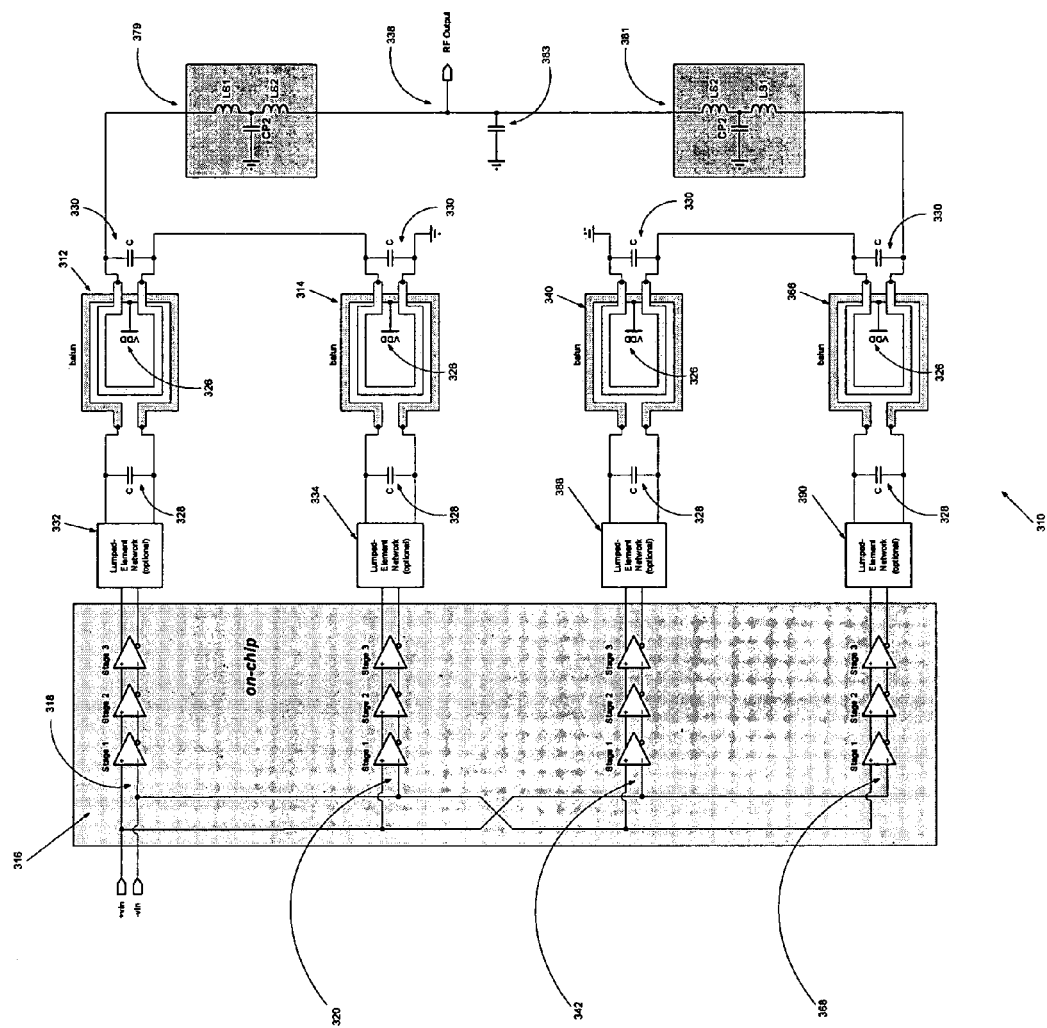
FIG. 23(b) illustrates one embodiment of the FIG. 23(a) amplifier where each quarter wavelength transmission line has been replaced with lumped element circuits.

The embodiment in FIG. 23(b) is identical to the FIG. 23(a) embodiment, except that the first and second quarter wavelength transmission lines 375 and 375 are replaced with the lumped element circuits 379 and 381, respectively. The lumped element circuits 379 and 381 have capacitors at their inputs and outputs. The input capacitors can be combined with the capacitors 330 at the outputs of each of the baluns 312, 314, 340 and 366. The capacitors at the output of the lumped element circuits 379 and 381 can be combined into a single capacitor 383 coupled to the RF output node 338.

In other embodiments, lumped element circuits 332, 334, 388 and 390 are provided for the FIGS. 23(a) and 23(b) embodiments.

Applications of the amplifiers 10, 310, as well as their embodiments, that pertain to cellular phone systems generally require operation over a number of overall frequency bands. Transmit and receive frequencies for GSM are listed in Table 1.

TABLE 1

Receive and Transmit Bands for GSM

GSM850 band (US)

Tx: 824 MHz to 849 MHz
Rx: 869 MHz to 894 MHz
GSM900 band (Primary GSM900 band, P-GSM)

Tx: 890 MHz to 915 MHz
Rx: 935 MHz to 960 MHz
E-GSM band (Extended GSM900 band, includes P-GSM)
DCS1800 band Tx: 1710 MHz to 1785 MHz
Rx: 1805 MHz to 1880 MHz
PCS1900 band (US)

Tx: 1850 MHz to 1910 MHz
Rx: 1930 MHz to 1990 MHz

When the amplifiers 10 and 310 operate in either the 824-849 MHz band, the 890-915 MHz band, or both, the amplifiers 10 and 310 are said to be operating in the low-band mode. When the amplifiers 10 and 310 operate in either the 1710-1785 MHz band, the 1850-1910 MHz band, or both, the amplifiers 10 and 310 are said to be operating in the high-band mode.

Figure 24:
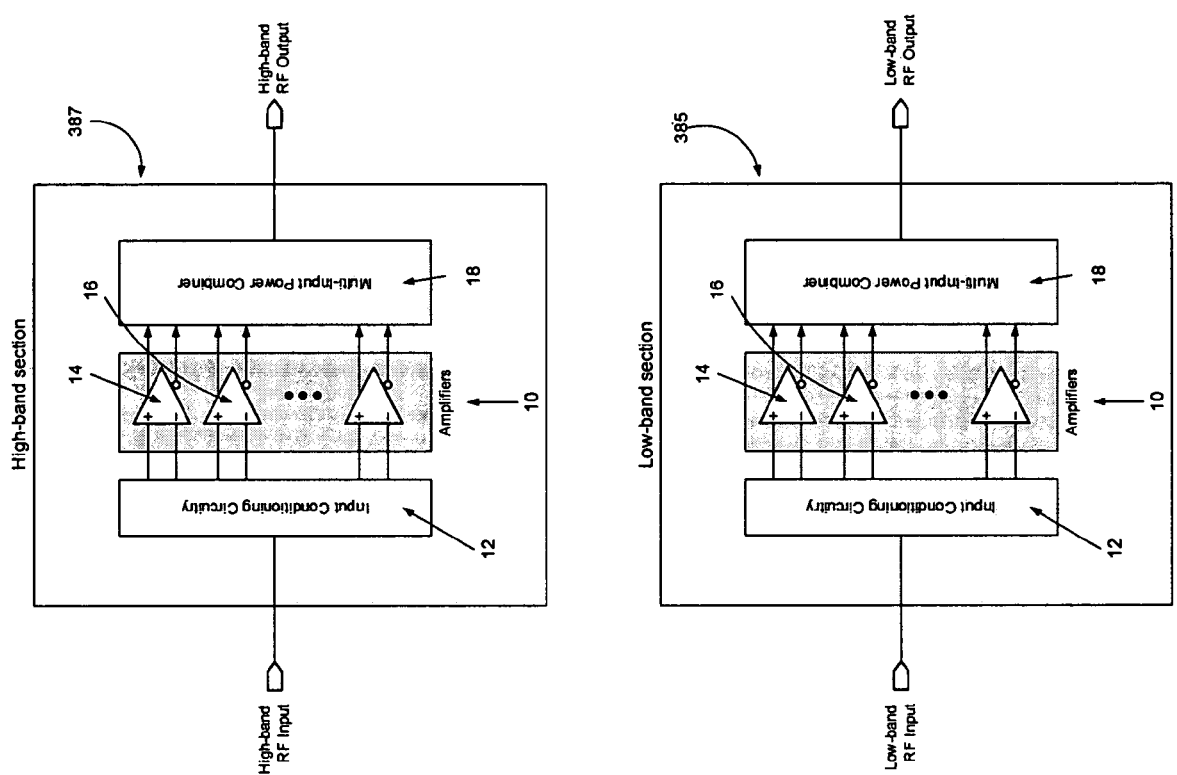
FIG. 24 illustrates an embodiment of an amplifier system of the present invention with one amplifier for the low band and one for the high band.

FIG. 24 illustrates an embodiment of the present invention with high-band and low-band power amplifier assemblies, generally denoted as 385 and 387. Power amplifier assemblies include the elements from FIG. 1 above. As shown in FIG. 24, each set of bands, either low-band or high-band, requires a separate power amplifier assemblies 385 and 387, one for each band. Most cell phone power amplifiers have separate inputs for each of the bands, and most cell phone power amplifiers are designed with two separate power amplifier assemblies, one for the low-band and one for the high-band.

In one embodiment of the present invention, the same power amplifier assembly 10 and 310 can operate at both low-band and high-band modes. This can be done either by making the power amplifier assembly 10 and 310 itself very wideband such that it has a single RF input and a single RF output, as shown in FIG. 25(a).

Figure 25A:
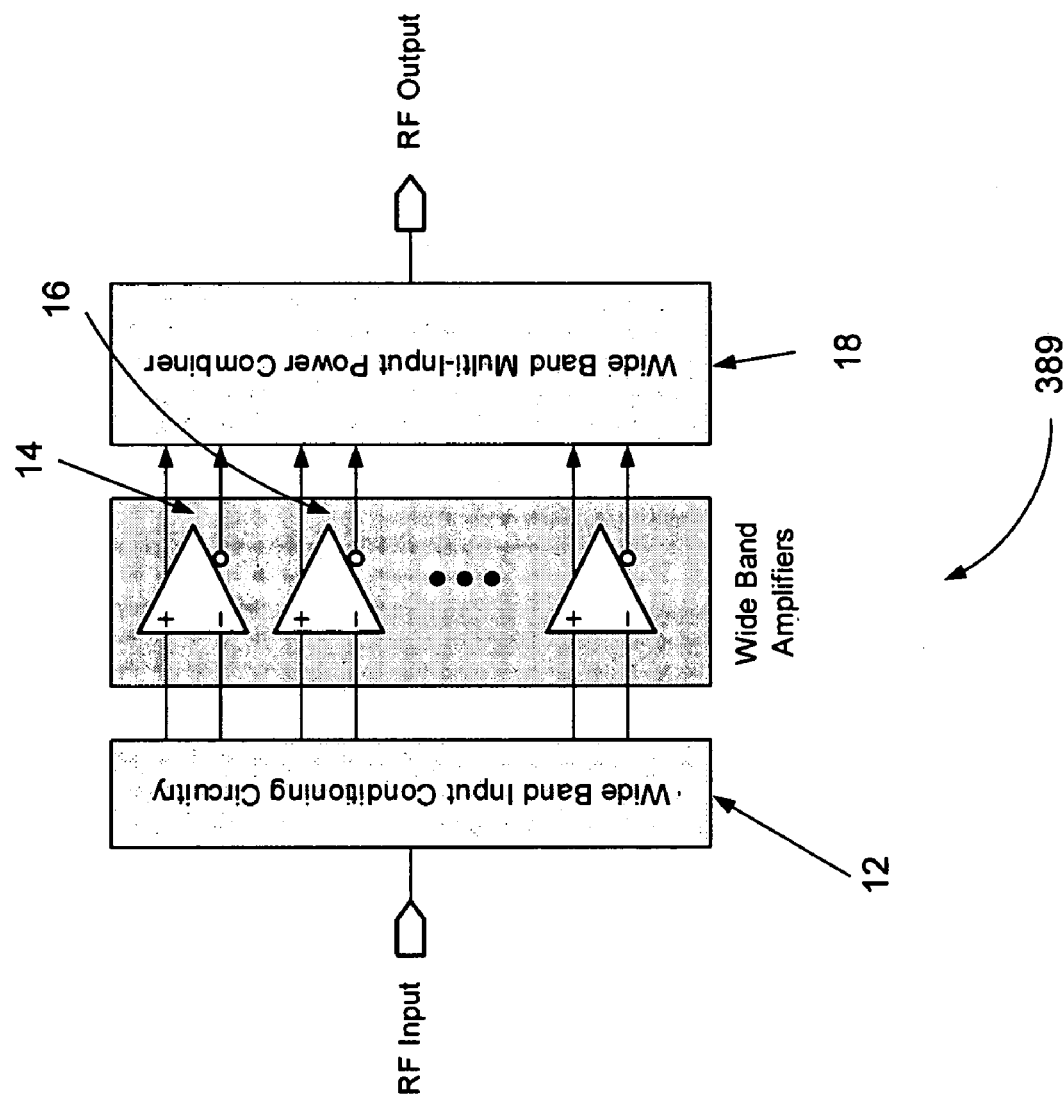
FIGS. 25(a), 25(b) and 25(c) illustrate embodiments of the present invention with high and low band amplifiers combined into a single unit.
Figure 25B:
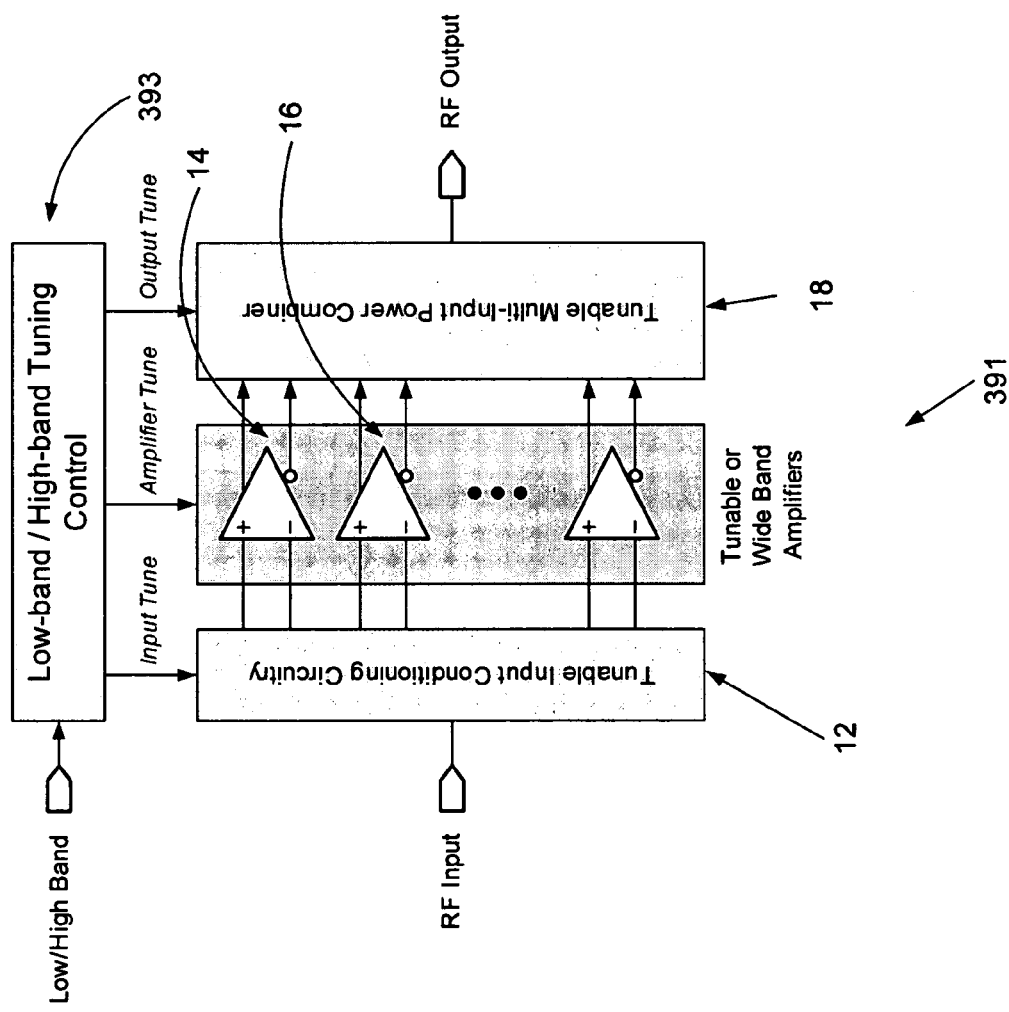
Figure 25C:
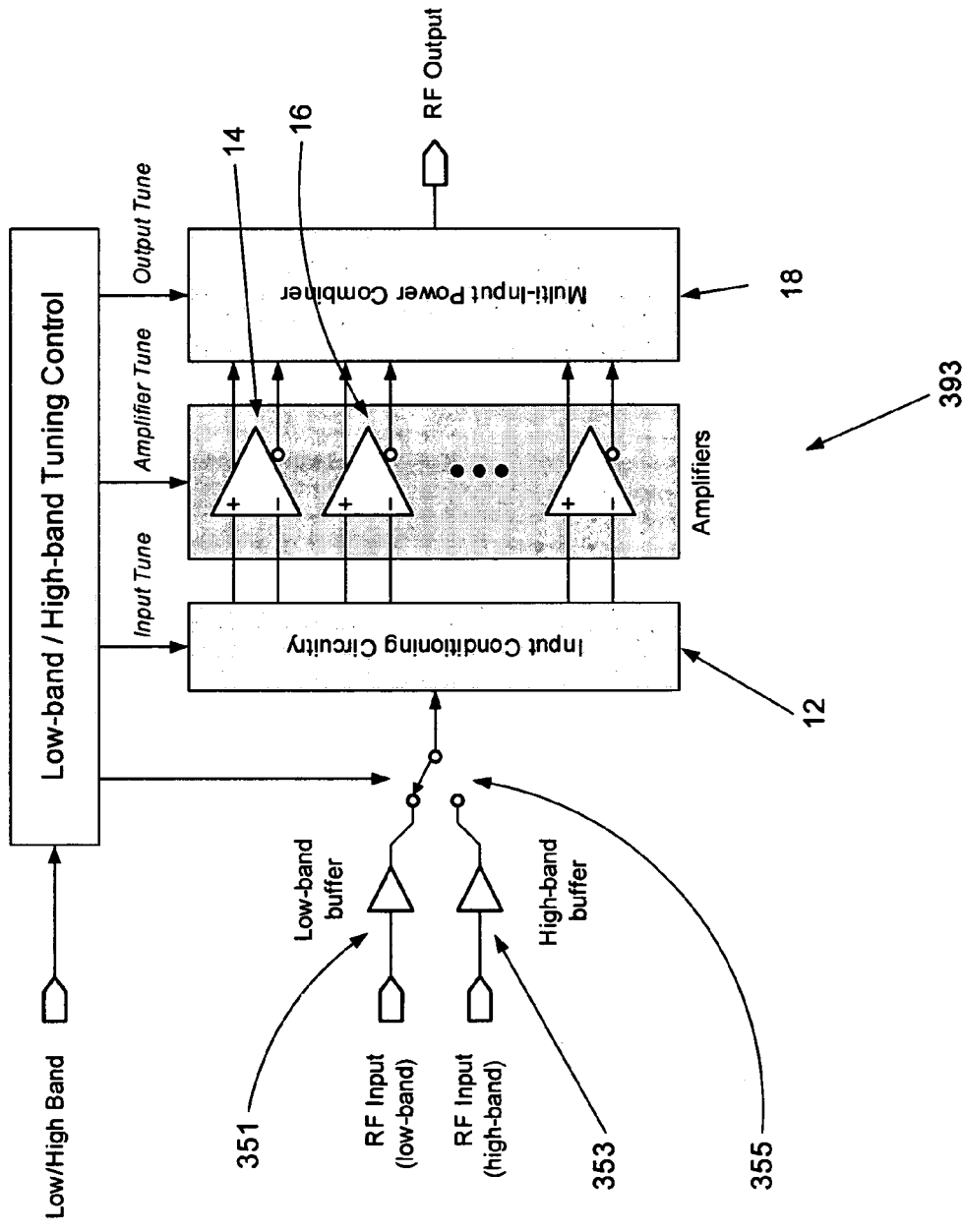

However, due to the need to maintain high power and high efficiency, it may be necessary to tune the power amplifier assemblies 10 and 310, separately for each band, as shown in FIG. 25(b). This can be done by making the input conditioning circuitry 12, the power amplifier assemblies 10 and 310, or the multi-input output power combiner 18, either some or all, tunable. As mentioned before, the prior art uses separate inputs to the power amplifier, one for each band. Therefore, it may be necessary for the broadband power amplifier to employ separate buffer amplifiers to be able to load existing cell phone transceivers with individual buffers for each band. This is shown in FIG. 25(c).

As shown in FIG. 25(a), a combined low-band/high-band power amplifier assembly 389 has wide-band operation with single input, single output or operation to two bands at the same time. In FIG. 25(b), the power amplifier assembly 391 is a combined low-band/high-band power amplifier with a single input and single output. A low-band/high-band tuning control 393 is provided. One embodiment of the FIG. 25(b) power amplifier assembly 391, can be designed such that the input conditioning circuitry 12 and/or the multi-input output power combiner 18, are tunable while the amplifiers 14, 16, etc, can be broadband. In the FIG. 25(c) embodiment, the power amplifier assembly 393 is a combined low-band/high-band power amplifier with individual inputs and a single output. FIG. 25(c) is identical to the FIG. 25(b) embodiment except with the addition of a low-band buffer 351 and a high-band buffer 353, and an signal band select switch 355. This provides two separate inputs, for use with present generation transceivers, resulting in minimal change to the overall power amplifier assembly 393 configuration.

In applications such as GSM cellular phone power amplifiers, there is a need within the cellular system to transmit at different power levels. Generally, this is achieved by varying the output power from the power amplifier assemblies 10, 310, 389, 391 and 393. Applications such as GSM use constant envelope waveforms, wherein the transmitted power throughout the packet remains at a fixed level. An advantage of constant envelope systems is that they allow the use of switching amplifiers. Switching amplifiers can operate in a highly non-linear, high efficiency mode. Output power can be varied in a switching amplifier by simply varying the power supply voltage across the last amplifier in a set of amplifiers. In all the embodiments described herein, output power can be adjusted by varying the power supply voltage on the last amplifier of set of amplifiers 316, 320, 342 and 368, each parallel section of amplifiers, see FIGS. 26(a), (b), (c), (d) and (e). As the power supply voltage is reduced on the last amplifier, output power drops. In general, output power follows the following formula:

$$P_{out} = A*(VDD-VOFF)**2$$

wherein VDD is the power supply voltage of the last amplifier, A is a constant and VOFF is another constant, generally a small offset voltage. As the formula states, the output power generally follows a square-law behavior, as a function of VDD. In most cases, an input power control signal, called VRAMP, as shown in FIGS. 26(a) through (e) and FIG. 27, is used to set the desired output power.

Figure 26A:
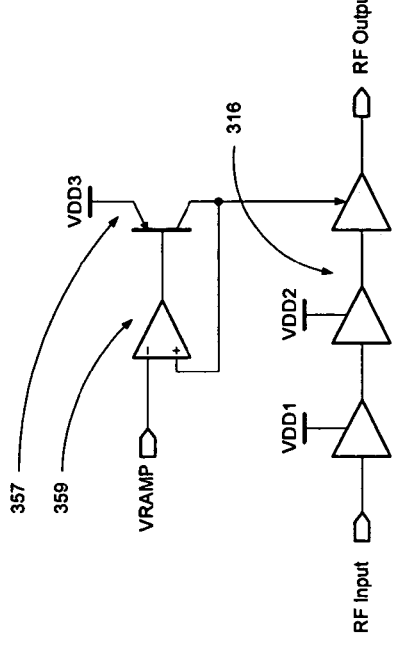
FIGS. 26(a), 26(b), 26(c), 26(d) and 26(e) illustrate that output power of amplifier systems of the present invention can be adjusted by varying the power supply voltage on the last amplifier in set of amplifiers.
Figure 26B:
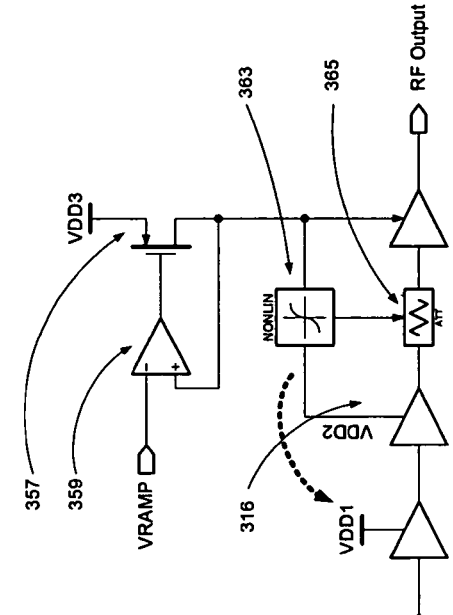
Figure 26C:
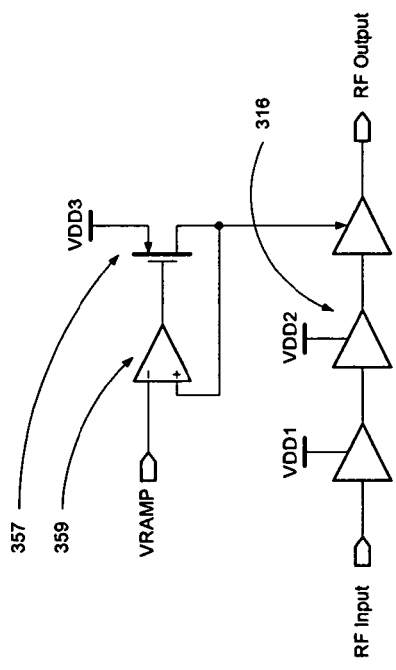

Referring to FIGS. 26(a) and 26(b), either an off-chip series voltage regulation device 357 or PNP transistor 357 can be used in conjunction with an opamp 359 to set the VDD voltage to its desired level, as per the VRAMP. In the configurations of FIGS. 26(a) through 26(d), the opamp 359 is coupled in a voltage follower configuration, where the VDD voltage across the last amplifier in a series of amplifiers 316 is identical to the VRAMP. In the case of a CMOS power amplifier, the series voltage regulation device can be either on or off chip. For some IC processes, on-chip series voltage regulation devices can suffer voltage breakdown at commonly used battery voltages. To prevent this, a cascode connected series voltage regulation device arrangement 361 can be used, as shown in the FIG. 26(c). As in the case of FIG. 26(a) where a single series voltage regulation device is used, the cascode connected series voltage regulation devices 357 and 361 can be located either on or off chip. In addition to the breakdown limits of the drain source terminals of each device in the cascode configuration, it is often desirable to limit the gate source voltage swings to reduce time-dependent dielectric breakdown. This can be achieved by limiting the gate source voltage applied to all series voltage regulation devices 357 referred to in FIGS. 26(a) through 26(e) and FIG. 27. Additionally, the gate bias voltage 341 to the cascode device needs to be configured to allow for proper operation of the cascode as well as to prevent gate source time-dependent dielectric breakdown.

Figure 26D:
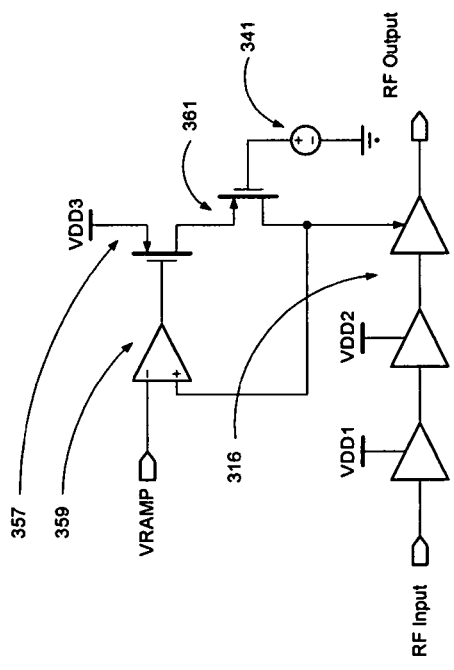
Figure 26E:
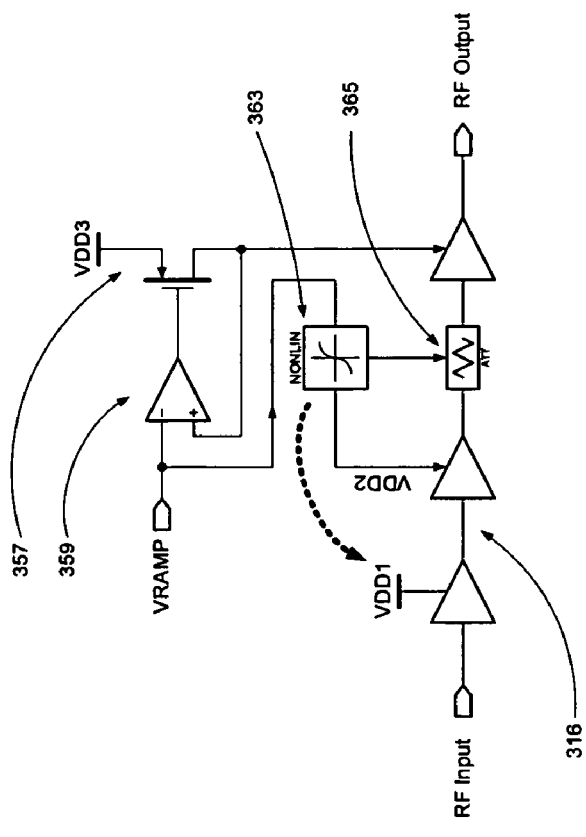

It is often the case that reducing the VDD of the last amplifier is insufficient to reduce the output power to zero, due to leakage through the last amplifier in the sets of amplifiers 316, 320, 342 and 368. Therefore, it is often necessary to control the VDD at the first amplifier, the second amplifier, or both, as shown in FIGS. 26(a) through 26(e) and FIG. 27. Additionally, it may also be necessary to reduce the power level into the last amplifier, as illustrated in FIGS. 26(d) and 26(e). When VDD at one or both of the first two amplifiers is reduced, in addition to the already mentioned reduction in VDD of the last amplifier, the power at the output of the last amplifier can be made sufficiently low. Generally, the control of VDD1, VDD2 or both, may optimally follow a non-linear behavior. This is required to meet either efficiency, power spectral density or transfer function specifications or any or all of the above. Therefore, a non-linear transfer function element 363 can be used to drive VDD2, as shown in FIGS. 26(d) and 26(e). In FIG. 26(d) this non-linear transfer function element 363 can take its input from VDD3. However, because VDD3 is identical, by the action of the voltage follower opamp 359 and series voltage regulation device 357, the input to the non-linear transfer function element 363 can alternatively be coupled to VRAMP, as shown in FIG. 26(e). Note that FIGS. 26(d) and 26(e) show only VDD2 being controlled by the non-linear transfer function element 363. However, it can be advantageous to also control VDD1 with the non-linear transfer function element 363.

FIGS. 26(d) and 26(e) show the use of an attenuator 365 at the input of the last amplifier. Generally, the control input for the attenuator 365 is non-linear and can be derived from an output from the non-linear transfer function element 363.

The attenuator 365 can be adjusted simultaneously in conjunction with adjustments to VDD1, VDD2, both or only one.

In some embodiments of the present invention, it can be desirable for the power supply voltages to each amplifier not to directly follow VRAMP. For example, the power supply voltages might remain at zero for VRAMP voltages below a certain threshold voltage. It may also be desirable for the power supply voltages to limit in the case when VRAMP exceeds a certain upper threshold. A limiting circuit 343 can be used to limit the input voltage to the opamp 359. The transfer function for the opamp 359 and the series voltage regulation device 357 circuitry can be designed to follow a different transfer function, of VDD3 verses VRAMP, by the inclusion of the resistors 367 and 369 as well as the voltage reference 345, the combination resulting in a different gain and offset.

As previously mentioned, the output power of the power amplifier assemblies 10, 310, 389, 391 and 393 can be controlled by varying the power supply voltage one or more of the amplifiers within each set of amplifiers 316, 320, etc. The power supply voltage across the final amplifier, VDD3, in a set of amplifiers 316, etc., has the most direct effect on output power. If the voltage to the VDD3 can be derived from a nearly ideal DC-to-DC converter, the efficiency of the power amplifier assembly 10, etc., can remain high at all VDD3 values, and hence all output power levels. However, there are a number of drawbacks to using a DC-to-DC converter, as shown in FIG. 28(*a*). These drawbacks include, large physical size and high cost (both primarily due to the energy storage inductor), generation of spurious noise at the switching frequency of the DC-to-DC converter, which can corrupt RF signals within the power amplifier assembly 10, etc., thus causing failure in testing and type approval. An additional disadvantage of the DC-to-DC converter is the fact that these converters have generally poor transient input performance, specifically fast changes in VRAMP do not always result in equally fast changes in VDD3. Essentially, the switching converter is too slow for modern digital modulation applications.

One way to avoid the limitations is to replace the DC-to-DC with a variable resistor controlled by the VRAMP, as shown in FIG. 28(*b*). This approach has the advantages of simplicity, small size (on-chip integration) and fast operation. Generally, such variable resistors can be realized with series voltage regulation devices or PNP transistors which are controlled by the VRAMP, as shown in FIG. 28(*c*). While this approach offers advantages over the DC-to-DC converter, it does suffer from significant poorer efficiency.

Figure 29:
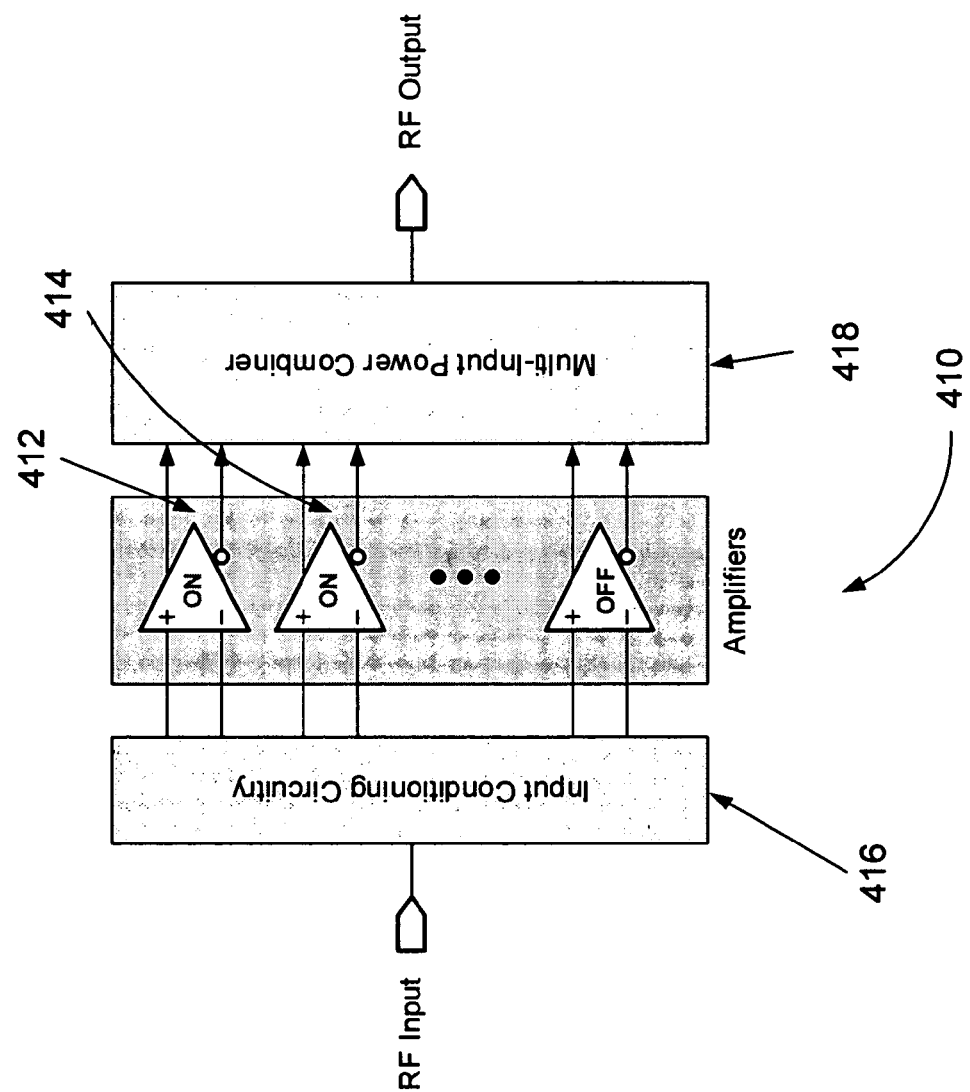
FIG. 29 illustrates one embodiment of a power amplifier assembly of the present invention with two or more switchable amplifiers that are independently switchable on and off while retaining the same analog pass transistor transfer function.

In one embodiment of the present invention, illustrated in FIG. 29, a power amplifier assembly 410 has two or more switchable amplifiers 412, 414, etc., an input conditioning circuit 416 and a multi-input output power combiner 418, all of which can be the same as the elements in FIG. 1 above. In this embodiment, each of the amplifiers 412, etc., are independently switchable on and off while retaining the same analog pass transistor transfer function which is function of VRAMP as described above in FIGS. 26(*a*) through 26(*e*) and FIG. 27. Such a switchable power amplifier can be referred to as a "segmented" power amplifier. In this embodiment, only the amplifier 412, etc., required for the maximum desired output power are turned on. Each amplifier 412, etc., can be turned off individually. All or some of the amplifiers 412, etc., can be turned on or off. RF output-power of the system 410 can be reduced by lowering the VDD on one or more of the amplifiers 412, etc. A reduction of the VDD can be done simultaneously on all amplifiers 412, etc. A reduction of VDD can be done independently with one or more of the amplifiers 412, etc. RF output power is reduced by lowering the VDD on one or more of the amplifiers 412, etc. Only enough amplifiers 412, etc., are turned on in order to meet the expected maximum RF power output level. This keeps PAE high at lower power levels and greatly reduces average power taken from the power supply, and hence extends battery life, as illustrated in FIG. 30(*a*).

FIG. 30(*a*) illustrates that without the segmentation of the present invention, the efficiency of a power amplifier decreases as the output power is decreased. This is a result of the fact that the DC current slowly decreases as VDD is decreased. Therefore, as more voltage is dropped across the series voltage regulation device, thus lowering output RF power, wasted power is dissipated in the series voltage regulation device. This effect is most pronounced at mid to low power levels. The end result is that efficiency at the mid to low power levels is generally very poor. This is significant in that most phone calls are not made at maximum RF output power, therefore, the power amplifier assembly most often runs at greatly reduced efficiency. With the use of segmentation of the present invention, the number of different amplifiers keeps the PAE high down to lower power levels. Any number of amplifiers 412, etc., can be utilized, with more amplifiers 412, etc., result in better efficiency at lower power levels. However, large numbers of parallel amplifiers require large numbers of parallel baluns, thus creating a upper limit in the number of parallel amplifiers 412, etc., in practical applications. In one embodiment, there are 4 to 8 amplifiers used in power amplifier assembly 410.

Figure 33:
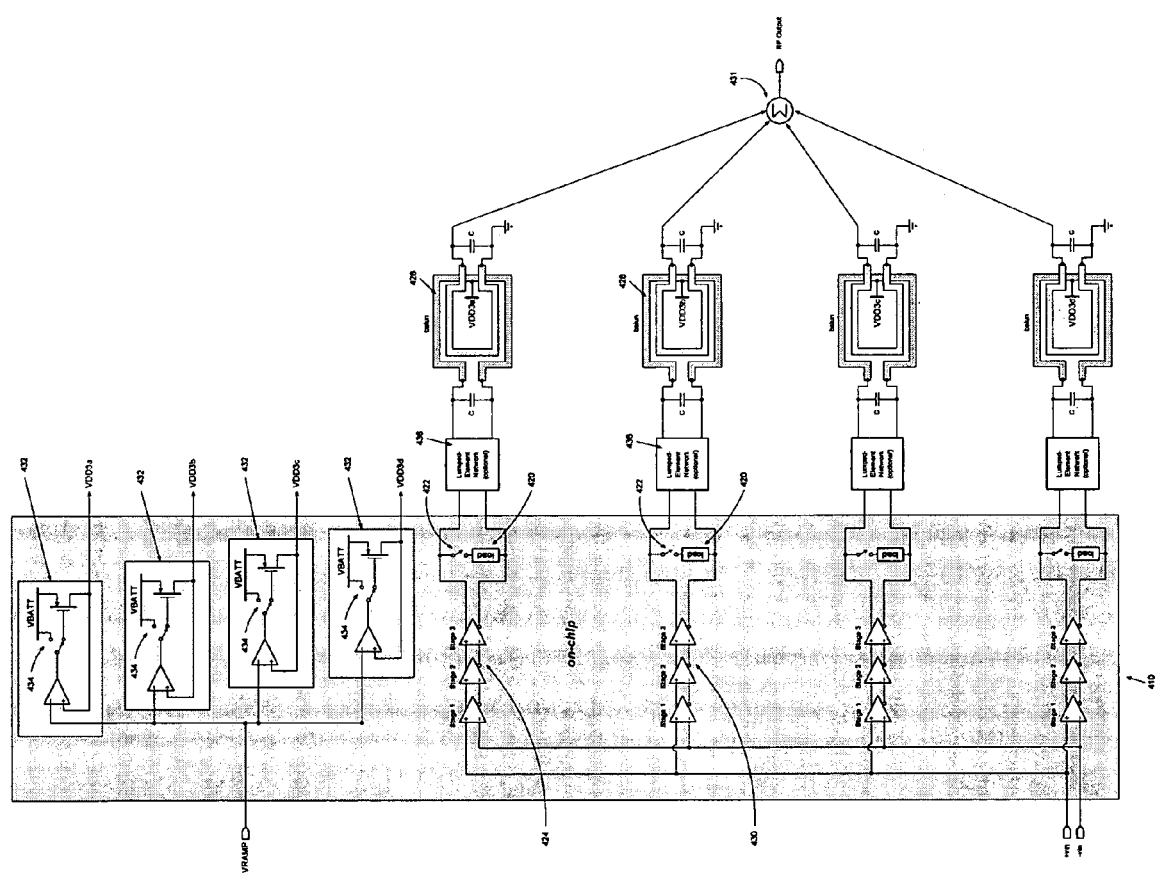
FIG. 33 illustrates an embodiment of FIG. 29 with baluns, multiple sets of amplifiers and with all outputs combined in parallel by a parallel power combining circuit.

FIG. 30(*b*) is a efficiency curve comparing different embodiments of the FIG. 33 power amplifier 410 of the present invention to a power amplifier without segmentation. The curve compares, a power amplifier assembly 410, similar to the FIG. 33 embodiment with four sets of amplifiers that have uniform output powers, a power amplifier assembly 410 similar to the FIG. 33 embodiment with four sets of segmented amplifiers that have non-uniform output powers, a power amplifier similar to the FIG. 33 embodiment with 16 sets of amplifiers that are uniform, to a power amplifier without segmentation.

Figure 27:
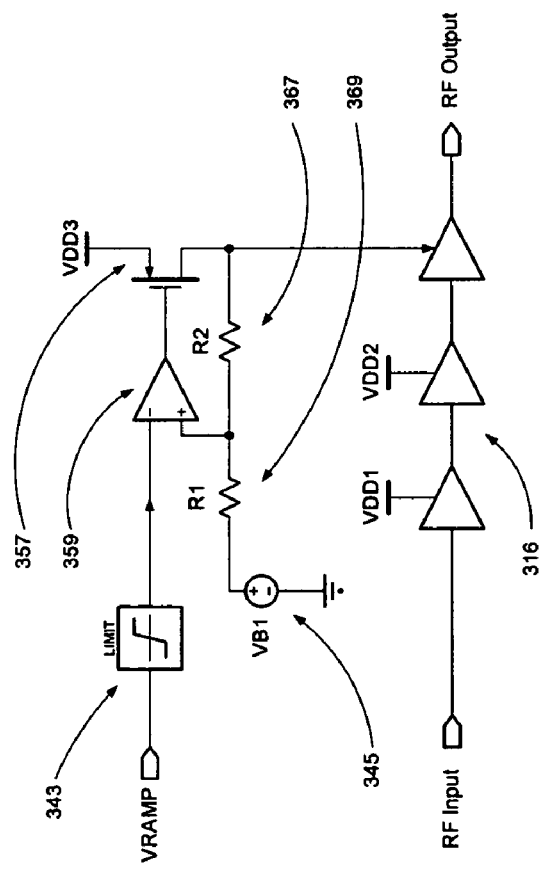
FIG. 27 illustrates non-unity VRAMP can be used to set the desired output power for the amplifier systems of the present invention.

In the FIG. 29 embodiment, amplitude control can be accomplished by both an input ramp voltage that controls VDD, as described in FIGS. 26(*a*) through 26(*e*) and FIG. 27, and by a set of input bits that control segmentation (specifically these bits are used to turn the amplifiers 412, etc., on and off). VDD control can affect only the amplifier in a set of amplifiers, or more usually all of the amplifiers in a set of amplifiers, as illustrated hereafter. VDD control signals to the first amplifiers in a set of amplifiers need not be linear, and can be adjusted so that maximum efficiency is achieved or so that the amplifier meets power spectral density requirements, or so that the amplifier As shown in FIGS. 31(*a*) and 31(*b*), the outputs of the amplifiers 412, 414, etc., can add constructively and substantially in series, constructively and substantially in parallel, or a combination of both. In embodiments of the present invention where both series and parallel summation occurs, the parallel summation can occur first, followed by series summation, or the series summation can occur first followed by the parallel summation. The multi-input output power combining circuit 418 with input ports, and the outputs of the amplifiers 412, etc., is designed to provide that each output of the amplifiers 412, etc., add constructively to produce the desired RF output.

Figure 32A:
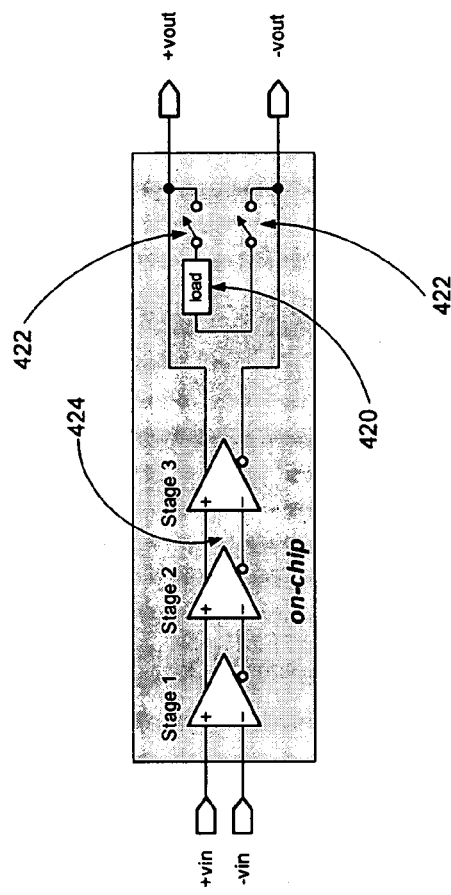
FIG. 32(a) is an embodiment of FIG. 29 with a set of amplifiers and an equivalent load impedance is switched across the output of the off amplifiers, in a parallel embodiment.
Figure 32B:
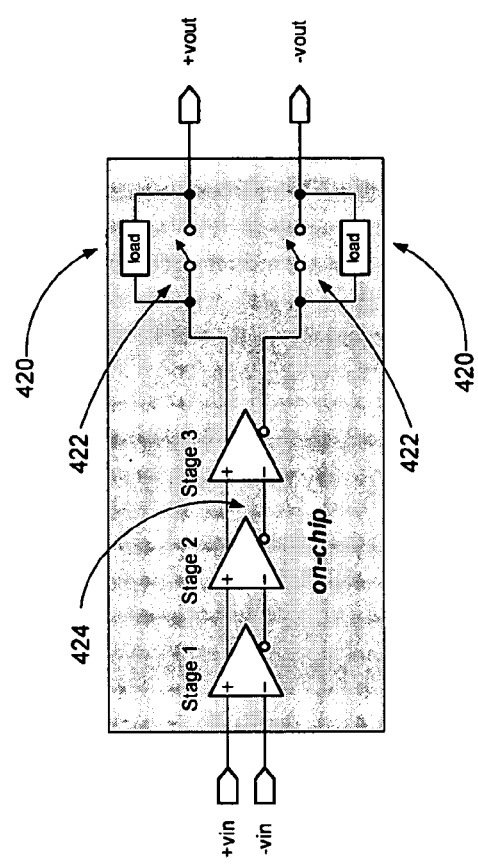
FIG. 32(b) is an embodiment of FIG. 29 with a set of amplifiers and an equivalent load impedance is switched across the output of the off amplifiers, in a series embodiment.

When an amplifier 412, etc., is turned off, it may be the case that the output impedance of this amplifier is no longer the same as when the amplifier was turned on. If the output impedance when off is significantly different than when the amplifier is turned on, this can effect the load impedance seen by all other amplifiers 412, etc., that remain on (due to non-infinite isolation at the inputs of the multi-input output power combiner 418). This can lead to non-optimal load impedance for best efficiency and highest output power on the amplifiers 412, etc., that remain on. To maintain the desired load impedance on all amplifiers 412, etc., an equivalent load impedance can be switched across the output of the off amplifiers 412, etc., as shown in FIGS. 32(a) and 32(b). FIG. 32(a) illustrates a parallel embodiment, and FIG. 32(b) illustrates a series embodiment. In the FIGS. 32(a) and 32(b) embodiments, a load impedance element 420 and first and second sets of load switches 422 are provided. In the FIGS. 32(a) and 32(b) embodiments, a first set of amplifiers 424, which includes amplifier 412, is provided. In the case of the parallel switch load, two load switches 422 are shown, resulting in excellent symmetry at the output of the first set of, amplifiers 424. In some embodiments, a single load switch 422 can be used, thus saving size and components.

Referring now to FIG. 33, in one embodiment, the power amplifier system 410 includes a first balun 426 with an input and an output, and a second balun 428 with an input and an output. The first and second baluns 426 and 428 can have the configurations of the balun 116, as well as any of its embodiments described above. The first set of amplifiers 424 is coupled to the first balun 426, and a second set of amplifiers 430, which includes amplifier 414, is coupled to the second balun 428. In this embodiment, 3 or more sets of amplifiers, that are substantially the same as the first and second sets of amplifiers 424 and 430, can be provided. In this embodiment, the power amplifier system 410 has segmentation as described above, with all outputs being combined in parallel by a parallel power combining circuit 431. As FIG. 33 shows, there are four sets of parallel opamp/series voltage regulation device VRAMP to VDD control circuits 432, each coupled to a single VRAMP input with separate connections to the center tap of each separate balun 426, 428, etc., which effects the switchable VDD action desired. The on/off control function for each opamp/series voltage regulation device VRAMP to VDD control circuits 432 can be accomplished by a switch 422 that connects the gate to the source of each series voltage regulation device, thus turning off power to the associated amplifier. A switchable load, consisting of load 420 and switch 422, as described above, is coupled to the outputs of each set of amplifiers 424, 430, etc. For simplicity, the switchable load is shown in a parallel configuration. However, the switchable load can also be implemented in a series configuration, as described above.

Figure 15A:
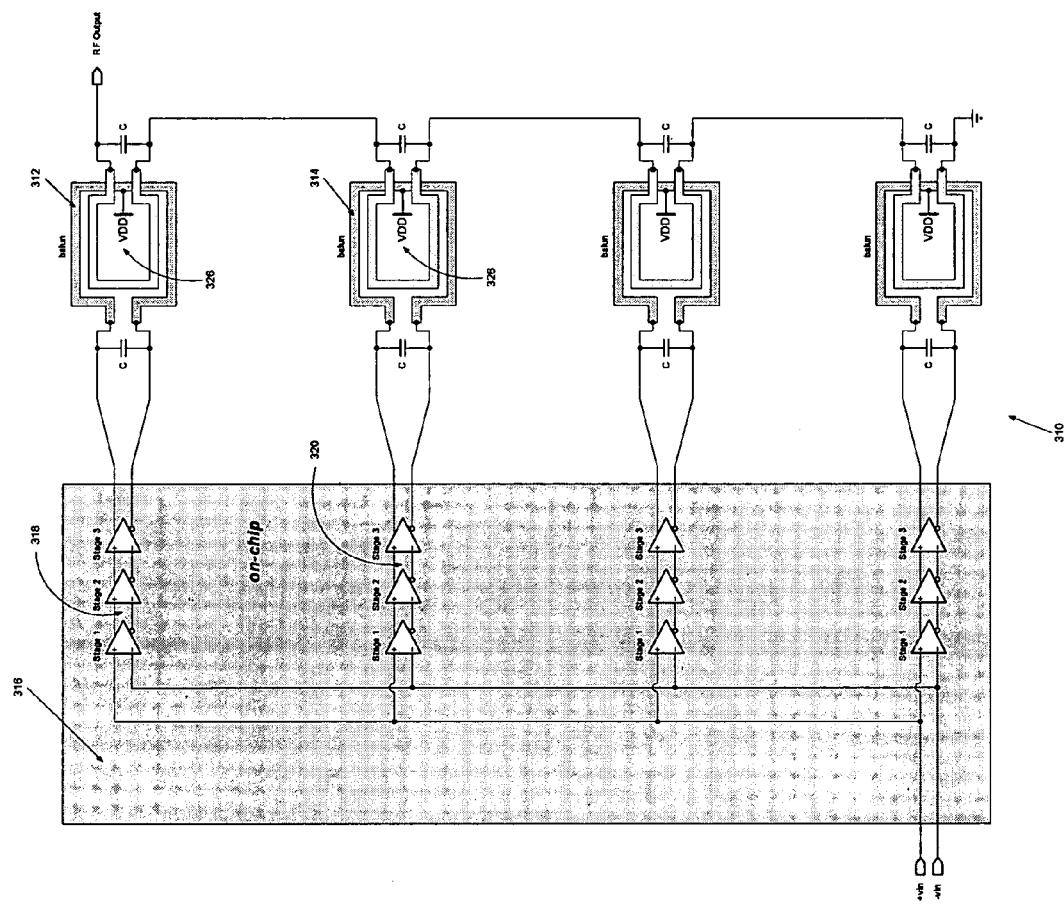
FIG. 15(a) illustrates one embodiment of an amplifier system of the present invention where the outputs of the baluns add constructively and substantially in series.
Figure 15B:
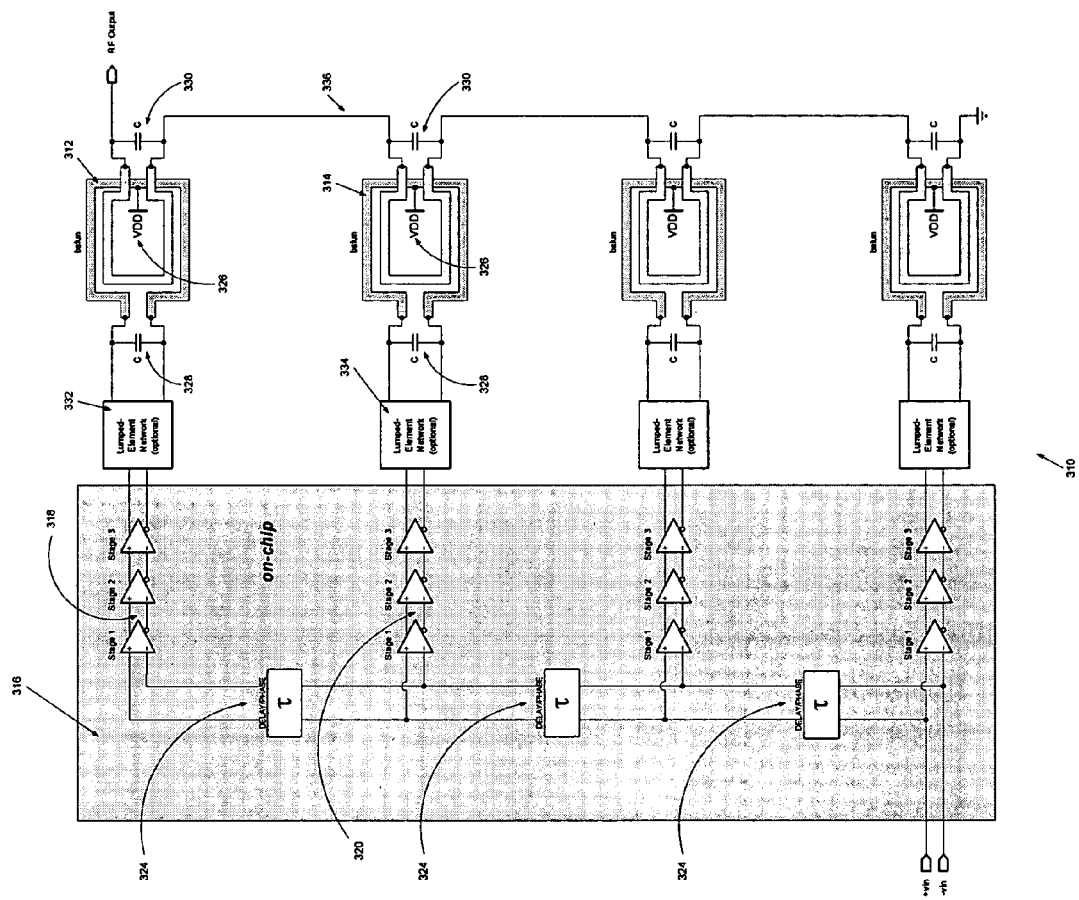
FIG. 15(b) illustrates one embodiment of an amplifier system of the present invention where the outputs of the baluns add constructively and substantially in series, and with delay/phase alignment at the inputs of each set of amplifiers.

The FIG. 33 embodiment can also include a first lumped element circuit 436 that couples the first set of amplifiers output to the input of the first balun 426, and a second lumped element circuit 438 that couples the second set of amplifiers output to the input of the second balun 428, as disclosed above with reference to FIGS. 15(a) and 15(b).

Figure 34:
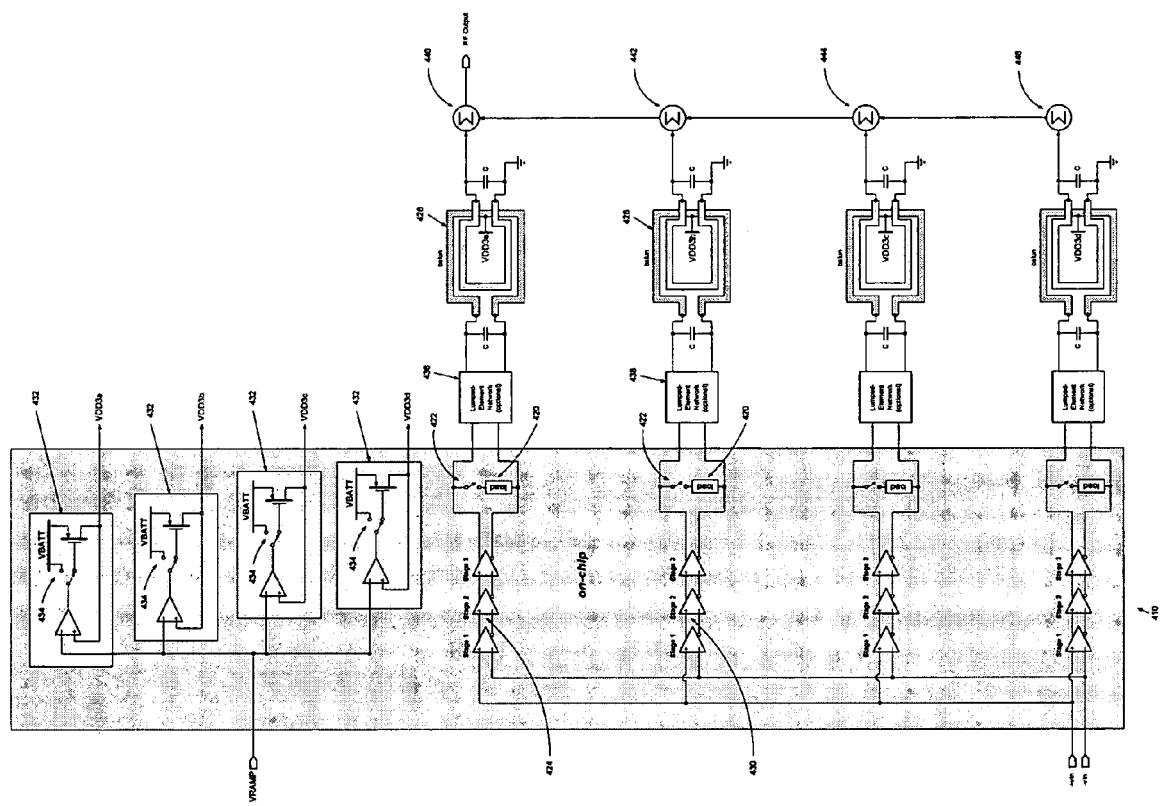
FIG. 34 is similar to the FIG. 33 embodiment except that four summing nodes are provided and the outputs are summed in series.

Referring now to FIG. 34, four summing nodes 440 through 446 are provided. In this embodiment, all outputs from the baluns 426, etc., are summed in series.

Figure 35:
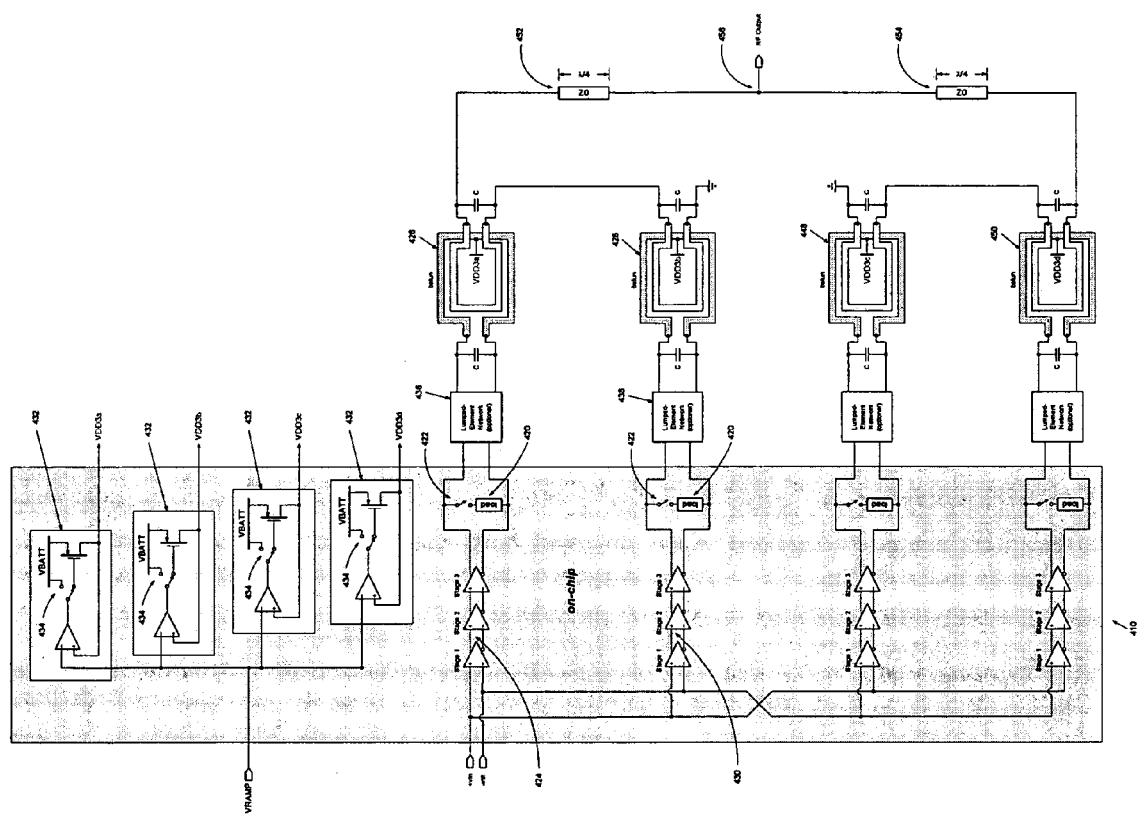
FIG. 35 is similar to the FIGS. 33 and 34 embodiments except that the outputs of the baluns are coupled in series and quarter wavelength transmission lines are provided.

Referring now to FIG. 35, which relates to FIGS. 23(a) and 23(b), the outputs of the baluns 426 and 428 are coupled in series with a first terminal of balun 426 being coupled to a first terminal of a quarter wavelength transmission line 448, a second terminal of balun 426 is coupled to a first terminal of balun 428, and a second terminal of balun 428 is coupled to ground. The outputs of the baluns 452 and 454 are coupled in series with a first terminal of balun 452 being coupled to ground, a second terminal of balun 452 is coupled to a first terminal of balun 454, and a second terminal of balun 428 is coupled to a first terminal of a quarter wavelength transmission line 450. Both second terminals of the quarter wavelength transmission lines 448 and 450 are coupled to a common output node 456. As described above, each quarter wavelength transmission line can be replaced by an equivalent lumped element circuits as described in FIG. 23(b).

Figure 36:
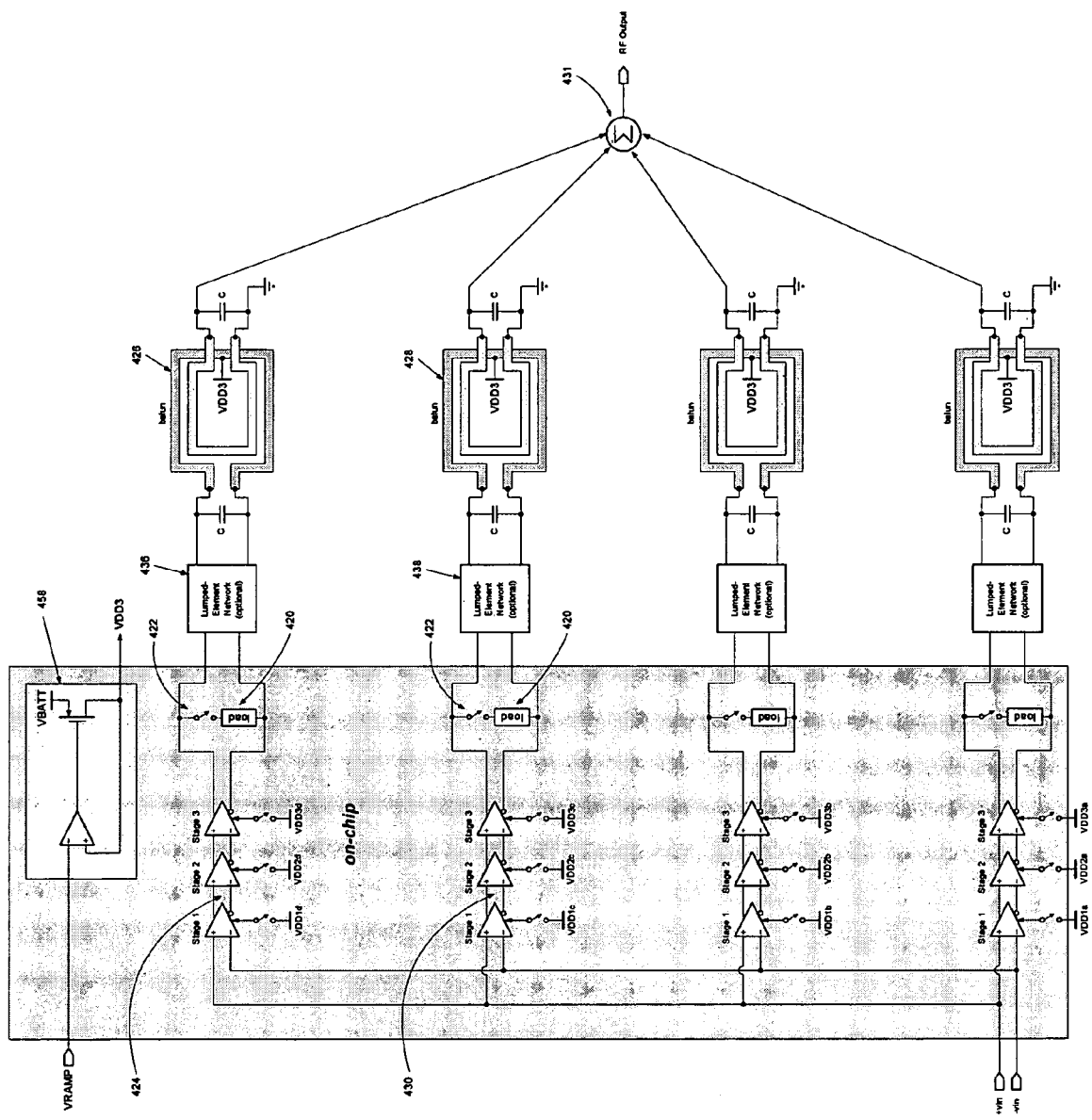
FIG. 36 is similar to the FIG. 33 embodiment except that instead of four separate opamp/series voltage regulation device VRAMP to VDD control circuits, a single opamp/series voltage regulation device VRAMP to VDD control circuit is provided without a switch on the gate of the series voltage regulation device.

FIG. 36 is similar to the FIG. 33 embodiment except that instead of four separate opamp/series voltage regulation device VRAMP to VDD control circuits 432, a single opamp/series voltage regulation device VRAMP to VDD control circuit 458 without a switch on the gate of the series voltage regulation device 357, is provided Power control of the sets of amplifiers 424, etc., is achieved with a series voltage regulation device in series with the ground connections of each amplifier in the set of amplifiers 424, etc., or by disabling the bias for each amplifier in the set of amplifiers 424, etc. The single opamp/series voltage regulation device VRAMP to VDD control circuit 458 controls the VDD of each final amplifier in a set of amplifiers 424, etc., simultaneously, as described in FIGS. 26(a) through 26(e) and FIG. 27.

A single pass device, either on or off chip, can be used to control the VDD to the last amplifier or amplifiers in a set of amplifiers 424, etc. Each amplifier in a set of amplifiers 424, etc., is turned off, such as by shutting down internal bias voltages, instead of using series voltage regulation devices to shut down each series of amplifiers.

AC reference voltage node control can affect selected amplifiers in sets of amplifiers 424, etc.. AC reference voltage node control signals to the amplifiers of the sets of amplifiers 424, etc., can be non-linear, adjustable to provide for maximum efficiency, adjustable to provide that the system 410 meets a desired power spectral density, adjustable to provide that the system meets a desired output power vs. ramp control voltage curve, and the like.

The foregoing description of various embodiments of the present invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A power amplifier, comprising:
   an input conditioning circuit;
   at least first and second amplifiers in parallel with each other and having an input and an output, an input signal coupled to the inputs of the at least the first and second amplifiers; and
   a multi-input power combiner, wherein the outputs of the at least first and second parallel amplifiers are combined by the multi-input power combiner to add signals of the outputs constructively, wherein at least one of the amplifiers is an inverting amplifier that changes the polarity of at least some of the inputs or outputs.

2. The amplifier of claim 1, wherein the input conditioning circuit is configured to receive the input and divide it into several outputs that do not have to be at the same relative phase or amplitude.

3. The amplifier of claim 1, wherein the input conditioning circuit is configured to receive a single ended input and divide it into several signals.

4. The amplifier of claim 1, wherein the input conditioning circuit is configured to receive a single ended RF input and divide it into several signals.

5. The amplifier of claim 1, wherein the input conditioning circuit is configured to receive a singled ended input and split the single ended input into signals that are out of phase with respect to each other in each of a set of output lines.

6. The amplifier of claim 1, wherein the input conditioning circuit includes a power splitter.

7. The amplifier of claim 1, wherein the power splitter is a 0/90 relative degree splitter than configures relative inputs to the amplifiers to be 90 degrees relative out of phase.

8. The amplifier of claim 6, wherein relative phase inputs of 0 and 90 degrees provided to the at least first and second amplifiers are generated outside power amplifier circuitry itself.

9. The amplifier of claim 6, wherein the input to the input conditioning circuit is singled ended and split by the power splitter into signals that are out of phase.

10. The amplifier of claim 6, wherein the input to the input conditioning circuit is differential.

11. The amplifier of claim 6, wherein the input to the input conditioning circuit is a differential RF input.

12. The amplifier of claim 1, wherein the input conditioning circuit is configured to create at least a first set and a second set of outputs, the first set being at relative phase 0 degrees and the second set being at relative phase 90 degrees, and both the first and second sets having the same amplitude.

13. The amplifier of claim 12, wherein the first and second sets of outputs are at the same relative phase and amplitude, and each signal in the first and second sets of outputs is at the same relative phase and amplitude.

14. The amplifier of claim 1, wherein the input conditioning circuit includes circuitry that is configured to receive the input and produce at least first and second sets of outputs, each signal within the first set being at a relative phase of 0 degrees with respect to the second set and the second set of outputs being at a relative phase of 180 degrees with respect to the first set.

15. The amplifier of claim 14, wherein the input conditioning circuit includes a passive circuit coupled to ground.

16. The amplifier of claim 14, wherein the input signal is single ended, and each output is differential.

17. The amplifier of claim 14, wherein the input signal is RF single ended, and each output is differential.

18. The amplifier of claim 1, wherein the amplifier includes sets of amplifiers, at least some of the amplifiers being non-inverting in its signal polarity.

19. A power amplifier, comprising:
an input conditioning circuit;
at least first and second amplifiers in parallel with each other and having an input and an output, an input signal coupled to the inputs of the at least the first and second amplifiers; and
a multi-input power combiner, wherein the outputs of the at least first and second parallel amplifiers are combined by the multi-input power combiner to add signals of the outputs constructively, wherein the amplifier includes multiple set of amplifiers, at least one of an amplifier being inverting in its signal polarity.

20. The amplifier of claim 1, wherein the input conditioning circuit includes circuitry configured to receive the input and produce at least first and second sets of outputs, each signal within the first set being at a relative phase of 0 degrees with respect to the second set and the second set of outputs being at a relative phase of 0 degrees with respect to the first set.

21. The amplifier of claim 1, wherein the input conditioning circuit includes on-chip circuitry that is configured to receive the input and produce at least first and second sets of outputs, each signal within the first set being at a relative phase of 0 degrees with respect to the second set and the second set of outputs being at a relative phase of 90 degrees with respect to the first set.

22. The amplifier of claim 1, wherein the input conditioning circuit includes on-chip circuitry that is configured to receive the input and produce at least first and second sets of outputs, each signal within the first set being at a relative phase of 0 degrees with respect to the second set and the second set of outputs being at a relative phase of 180 degrees with respect to the first set.

23. The amplifier of claim 1, further comprising:
a first set of amplifiers, including the first amplifier, coupled in series; and
a second set of amplifiers, including the second amplifier, coupled in series.

24. The amplifier of claim 23, further comprising:
a third set of amplifiers coupled in series together and in parallel to the first and second sets of amplifiers; and
a fourth set of amplifiers coupled in series together and in parallel to the first, second and third sets of amplifiers.

25. The amplifier of claim 1, wherein the multi-input power combiner is configured to receive inputs with different amplitudes and relative phases and add them constructively together.

26. The amplifier of claim 1, wherein the multi-input power combiner is a coupler configured to receive relative phase signals of 0 and 90 degrees and combine them constructively.

27. The amplifier of claim 1, wherein the multi-input power combiner is a coupler configured to receive relative phase signals of 0 and 180 degrees and combine them constructively.

28. The amplifier of claim 1, wherein the multi-input power combiner is configured to combine all inputs together in phase.

29. The amplifier of claim 1, wherein the multi-input power combiner is configured to combine all inputs together out of phase.

30. The amplifier of claim 1, wherein the multi-input power combiner is configured to combine all inputs together to receive relative phase signals of 0 and 90 degrees and combine them constructively.

31. The amplifier of claim 1, wherein the multi-input power combiner is configured to combine all inputs together with at least some of the inputs having different phases that are combined constructively to form an output.

32. The amplifier of claim 25, wherein the multi-input power combiner includes an isolation port that provides for termination of reflected signals from a load coupled to the output.

33. The amplifier of claim 1, wherein the multi-input power combiner is configured to terminate reflections from a load coupled to the output into a terminated isolation port and to provide for a more constant output power under mismatched conditions.

34. The amplifier of claim 33, further comprising:
a monitor coupled to the isolation port to monitor voltage or current.

35. The amplifier of claim 24, wherein the multi-input power combiner includes:

a first in-phase power combiner coupled to the first and second set of parallel amplifiers;

a second in-phase power combiner coupled to the third and fourth set of parallel amplifiers; and a power combiner coupled to the first and second in-phase power combiners.

36. The amplifier of claim 35, wherein the power combiner is configured to receive relative 0 and 90 degree inputs and combine the inputs constructively.

37. The amplifier of claim 35, wherein the power combiner is configured to receive relative 0 and 180 degree inputs and combine the inputs constructively.

38. The amplifier of claim 35, wherein the power combiner is configured to receive relative 0 and 0 degree inputs and combine the inputs constructively.

39. The amplifier of claim 35, wherein the multi-input power combiner includes an isolation port that provides for termination of reflected signals from the load.

40. The amplifier of claim 39, wherein the power combiner is configured to provide sufficient isolation to maintain a good load across an output under miss-match conditions.

41. The amplifier of claim 39, further comprising:
a monitor coupled to the isolation port to monitor voltage or current.

42. The amplifier of claim 41, wherein the monitor determines an amount of reflected power from the load.

43. The amplifier of claim 41, wherein the monitor is used to adjust circuitry within a power amplifier circuit to minimize energy terminated at the isolation port, the power amplifier circuit being located at one of, the input conditioning circuit, the at least first and second amplifiers in parallel or the output power combiner.

44. The amplifier of claim 39, further comprising:
an off-chip resistor that terminates the isolation port.

45. The amplifier of claim 35 wherein the first in-phase power combiner produces a first output of signals at a relative phase of 0 degrees with respect to a second output of signals produced by the second in-phase power combiner that are at a relative phase of 90 degrees with respect to the first output of signals.

* * * * *

UNITED STATES PATENT AND TRADEMARK OFFICE
CERTIFICATE OF CORRECTION

PATENT NO. : 7,248,109 B2
APPLICATION NO. : 11/060052
DATED : July 24, 2007
INVENTOR(S) : Lawrence Burns It is certified that error appears in the above-identified patent and that said Letters Patent is hereby corrected as shown below:

Title Page, Item (73) should read:

(73) Assignee: Amalfi Semiconductor, Inc. Los Gatos, CA (US)

Signed and Sealed this

Sixteenth Day of December, 2008

JON W. DUDAS
*Director of the United States Patent and Trademark Office*